(12) United States Patent
Ikeda

(10) Patent No.: US 10,256,265 B2
(45) Date of Patent: Apr. 9, 2019

(54) IMAGING DEVICE, MODULE, AND ELECTRONIC DEVICE

(71) Applicant: Semiconductor Energy Laboratory Co., Ltd., Atsugi-shi, Kanagawa-ken (JP)

(72) Inventor: Takayuki Ikeda, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 16/021,146

(22) Filed: Jun. 28, 2018

(65) Prior Publication Data

US 2018/0308886 A1    Oct. 25, 2018

Related U.S. Application Data

(63) Continuation of application No. 15/447,801, filed on Mar. 2, 2017, now Pat. No. 10,014,334.

(30) Foreign Application Priority Data

Mar. 8, 2016    (JP) ................................ 2016-044271

(51) Int. Cl.
  *H01L 27/12*    (2006.01)
  *H01L 27/30*    (2006.01)
  (Continued)

(52) U.S. Cl.
  CPC .... *H01L 27/14616* (2013.01); *H01L 27/1214* (2013.01); *H01L 27/146* (2013.01);
  (Continued)

(58) Field of Classification Search
  CPC ........... H01L 27/14643; H01L 27/1463; H01L 27/14612; H01L 27/14609; H01L 27/146;
  (Continued)

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Ngan V Ngo
(74) *Attorney, Agent, or Firm* — Fish & Richardson P.C.

(57) ABSTRACT

An object is to provide an imaging device with high efficiency of transferring charge corresponding to imaging data. The imaging device includes first to fifth conductors, first and second insulators, an oxide semiconductor, a photoelectric conversion element, and a transistor. The first conductor is in contact with a bottom surface and a side surface of the first insulator. The first insulator is in contact with a bottom surface of the oxide semiconductor. The oxide semiconductor is in contact with bottom surfaces of the second and third conductors and the second insulator. Each of the second and third conductors is in contact with the bottom surface and a side surface of the second insulator. The second insulator is in contact with bottom surfaces of the fourth and fifth conductors. The first conductor has regions overlapped by the fourth and fifth conductors. The second conductor has a region overlapped by the fourth conductor. The third conductor has a region overlapped by the fifth conductor. The second conductor is electrically connected to one electrode (Continued)

of the photoelectric conversion element. The third conductor is electrically connected to a gate of the transistor.

15 Claims, 40 Drawing Sheets

(51) Int. Cl.
- H04N 5/235 (2006.01)
- H04N 5/353 (2011.01)
- H04N 5/378 (2011.01)
- H01L 27/146 (2006.01)
- H01L 29/786 (2006.01)

(52) U.S. Cl.
CPC .... *H01L 27/1463* (2013.01); *H01L 27/14609* (2013.01); *H01L 27/14612* (2013.01); *H01L 27/14614* (2013.01); *H01L 27/14627* (2013.01); *H01L 27/14634* (2013.01); *H01L 27/14636* (2013.01); *H01L 27/14643* (2013.01); *H01L 27/307* (2013.01); *H01L 29/7869* (2013.01); *H01L 27/14638* (2013.01); *H01L 2224/48091* (2013.01); *H04N 5/2353* (2013.01); *H04N 5/353* (2013.01); *H04N 5/378* (2013.01)

(58) Field of Classification Search
CPC ......... H01L 27/307; H01L 2924/12043; H01L 27/14638; H01L 27/1214
See application file for complete search history.

(56) References Cited

U.S. PATENT DOCUMENTS

| | | | |
|---|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,389,989 B2 | 3/2013 | Yamazaki et al. |
| 8,518,739 B2 | 8/2013 | Miyairi et al. |
| 8,654,231 B2 | 2/2014 | Kurokawa et al. |
| 8,836,626 B2 | 9/2014 | Ikeda |
| 8,964,085 B2 | 2/2015 | Kurokawa et al. |
| 9,111,824 B2 | 8/2015 | Ikeda |
| 9,153,619 B2 | 10/2015 | Kurokawa et al. |
| 9,257,567 B2 | 2/2016 | Kurokawa et al. |
| 9,515,107 B2 | 12/2016 | Kurokawa et al. |
| 9,571,772 B2 | 2/2017 | Hagiwara et al. |
| 9,575,381 B2 | 2/2017 | Kurokawa et al. |
| 9,576,994 B2 | 2/2017 | Inoue et al. |
| 9,659,983 B2 | 5/2017 | Ikeda |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0069258 A1* | 3/2007 | Ahn ................. H01L 27/14634 257/290 |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0032852 A1* | 2/2009 | Song ................. H01L 27/14609 257/292 |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0221723 A1 | 9/2011 | Kurokawa et al. |
| 2012/0327281 A1 | 12/2012 | Mabuchi |
| 2013/0200479 A1 | 8/2013 | Sakano et al. |
| 2015/0028189 A1 | 1/2015 | Hagiwara et al. |
| 2015/0054110 A1* | 2/2015 | Kashihara ......... H01L 27/14636 257/435 |
| 2015/0340401 A1* | 11/2015 | Yoshii ............... H01L 27/14612 257/43 |

(56) References Cited

U.S. PATENT DOCUMENTS

| | | | |
|---|---|---|---|
| 2016/0104734 A1* | 4/2016 | Hirose | H01L 27/1225 257/43 |
| 2016/0255287 A1 | 9/2016 | Mabuchi | |
| 2016/0260756 A1* | 9/2016 | Yamagishi | H04N 5/379 |
| 2016/0293654 A1* | 10/2016 | Tomekawa | H01L 27/14643 |
| 2017/0294542 A1 | 10/2017 | Yamazaki et al. | |
| 2018/0233525 A1* | 8/2018 | Ikeda | H01L 27/14692 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2013-005397 A | 1/2013 |
| JP | 2015-023250 A | 2/2015 |
| WO | WO-2004/114391 | 12/2004 |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

(56) References Cited

OTHER PUBLICATIONS

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds $InMO_3(ZnO)_m$ (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", Nirim Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline $InGaO_3(ZnO)_5$ films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide $InGaO_3(ZnO)_m$ (m<4):a Zn4s conductor", Philosophical Magazine, 2001, vol. 81, No. 5, pp. 501-515.
Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.S et al., "Challenge to Future Displays: Transparent AM-OLED Driven by PEALD Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.
Ueno.K et al., "Field-Effect Transistor on $SrTiO_3$ With Sputtered $Al_2O_3$ Gate Insulator", Appl. Phys. Lett. (Applied Physics Letters) , Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

340

340a 340b
340

370 330 340c 320
360

350 356 340b 357 351

370a 370b
370

350    351
$W_{SD}$   $W_{OS}$
340

350    351
$W_{SD}$   $W_{OS}$
340

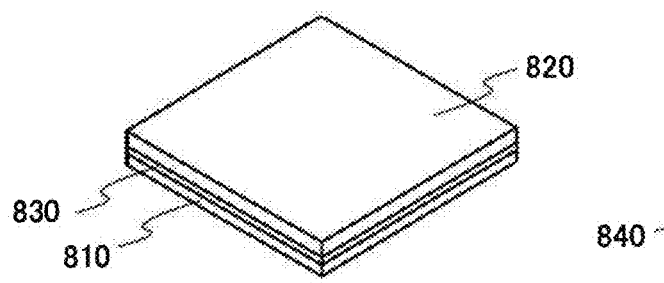
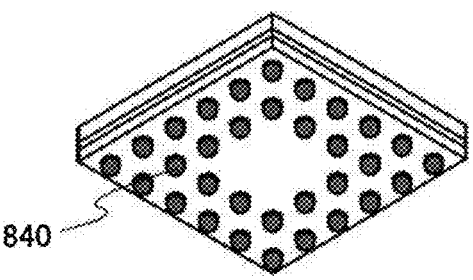
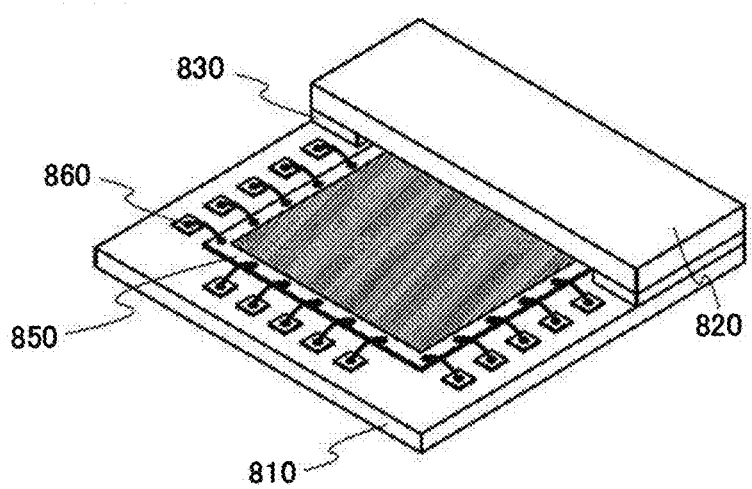
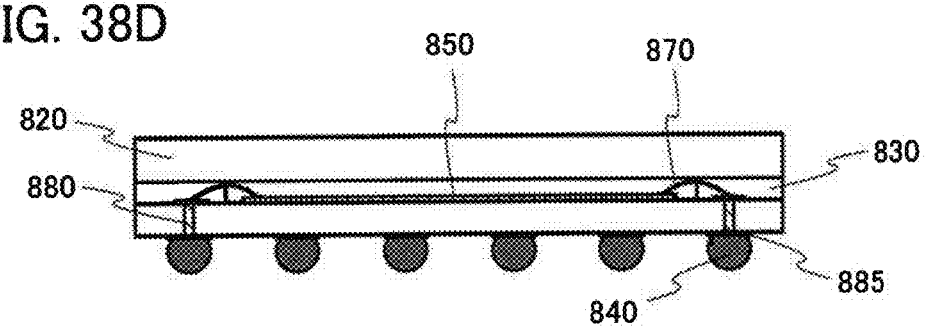

IMAGING DEVICE, MODULE, AND ELECTRONIC DEVICE

CROSS-REFERENCE TO RELATED APPLICATIONS

This application is a continuation of U.S. application Ser. No. 15/447,801, filed Mar. 2, 2017, now allowed, which claims the benefit of a foreign priority application filed in Japan as Serial No. 2016-044271 on Mar. 8, 2016, both of which are incorporated by reference.

BACKGROUND OF THE INVENTION

1. Field of the Invention

One embodiment of the present invention relates to an imaging device.

Note that one embodiment of the present invention is not limited to the above technical field. The technical field of one embodiment of the invention disclosed in this specification and the like relates to an object, a method, or a manufacturing method. Furthermore, one embodiment of the present invention relates to a process, a machine, manufacture, or a composition of matter. Specific examples of the technical field of one embodiment of the present invention disclosed in this specification include a semiconductor device, a display device, a liquid crystal display device, a light-emitting device, a lighting device, a power storage device, a memory device, an imaging device, a method for operating any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a memory device, a display device, an imaging device, or an electronic device includes a semiconductor device.

2. Description of the Related Art

An imaging device capable of capturing images with a global shutter method has attracted attention. The global shutter method enables an image of a fast-moving object to be obtained without distortion (see Patent Documents 1 and 2).

Patent Document

Patent Document 1: Japanese Published Patent Application No. 2015-023250
Patent Document 2: Japanese Published Patent Application No. 2013-005397

SUMMARY OF THE INVENTION

With the global shutter method, imaging data are obtained in all the pixels at the same time and sequentially read out; thus, the data need to be retained for a long time. As a method for retaining the data, a method of providing a data retention portion, for example, by forming an embedded channel region by impurity addition has been suggested. Accordingly, a circuit configuration and an operating method of an imaging device operating with the global shutter method are more complicated than those of an imaging device operating with a rolling shutter method.

When the data retention portion is provided, a transfer gate needs to be provided in the data retention portion for accurate readout of imaging data. To increase the efficiency of transferring charge corresponding to imaging data, the transfer gate preferably overlaps a gate electrode of a transfer transistor or the like; however, this structure makes the process complicated, compared to a structure where the transfer gate does not overlap such a gate electrode.

In view of the above, an object of one embodiment of the present invention is to provide an imaging device with high efficiency of transferring charge corresponding to imaging data. Another object is to provide an imaging device with high light sensitivity. Another object is to provide an imaging device with a simple circuit configuration. Another object is to provide an imaging device that operates through a simple procedure. Another object is to provide an imaging device capable of being manufactured in a simple process. Another object is to provide an imaging device capable of capturing an image of a moving object without distortion. Another object is to provide an imaging device capable of retaining data for a long time. Another object is to provide an imaging device with high resolution. Another object is to provide a small-sized imaging device. Another object is to provide an imaging device suitable for high-speed operation. Another object is to provide an imaging device with high reliability. Another object is to provide an imaging device capable of being manufactured at low cost. Another object is to provide a novel imaging device or the like.

Note that the description of these objects does not preclude the existence of other objects. One embodiment of the present invention does not necessarily achieve all the objects listed above. Objects other than those listed above will be apparent from and can be derived from the description of the specification, the drawings, the claims, and the like.

One embodiment of the present invention is an imaging device including a first conductor, a second conductor, a third conductor, a fourth conductor, a fifth conductor, a first insulator, a second insulator, a first oxide semiconductor, a first photoelectric conversion element, and a transistor. The first conductor is in contact with a bottom surface and a side surface of the first insulator. The first insulator is in contact with a bottom surface of the first oxide semiconductor. The first oxide semiconductor is in contact with a bottom surface of the second conductor. The first oxide semiconductor is in contact with a bottom surface of the third conductor. The first oxide semiconductor is in contact with a bottom surface of the second insulator. The second conductor is in contact with the bottom surface and a side surface of the second insulator. The third conductor is in contact with the bottom surface and a side surface of the second insulator. The second insulator is in contact with a bottom surface of the fourth conductor. The second insulator is in contact with a bottom surface of the fifth conductor. The first conductor has a region overlapped with the fourth conductor. The first conductor has a region overlapped with the fifth conductor. The second conductor has a region overlapped with the fourth conductor. The third conductor has a region overlapped with the fifth conductor. The second conductor is electrically connected to one electrode of the first photoelectric conversion element. The third conductor is electrically connected to a gate of the transistor.

The imaging device may include a sixth conductor and a seventh conductor. The sixth conductor may be in contact with the bottom surface and a side surface of the first insulator. The seventh conductor may be in contact with the bottom surface and a side surface of the first insulator. The sixth conductor may have a region overlapped with the fourth conductor. The seventh conductor may have a region overlapped with the fifth conductor.

The first oxide semiconductor may contain In, Zn, and M (M is at least one of Al, Ga, Y, and Sn).

The imaging device may include an eighth conductor, a ninth conductor, a tenth conductor, an eleventh conductor, a twelfth conductor, a third insulator, a fourth insulator, a second oxide semiconductor, and a second photoelectric conversion element. The eighth conductor may be in contact with a bottom surface and a side surface of the third insulator. The third insulator may be in contact with a bottom surface of the second oxide semiconductor. The second oxide semiconductor may be in contact with a bottom surface of the ninth conductor. The second oxide semiconductor may be in contact with a bottom surface of the tenth conductor. The second oxide semiconductor may be in contact with a bottom surface of the fourth insulator. The ninth conductor may be in contact with the bottom surface and a side surface of the fourth insulator. The tenth conductor may be in contact with the bottom surface and a side surface of the fourth insulator. The fourth insulator may be in contact with a bottom surface of the eleventh conductor. The fourth insulator may be in contact with a bottom surface of the twelfth conductor. The eighth conductor may have a region overlapped with the eleventh conductor. The eighth conductor may have a region overlapped with the twelfth conductor. The ninth conductor may have a region overlapped with the eleventh conductor. The tenth conductor may have a region overlapped with the twelfth conductor. The ninth conductor may be electrically connected to one electrode of the second photoelectric conversion element. The tenth conductor may be electrically connected to the gate of the transistor.

The imaging device may include a thirteenth conductor and a fourteenth conductor. The thirteenth conductor may be in contact with the bottom surface and a side surface of the third insulator. The fourteenth conductor may be in contact with the bottom surface and a side surface of the third insulator. The thirteenth conductor may have a region overlapped with the eleventh conductor. The fourteenth conductor may have a region overlapped with the twelfth conductor.

The second oxide semiconductor may contain In, Zn, and M (M is at least one of Al, Ga, Y, and Sn).

Another embodiment of the present invention is a module including the imaging device of one embodiment of the present invention and a lens.

Another embodiment of the present invention is an electronic device including the imaging device of one embodiment of the present invention and a display device.

One embodiment of the present invention can provide an imaging device with high efficiency of transferring charge corresponding to imaging data, an imaging device with high light sensitivity, an imaging device with a simple circuit configuration, an imaging device that operates through a simple procedure, an imaging device capable of being manufactured in a simple process, an imaging device capable of capturing an image of a moving object without distortion, an imaging device capable of retaining data for a long time, an imaging device with high resolution, a small-sized imaging device, an imaging device suitable for high-speed operation, an imaging device with high reliability, an imaging device capable of being manufactured at low cost, a novel imaging device, or the like.

Note that the effects of one embodiment of the present invention are not limited to those listed above. For example, depending on circumstances or conditions, one embodiment of the present invention may produce another effect or may not produce any of the above effects.

BRIEF DESCRIPTION OF THE DRAWINGS

In the accompanying drawings:

FIGS. 38A to 38D are perspective views and a cross-sectional view of a package in which an imaging device is placed;

DETAILED DESCRIPTION OF THE INVENTION

Figure 1:
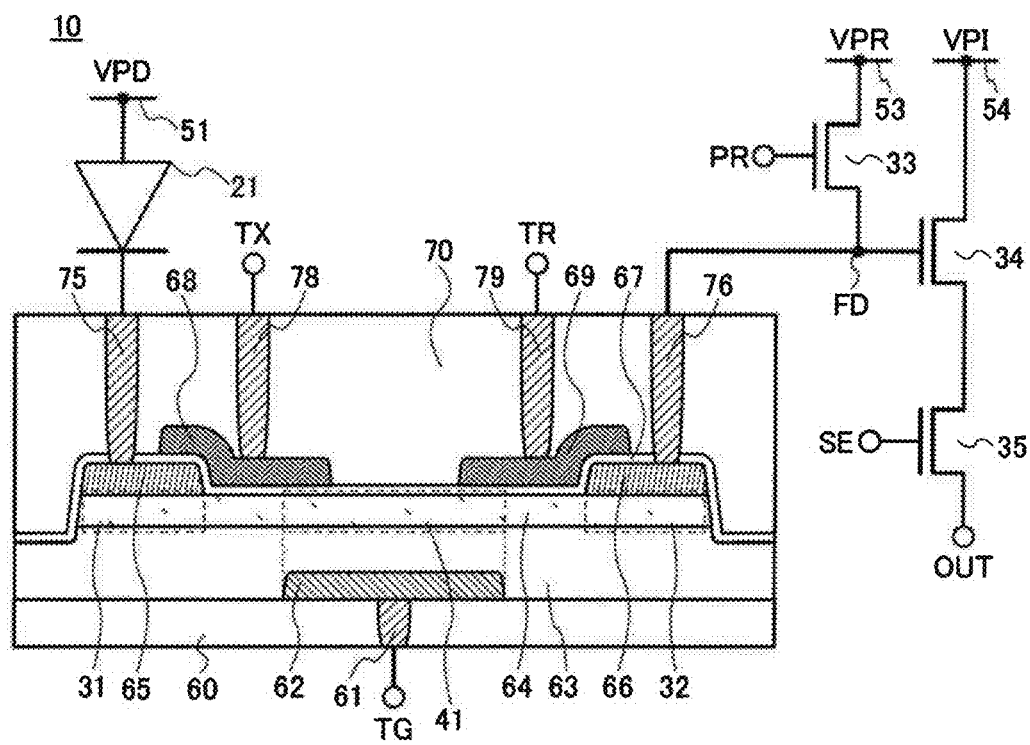
FIG. 1 shows a cross-sectional view and a circuit diagram for illustrating a pixel.

Embodiments will be described in detail with reference to the drawings. Note that the present invention is not limited to the following description, and it will be readily appreciated by those skilled in the art that modes and details can be modified in various ways without departing from the spirit and scope of the present invention. Therefore, the present invention should not be interpreted as being limited to the description of embodiments below. Note that in structures of the present invention described below, the same portions or portions having similar functions are denoted by the same reference numerals in different drawings, and description thereof is not repeated in some cases. It is also to be noted that the same components are denoted by different hatching patterns in different drawings or the hatching patterns are omitted in some cases.

Note that the ordinal numbers such as "first" and "second" are used for convenience and do not denote the order of steps or the stacking order of layers. Therefore, for example, the term "first" can be replaced with the term "second," "third," or the like as appropriate. In addition, ordinal numbers in this specification and the like sometimes do not correspond to ordinal numbers that specify one embodiment of the present invention.

For example, in this specification and the like, an explicit description "X and Y are connected" means that X and Y are electrically connected, X and Y are functionally connected, and X and Y are directly connected. Accordingly, without being limited to a predetermined connection relation (e.g., a connection relation shown in drawings or texts), another connection relation is regarded as being included in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows electrical connection between X and Y (e.g., a switch, a transistor, a capacitor, an inductor, a resistor, a diode, a display element, a light-emitting element, or a load) is not connected between X and Y, and the case where X and Y are connected without an element that allows electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that a switch is controlled to be turned on or off. That is, a switch is conducting or not conducting (is turned on or off) to determine whether current flows therethrough or not. Alternatively, a switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit capable of increasing signal amplitude, the amount of current, or the like, an operational amplifier, a differential amplifier circuit, a source follower circuit, or a buffer circuit; a signal generator circuit; a memory circuit; and/or a control circuit) can be connected between X and Y. For instance, even if another circuit is provided between X and Y, X and Y are regarded as being functionally connected when a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., X and Y are connected with another element or circuit provided therebetween), X and Y are functionally connected (i.e., X and Y are functionally connected with another element or circuit provided therebetween), and X and Y are directly connected (i.e., X and Y are connected without another element or circuit provided therebetween). That is, in this specification and the like, the term "electrically connected" is substantially the same as the term "connected."

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include "X, Y, and a source (or a first terminal or the like) and a drain (or a second terminal or the like) of a transistor are electrically connected to each other, and X, the source (or the first terminal or the like) of the transistor, the drain (or the second terminal or the like) of the transistor, and Y are electrically connected in this order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected in this order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order." When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path," and "a source (or a first terminal or the like) of a transistor is electrically connected to X through Z1 at least with a first connection path, the first connection path does not include a second connection path, the second connection path includes a connection path through the transistor, a drain (or a second terminal or the like) of the transistor is electrically connected to Y through Z2 at least with a third connection path, and the third connection path does not include the second connection path." Still another example of the expression is "a source (or a first terminal or the like) of a transistor is electrically connected to X through Z1 on at least a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through Z2 on at least a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit configuration is defined by an expression similar to the above examples, a source (or a first terminal or the like) and a drain (or a second terminal or the like) of a transistor can be distinguished from each other to specify the technical scope.

Note that the above expressions are examples, and there is no limitation on the expressions. Here, X, Y, Z1, and Z2 each denote an object (e.g., a device, an element, a circuit, a wiring, an electrode, a terminal, a conductive film, or a layer).

Note that functions of a "source" and a "drain" of a transistor are sometimes replaced with each other when a transistor of opposite polarity is used or when the direction of current flow is changed in circuit operation, for example. Therefore, the terms "source" and "drain" can be used to denote the drain and the source, respectively, in this specification. In addition, the term "electrode" can be replaced with the term "wiring."

Even when a circuit diagram shows that independent components are electrically connected to each other, one component has functions of a plurality of components in some cases. For example, when part of a wiring functions as an electrode, one conductive film functions as the wiring and the electrode. Thus, "electrical connection" in this specification also means such a case where one conductive film has functions of a plurality of components.

Note that the terms "film" and "layer" can be interchanged with each other depending on the case or circumstances. For example, in some cases, the term "conductive film" can be used instead of "conductive layer," and the term "insulating layer" can be used instead of "insulating film."

Note that in general, a potential (voltage) is a relative value and its level depends on the difference from a reference potential. Therefore, a ground potential, GND, or the like is not necessarily 0 V. For example, a ground potential or GND may be defined using the lowest potential or a substantially intermediate potential in a circuit as a reference. In those cases, a positive potential and a negative potential are set using the potential as a reference.

Embodiment 1

In this embodiment, an imaging device that is one embodiment of the present invention will be described with reference to drawings.

FIG. 1 illustrates a cross-sectional view and a circuit diagram that show a structure example of a pixel 10 included in an imaging device of one embodiment of the present invention. Although FIG. 1 and the like show an example using n-channel transistors, one embodiment of the present invention is not limited to this, and some transistors may be replaced with p-channel transistors.

The pixel 10 includes a conductor 62 in contact with an insulator 60; an insulator 63 in contact with the conductor 62; a semiconductor 64 in contact with the insulator 63; a conductor 65 and a conductor 66 in contact with the semiconductor 64; an insulator 67 in contact with the insulator 63, the semiconductor 64, and the conductors 65 and 66; a conductor 68 and a conductor 69 in contact with the insulator 67; and an insulator 70 in contact with the insulator 67 and the conductors 68 and 69.

As the insulators 60, 63, and 70, an inorganic insulator such as silicon oxide or silicon oxynitride can be used, for example. Alternatively, an organic insulator such as an acrylic resin or a polyimide resin may be used. Further alternatively, a stack of any of the above materials may be used.

Note that top surfaces of the insulators 60, 63, and 70 may be subjected to planarization treatment by a chemical mechanical polishing (CMP) method or the like, as necessary. Furthermore, the insulator 67 is not always in contact with the insulator 63. For example, end portions of the insulator 67 may be aligned with end portions of the conductors 68 and 69.

The insulator 67 can be an insulator containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulator 67 may be a stack of any of the above materials.

As the conductors 62, 68, and 69, a conductor such as Al, Ti, Cr, Co, Ni, Cu, Y, Zr, Mo, Ru, Ag, Mn, Nd, Sc, Ta, or W can be used, for example. It is also possible to use an alloy or a conductive nitride of any of the above materials, or a stack including a plurality of materials selected from the above materials, alloys of these materials, and conductive nitrides of these materials.

As the conductors 65 and 66, a single layer or a stacked layer formed using a material selected from Al, Cr, Cu, Ta, Ti, Mo, W, Ni, Mn, Nd, and Sc and alloys or conductive nitrides of any of these metal materials can be used, for example. Using tantalum nitride, which is a conductive nitride, can prevent oxidation of the conductors 65 and 66. It is also possible to use a stack of any of the above materials and Cu or an alloy such as Cu—Mn, which has low resistance.

Although the conductor 68 has a region overlapping the conductor 65 in FIG. 1, the conductor 68 does not necessarily have such a region. Although the conductor 69 has a region overlapping the conductor 66 in FIG. 1, the conductor 69 does not necessarily have such a region. Moreover, although the conductor 62 has regions overlapped with the conductor 68 and the conductor 69 in FIG. 1, the conductor 62 may have neither the region overlapped with the conductor 68 nor the region overlapped with the conductor 69 or may have only one of these regions.

In the insulators 70 and 67, an opening reaching the conductor 65 and an opening reaching the conductor 66 are provided. A conductor 75 is formed in the opening reaching the conductor 65. A conductor 76 is formed in the opening reaching the conductor 66.

In the insulator 70, an opening reaching the conductor 68 and an opening reaching the conductor 69 are provided. A conductor 78 is formed in the opening reaching the conductor 68. A conductor 79 is formed in the opening reaching the conductor 69.

An opening reaching the conductor 62 is provided in the insulator 60. A conductor 61 is formed in the opening.

As the conductors 61, 75, 76, 78, and 79, tungsten and molybdenum can be used, for example.

In the semiconductor 64, a region overlapped with the conductor 65 is denoted as a region 31, a region overlapped with the conductor 62 as a region 41, and a region overlapped with the conductor 66 as a region 32.

The pixel 10 includes a photoelectric conversion element 21, a transistor 33, a transistor 34, and a transistor 35.

In the pixel 10, one electrode of the photoelectric conversion element 21 is electrically connected to the conductor 65 through the conductor 75. One of a source and a drain of the transistor 33 is electrically connected to the conductor 66 through the conductor 76. The one of the source and the drain of the transistor 33 is electrically connected to a gate of the transistor 34. One of a source and a drain of the transistor 34 is electrically connected to one of a source and a drain of the transistor 35.

Note that the one electrode of the photoelectric conversion element 21 and the conductor 65 may be electrically connected without through the conductor 75. The one of the source and the drain of the transistor 33 and the conductor 66 may be electrically connected without through the conductor 76.

Here, a node FD where the conductor 66, the transistor 33, and the transistor 34 are electrically connected to each other is a charge detection portion.

In FIG. 1, the other electrode of the photoelectric conversion element 21 is electrically connected to a wiring 51. The other of the source and the drain of the transistor 33 is electrically connected to a wiring 53. The other of the source and the drain of the transistor 34 is electrically connected to a wiring 54.

The wirings 51, 53, and 54 function as power supply lines. A potential VPD, a potential VPR, and a potential VPI can be applied to the wiring 51, the wiring 53, and the wiring 54, respectively. For example, the potential VPD can be a low potential, and the potential VPR and the potential VPI can be a high potential.

In this specification, a low potential can be a ground potential, for example.

The conductor 62 can be supplied with a signal TG through the conductor 61. The conductor 68 can be supplied with a signal TX through the conductor 78. The conductor 69 can be supplied with a signal TR through the conductor 79. A gate of the transistor 33 can be supplied with a signal PR. A gate of the transistor 35 can be supplied with a signal SE. A signal corresponding to a potential that corresponds to imaging data written to the pixel 10, that is, a signal corresponding to the potential of the node FD can be output from the other of the source and the drain of the transistor 35.

Note that the signal TG can be supplied directly to the conductor 62 without through the conductor 61. The signal TX can be supplied directly to the conductor 68 without through the conductor 78. The signal TR can be supplied directly to the conductor 69 without through the conductor 79.

The transistor 33 has a function of resetting the potential of the node FD. The transistor 34 has a function of outputting a signal corresponding to the potential of the node FD. The transistor 35 has a function of selecting the pixel 10.

When the photoelectric conversion element 21 is irradiated with light, charge corresponding to the illuminance of the light is accumulated into the region 41 through the region 31 and held in the region 41. The charge held in the region 41 is transferred to the region 32. Then, imaging data corresponding to the charge is read out as a signal OUT.

Here, when the semiconductor 64 is an oxide semiconductor, for example, a period for holding charge in the region 41 can be extremely long. Consequently, an imaging device can employ a global shutter method, in which imaging data is concurrently obtained in all the pixels, without complicating its circuit configuration, operating method, and the like. Note that the imaging device of one embodiment of the present invention can also operate by a rolling shutter method.

When an oxide semiconductor is used as the semiconductor 64, the semiconductor 64 preferably contains at least In or Zn or both In and Zn. Moreover, the oxide semiconductor 64 preferably contains a stabilizer such as Al, Ga, Y, or Sn in addition to In and/or Zn.

When an oxide semiconductor is used as the semiconductor 64, an oxygen vacancy is generated in the semiconductor 64 by the contact between the semiconductor 64 and the conductors 65 and 66. Then, an interaction between the oxygen vacancy and hydrogen that remains in the semiconductor 64 or diffuses from the outside makes the regions 31 and 32 n-type low-resistance regions. When the insulator 63 contains oxygen more than that in the stoichiometric composition, oxygen can be supplied to the semiconductor 64 from the insulator 63. That is, the oxygen vacancy in the semiconductor 64 can be compensated by oxygen contained in the insulator 63. This can prevent the regions 31 and 32 from becoming low-resistance regions, resulting in higher reliability of the imaging device in one embodiment of the present invention.

The transistor 33 is preferably a transistor containing an oxide semiconductor in its channel formation region (hereinafter this transistor is referred to as OS transistor). With low leakage current, an OS transistor can prevent charge from leaking from the node FD. Thus, the light sensitivity of the imaging device in one embodiment of the present invention can be increased.

An OS transistor may be used as the transistors 34 and 35. If each of the transistors 34 and 35 is a transistor containing silicon in its active layer or active region (hereinafter this transistor is referred to as Si transistor), for example, the transistors 34 and 35 need to be provided in a layer different from a layer where the semiconductor 64 and the like are placed, which will be described later in detail. For example, the transistors 34 and 35 need to be provided below the insulator 60 or above the insulator 70. In contrast, when the semiconductor 64 is an oxide semiconductor and all the transistors 33 to 35 are OS transistors, all the elements included in the pixel 10, other than the photoelectric conversion element 21, can be formed in one layer. As a result, the manufacturing process of the imaging device in one embodiment of the present invention can be simplified.

Note that the semiconductor 64 is not necessarily an oxide semiconductor. For example, the semiconductor 64 may contain at least one of silicon, germanium, silicon germanium, silicon carbide, gallium arsenide, aluminum gallium arsenide, indium phosphide, gallium nitride, and an organic semiconductor. Furthermore, the transistors 33 to 35 are not always OS transistors. Like the semiconductor 64, channel formation regions and the like of the transistors 33 to 35 may contain at least one of silicon, germanium, silicon germanium, silicon carbide, gallium arsenide, aluminum gallium arsenide, indium phosphide, gallium nitride, and an organic semiconductor, for example.

In the operation of the pixel 10, the conductor 68 has a function of controlling transfer of charge from the region 31 to the region 41 in accordance with the potential of the signal TX. For example, when the potential of the signal TX is high, charge corresponding to the illuminance of light with which the photoelectric conversion element 21 is irradiated is accumulated into the region 41 through the region 31.

The conductor 69 has a function of controlling transfer of charge held in the region 41 to the region 32 in accordance with the potential of the signal TR. For example, charge held in the region 41 is transferred to the region 32 when the potential of the signal TR is high.

Although the details will be described later, the conductor 62 has a function of increasing the efficiency of charge transfer from the region 41 to the region 32. In particular, by having the regions overlapped with the conductors 68 and 69, the conductor 62 can significantly increase the transfer efficiency. Thus, the light sensitivity of the imaging device in one embodiment of the present invention can be increased.

In the pixel 10, the conductor 62 and the conductors 68 and 69 are provided at opposite positions with respect to the semiconductor 64. Accordingly, the conductor 62 and the conductors 68 and 69 can overlap more easily than when the conductors 62, 68, and 69 are provided on the same side with respect to the semiconductor 64. As a result, the manufacturing process of the imaging device in one embodiment of the present invention can be simplified.

Note that the above structure of the pixel 10 is just an example, and some of the insulators, conductors, transistors, wirings, or the like are not included in some cases. Alternatively, a circuit, a transistor, a capacitor, a wiring, or the like that is not included in the above structure may be included, or connection of some wirings may be different from that described above.

Figure 2:
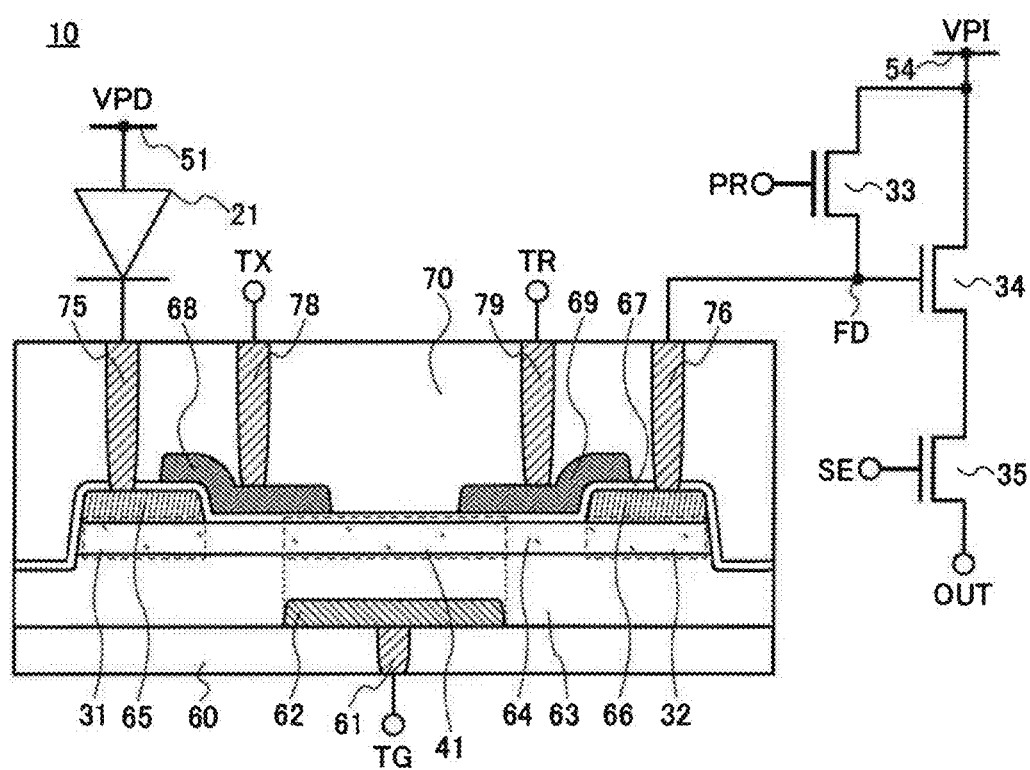
FIG. 2 shows a cross-sectional view and a circuit diagram for illustrating a pixel.

Note that connection between the component and the wiring in FIG. 1 is an example. Components may be electrically connected to different wirings, or a plurality of components may be electrically connected to the same wiring. For example, the other of the source and the drain of the transistor 33 may be electrically connected to the wiring 54 as illustrated in FIG. 2.

Next, an operation example of the pixel 10 with the structure illustrated in FIG. 1 will be described with reference to a timing chart in FIG. 3A and a schematic diagram of potentials in FIG. 3B. When the pixel 10 operates in accordance with the timing chart in FIG. 3A, the potential VPR and the potential VPI are set high (H), and the potential VPD is set low (L).

Figure 3A:
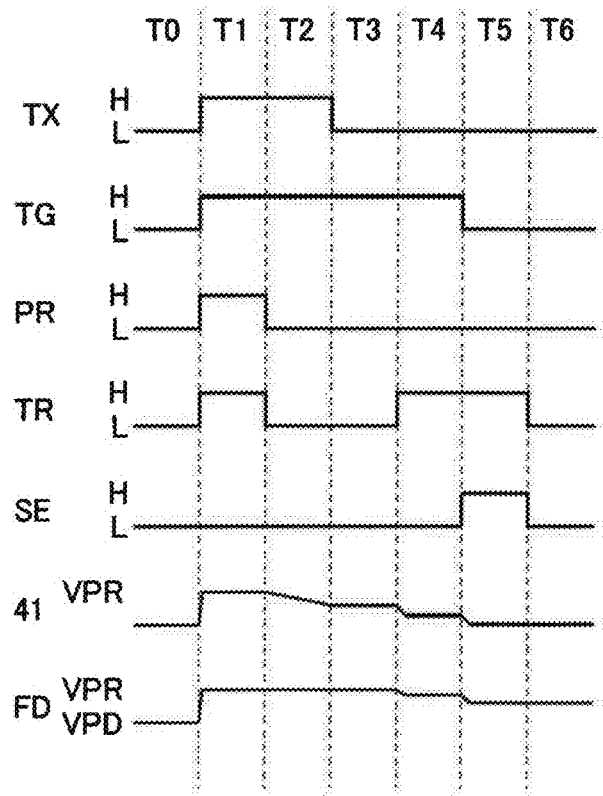
FIGS. 3A to 3C are a timing chart and potential diagrams for explaining operation of a pixel.
Figure 3B:
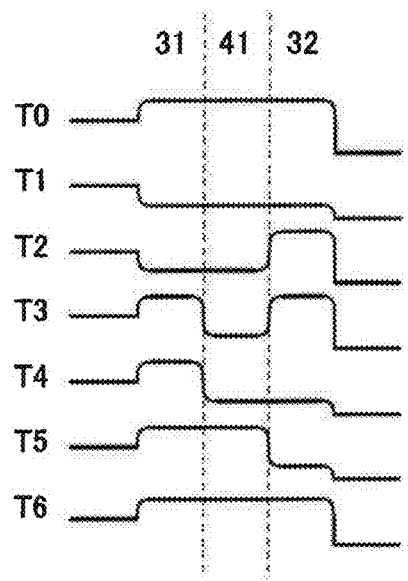

FIG. 3A shows the operation of obtaining imaging data and the operation of reading imaging data. TX, TG, PR, TR, SE, 41, and FD represent the potentials of the signal TX, the signal TG, the signal PR, the signal TR, the signal SE, the region 41, and the node FD. FIG. 3B shows the potentials of the region 31, the region 41, and the region 32 in periods T0 to T6 shown in FIG. 3A.

Here, the following assumptions are made. Electrical continuity is established between the region 31 and the region 41 when the potential of the signal TX is set high; whereas electrical continuity between the region 31 and the region 41 is broken when the potential of the signal TX is set low. Electrical continuity is established between the region 32 and the region 41 when the potential of the signal TR is set high; whereas electrical continuity between the region 32 and the region 41 is broken when the potential of the signal TR is set low. A transistor is turned on when a high-potential signal is supplied to a gate of the transistor, and is turned off when a low-potential signal is supplied to the gate.

In the period T0, all the potentials of the signal TX, the signal TG, the signal PR, the signal TR, the signal SE, and the node FD are set low; however, they are not limited to being low and can be a given potential.

In the period T1, the potentials of the region 41 and the node FD are reset. By setting the potentials of the signal TX, the signal TG, the signal PR, and the signal TR high, the potentials of the regions 31, 41, and 32 are lowered. Moreover, the transistor 33 is turned on. Thus, the potentials of the region 41 and the node FD become high (VPR).

In the period T2, light exposure is performed and imaging data is obtained. By setting the potentials of the signal PR and the signal TR low, charge is accumulated into the region 41 through the region 31 in accordance with the illuminance of light with which the photoelectric conversion element 21 is irradiated. Meanwhile, the potential of the region 32 increases because the potential of the signal TR is low; thus, the charge held in the region 41 is not transferred to the region 32. Consequently, the potential of the region 41 decreases in accordance with the illuminance of light with which the photoelectric conversion element 21 is irradiated, but the potential of the node FD does not change.

In the period T3, the imaging data is held. By setting the potential of the signal TX low, the potential of the region 31 increases; thus, the charge accumulated into the region 41 is held.

In the period T4, the held imaging data is transferred. By setting the potential of the signal TR high, the potential of the region 32 decreases. Thus, the charge held in the region 41 is transferred to the region 32, and the potentials of the region 41 and the node FD decrease.

In the period T5, the imaging data is read out. By setting the potential of the signal SE high, the signal OUT with a potential corresponding to the imaging data is output.

Moreover, by setting the potential of the signal TG low, the potential of the region 41 increases. Thus, the potential of the region 41 becomes higher than that of the region 32, and the efficiency of charge transfer from the region 41 to the region 32 can be enhanced, resulting in higher light sensitivity of the imaging device in one embodiment of the present invention.

Note that the potentials of the region 41 and the node FD in the period T5 are lower than those in the period T4.

After the period T4, switching of the potential of the signal TG to a low potential and switching of the potential of the signal SE to a high potential are performed at the same time here; however, these potentials may be switched at different timings. For example, the potential of the signal SE may be switched to a high potential after the potential of the signal TG is switched to a low potential.

After the imaging data is read out, the potentials of the signal TR and the signal SE are set low. Accordingly, the operation of reading the imaging data ends in the period T6. The above is an example of the operation of the pixel 10 having the structure in FIG. 1.

Figure 3C:
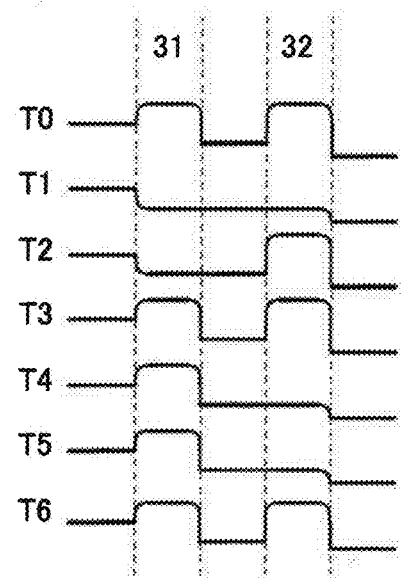

FIG. 3C shows the potentials of the region 31 and the region 32 in a pixel with a structure where the conductor 62 is omitted from the pixel 10 in FIG. 1. Note that the operating procedure is similar to that shown in the timing chart of FIG. 3A, except that supply of the signal TG is omitted because the pixel does not include the region 41.

If the conductor 62 is omitted, the efficiency of charge transfer cannot be increased in the period T5, and when the potential of the signal TR is set low in the period T6, the charge is left in a region between the region 31 and the region 32.

Figure 4A:
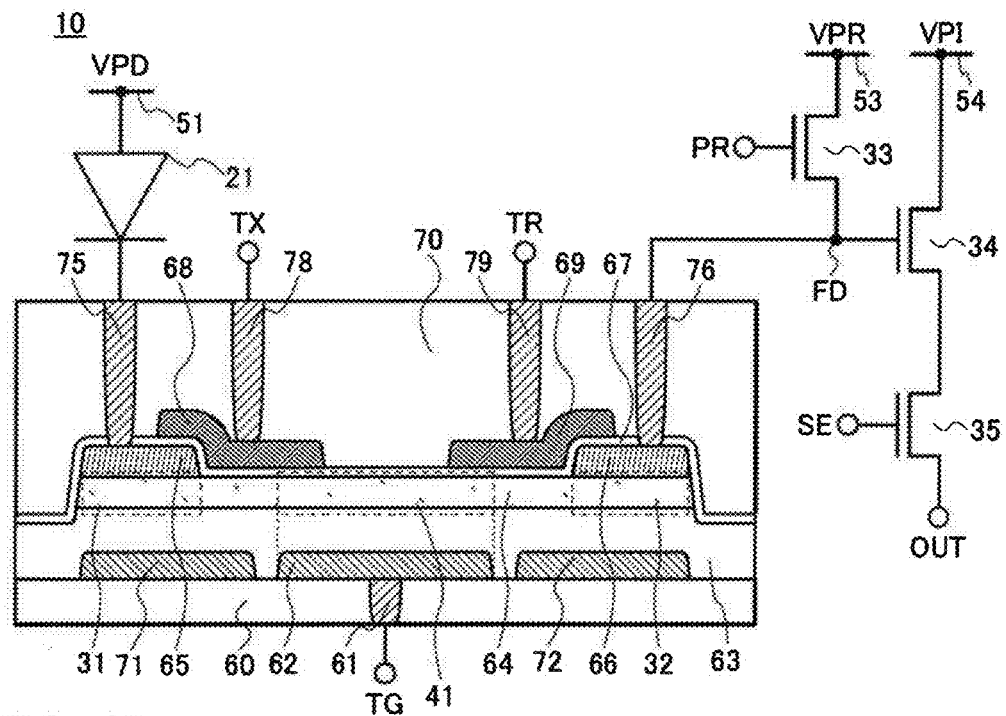
FIGS. 4A and 4B each show a cross-sectional view and a circuit diagram for illustrating a pixel.

The pixel 10 with the structure in FIG. 1 may include a conductor 71 and a conductor 72 as illustrated in FIG. 4A. The conductors 71 and 72 are in contact with the insulator 60 and the insulator 63. The conductor 71 has a region overlapped with the conductor 65 and the conductor 68. The conductor 72 has a region overlapped with the conductor 66 and the conductor 69. Note that the conductor 71 does not necessarily have a region overlapped with the conductor 65, and the conductor 72 does not necessarily have a region overlapped with the conductor 66. As the conductors 71 and 72, a material applicable to the conductor 62 can be used, for example.

The conductor 71 can be electrically connected to the conductor 68, for example. This structure enables the conductor 71 to be supplied with the same potential as that of the signal TX. Thus, the efficiency of transferring charge corresponding to imaging data from the region 31 to the region 41 can be increased when the potential of the signal TX is high. When the potential of the signal TX is low, the charge held in the region 41 can be prevented from leaking to the region 31. Note that the conductor 71 is not always necessary to be electrically connected to the conductor 68; in the case where the conductor 71 is not electrically connected to the conductor 68, the conductor 71 may be supplied with a potential different from a potential supplied to the conductor 68 or may be supplied with a constant potential.

The conductor 72 can be electrically connected to the conductor 69, for example. This structure enables the conductor 72 to be supplied with the same potential as that of the signal TR. Thus, the efficiency of transferring charge held in the region 41 to the region 32 can be increased when the potential of the signal TR is high. When the potential of the signal TR is low, the charge held in the region 41 can be prevented from leaking to the region 32. Note that the conductor 72 is not always necessary to be electrically connected to the conductor 69; in the case where the conductor 72 is not electrically connected to the conductor 69, the conductor 72 may be supplied with a potential different from a potential supplied to the conductor 69 or may be supplied with a constant potential.

Figure 4B:
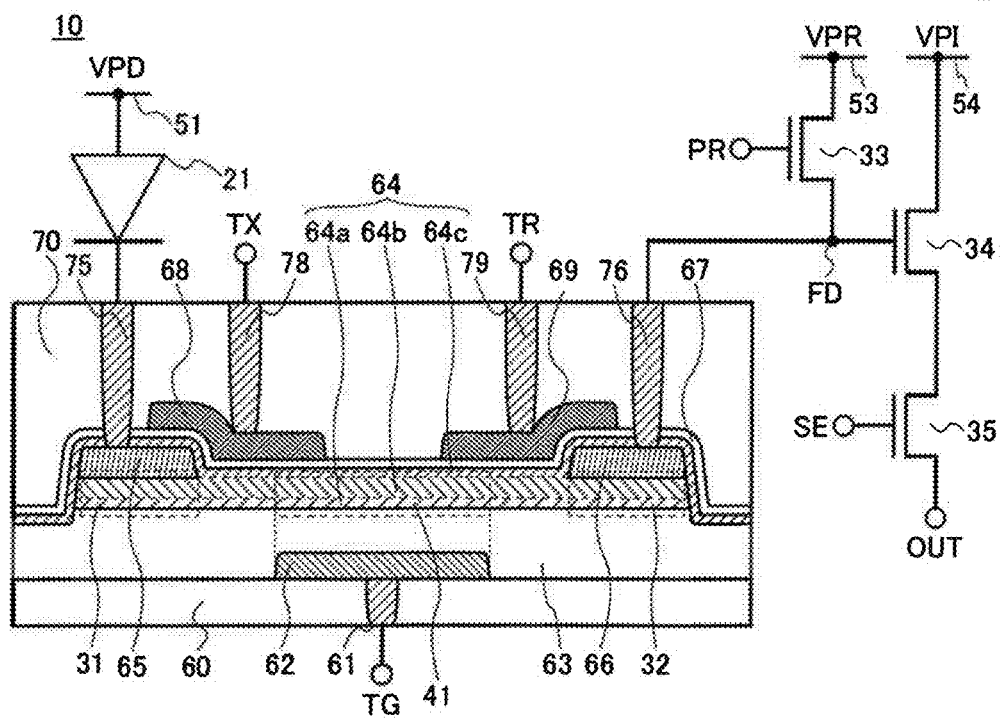

In the pixel 10 with the structure in FIG. 1, the semiconductor 64 may have three layers of a semiconductor 64a, a semiconductor 64b, and a semiconductor 64c as illustrated in FIG. 4B. When the semiconductors 64a to 64c are oxide semiconductors, a current can flow through the semiconductor 64b by appropriate selection of materials for the semiconductors 64a to 64c. When a current flows through the semiconductor 64b, influences of interface scattering can be reduced and the efficiency of charge transfer can be enhanced. For the semiconductors 64a and 64c, a current flows through a portion around the interface but other portions function as insulators in some cases.

Although the semiconductor 64c covers the conductors 65 and 66 in FIG. 4B, the semiconductor 64c does not necessarily cover the conductors 65 and 66.

The semiconductor 64 may have a two-layer structure or a stacked-layer structure including four or more layers.

Figure 5A:
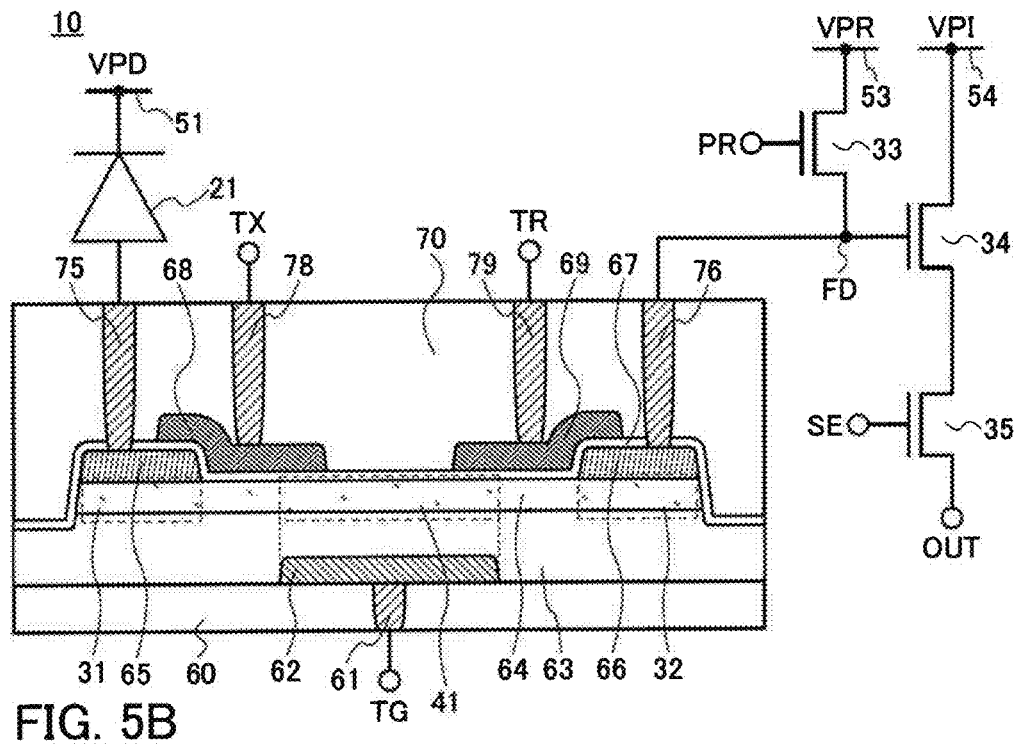
FIGS. 5A and 5B each show a cross-sectional view and a circuit diagram for illustrating a pixel.

In the pixel 10 with the structure in FIG. 1, the connection direction of the photoelectric conversion element 21 may be different as illustrated in FIG. 5A. In this case, the potentials of the region 41 and the node FD are set low for reset, and are increased by light exposure operation. In this structure, the potential VPD and the potential VPI are set high, and the potential VPR is set low.

Figure 5B:
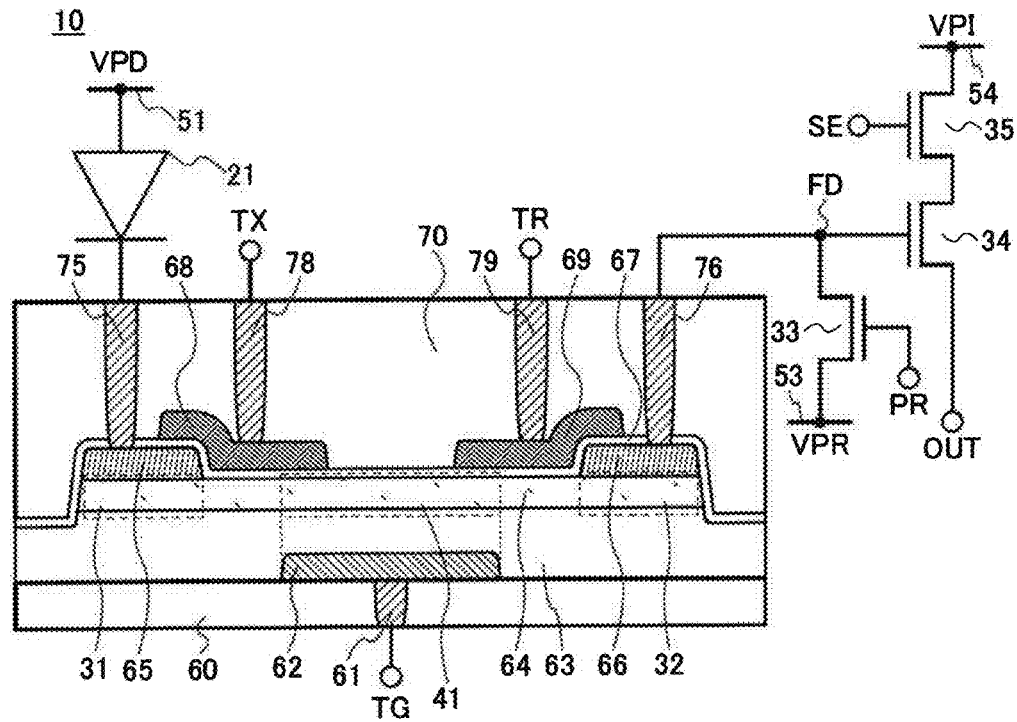

In the pixel 10 with the structure in FIG. 1, the signal OUT may be output from the one of the source and the drain of the transistor 34 as illustrated in FIG. 5B.

Figure 6A:
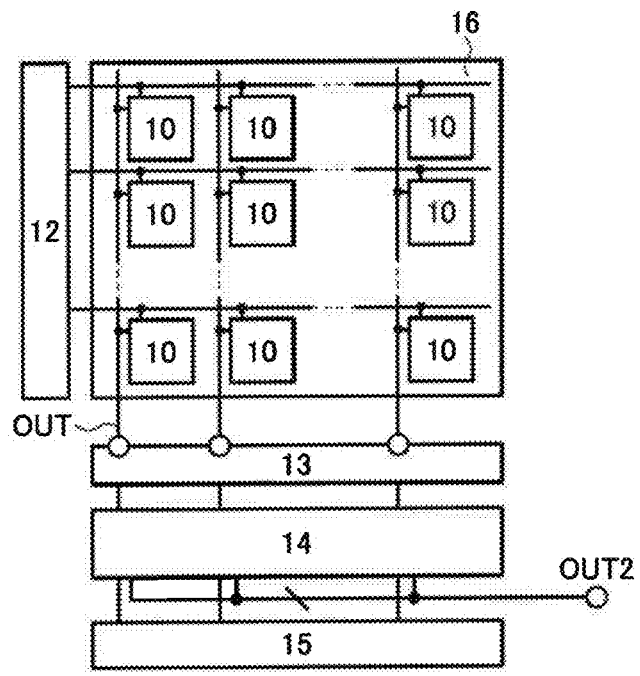
FIGS. 6A and 6B are a block diagram and a circuit diagram illustrating an imaging device.

FIG. 6A illustrates an imaging device of one embodiment of the present invention. The imaging device includes pixels 10, a row driver circuit 12, a correlated double sampling (CDS) circuit 13, an A/D converter circuit 14, and a column driver circuit 15. The pixels 10 are arranged in a matrix to form a pixel array 16. Note that the CDS circuit 13 can be omitted.

The row driver circuit 12 has a function of driving the pixels 10. The CDS circuit 13 has a function of performing CDS operation on an output signal of the pixel 10. The A/D converter circuit 14 has a function of converting analog data output from the CDS circuit 13 into digital data. The column driver circuit 15 has a function of selecting and reading data converted by the A/D converter circuit 14.

Figure 6B:
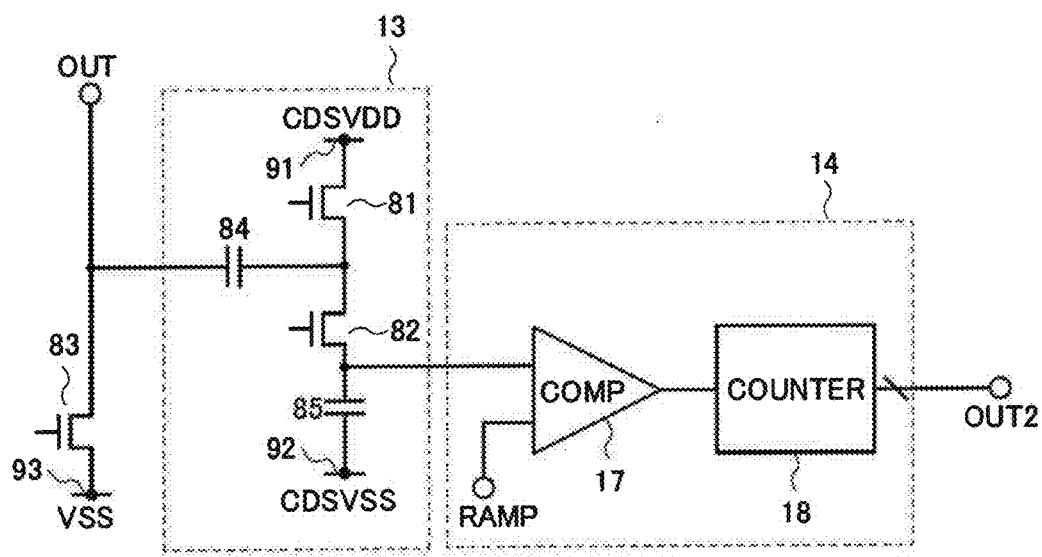

FIG. 6B shows a circuit diagram of the CDS circuit 13 and a block diagram of the A/D converter circuit 14 that are connected to pixels 10 in one column. The CDS circuit 13 can include a transistor 81, a transistor 82, a capacitor 84, and a capacitor 85. The A/D converter circuit 14 can include a comparator circuit 17 and a counter circuit 18.

A transistor 83 serving as a current source can be provided in addition to the CDS circuit 13 and the A/D converter circuit 14. A bias voltage is always applied to a gate of the transistor 83.

One of a source and a drain of the transistor 81 is electrically connected to one of a source and a drain of the transistor 82 and one electrode of the capacitor 84. The other of the source and the drain of the transistor 82 is electrically connected to one electrode of the capacitor 85 and one input terminal of the comparator circuit 17. An output terminal of the comparator circuit 17 is electrically connected to an input terminal of the counter circuit 18. The other electrode of the capacitor 84 is electrically connected to one of a source and a drain of the transistor 83.

The other of the source and the drain of the transistor 81 is electrically connected to a wiring 91. The other electrode of the capacitor 85 is electrically connected to a wiring 92. The other of the source and the drain of the transistor 83 is electrically connected to a wiring 93.

The wirings 91 to 93 function as power supply lines. A potential CDSVDD, a potential CDSVSS, and a potential VSS can be applied to the wiring 91, the wiring 92, and the wiring 93, respectively. For example, CDSVDD can be a high potential, and CDSVSS and VSS can be a low potential.

The one of the source and the drain of the transistor 83 can be supplied with the signal OUT that corresponds to imaging data output from the pixel 10. The other input terminal of the comparator circuit 17 can be supplied with a signal RAMP. A signal OUT2 can be output from an output terminal of the counter circuit 18.

An operation example of the CDS circuit 13 connected to the pixel 10 illustrated in FIG. 1 will be described. First, the transistor 81 and the transistor 82 are turned on. Next, the potential of imaging data is output from the pixel 10 as the signal OUT, and the potential of the one input terminal of the comparator circuit 17 is kept at CDSVDD, which is a reference potential. Then, the transistor 81 is turned off, and the signal OUT having a reset potential (e.g., a potential higher than that of the imaging data) is output from the pixel 10. At this time, a potential applied to the one input terminal of the comparator circuit 17 becomes a potential obtained by adding the absolute value of a difference between the potential of the imaging data and the reset potential to CDSVDD. Thus, a signal with little noise that is obtained by adding the net potential of the imaging data to the reference potential CDSVDD can be supplied to the A/D converter circuit 14. It is possible to read the reset signal by setting the signal SE high in part of the period T3 in FIG. 3A; in that case, the signal PR may also be set high. The effect of CDS can be enhanced by reading imaging data after reading the reset potential, not by reading the reset potential after reading imaging data.

Note that when the reset potential is lower than the potential of imaging data (e.g., when the reset potential is a ground potential), a potential supplied to the one input terminal of the comparator circuit 17 becomes a potential obtained by subtracting the absolute value of a difference between the potential of the imaging data and the reset potential from CDSVDD.

The A/D converter circuit 14 compares the potential of a signal that is input from the CDS circuit 13 to the comparator circuit 17 and the reference potential (RAMP) that is swept up or down. Then, the counter circuit 18 operates in accordance with the output of the comparator circuit 17 and outputs a digital signal as the signal OUT2.

Figure 7A:
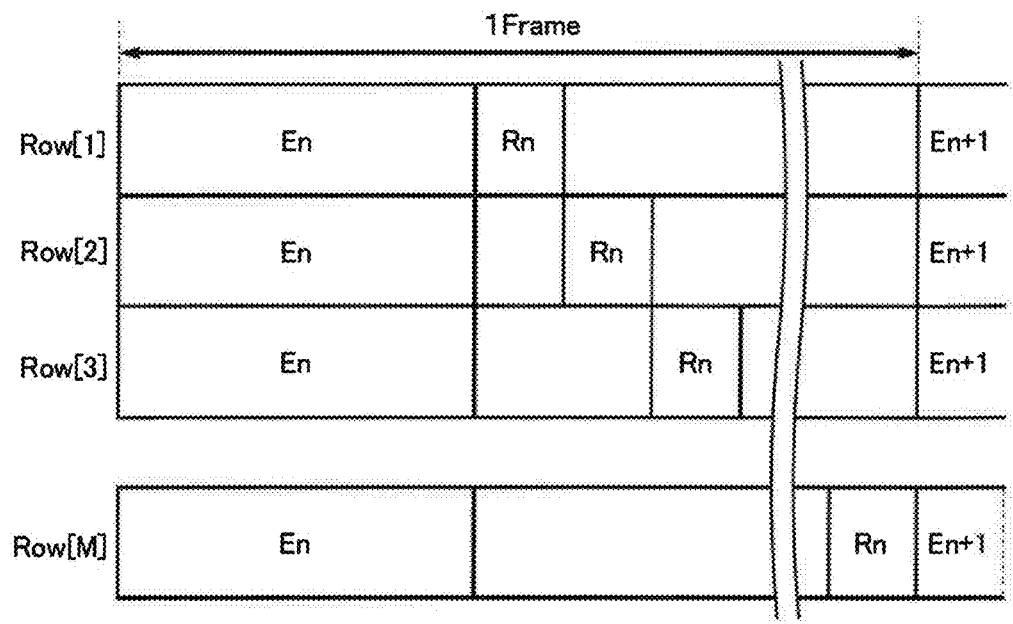
FIGS. 7A and 7B are schematic diagrams showing operation with a global shutter method and operation with a rolling shutter method, respectively.
Figure 7B:
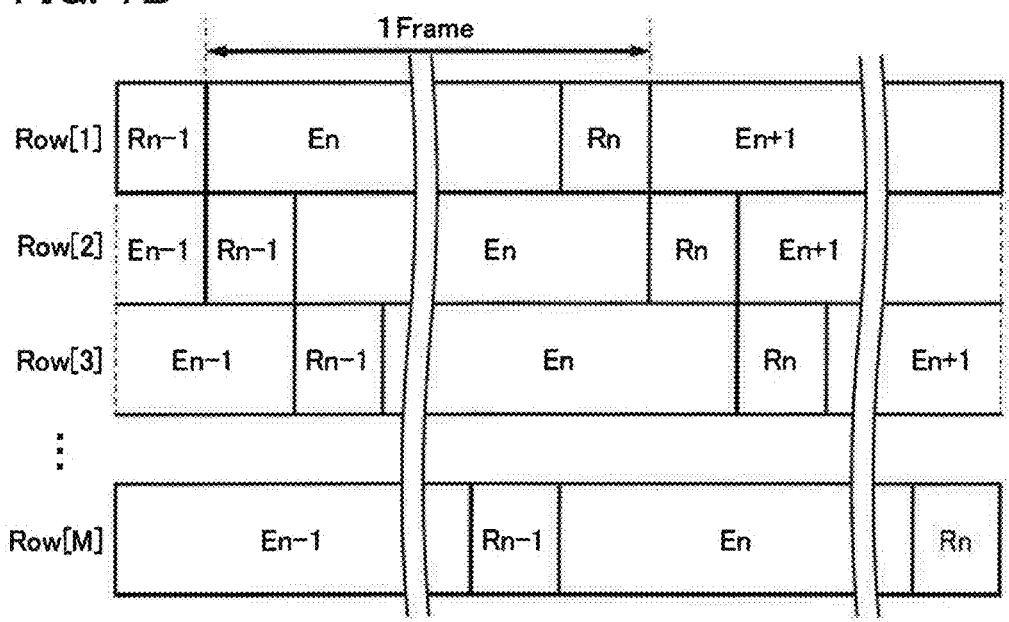

As described above, the imaging device of one embodiment of the present invention can operate by a global shutter method and a rolling shutter method. FIGS. 7A and 7B schematically show the operation with a global shutter method and the operation with a rolling shutter method, respectively. In FIGS. 7A and 7B, "E" represents a period in which light exposure operation can be performed, and "R" represents a period in which reading operation can be performed. Moreover, n represents a given n-th frame (n is a natural number of 2 or more); n−1 represents a frame before the n-th frame; and n+1 represents a frame following the n-th frame. Pixels are assumed to be arranged in a matrix as illustrated in FIG. 6A. Furthermore, Row[1] represents a pixel in a first row, and Row[M] represents a pixel in an M-th row (last row).

FIG. 7A is a schematic view illustrating the operation with the global shutter method. In the global shutter method, light exposure is simultaneously performed on all pixels, and then data reading is performed row by row. Thus, an image without distortion is obtained even when a moving object is captured.

FIG. 7B is a schematic view illustrating the operation with the rolling shutter method. In the rolling shutter method, light exposure and data reading are sequentially performed row by row. Since imaging cannot be simultaneously performed on all pixels, distortion is caused in an image of a moving object.

Figure 8:
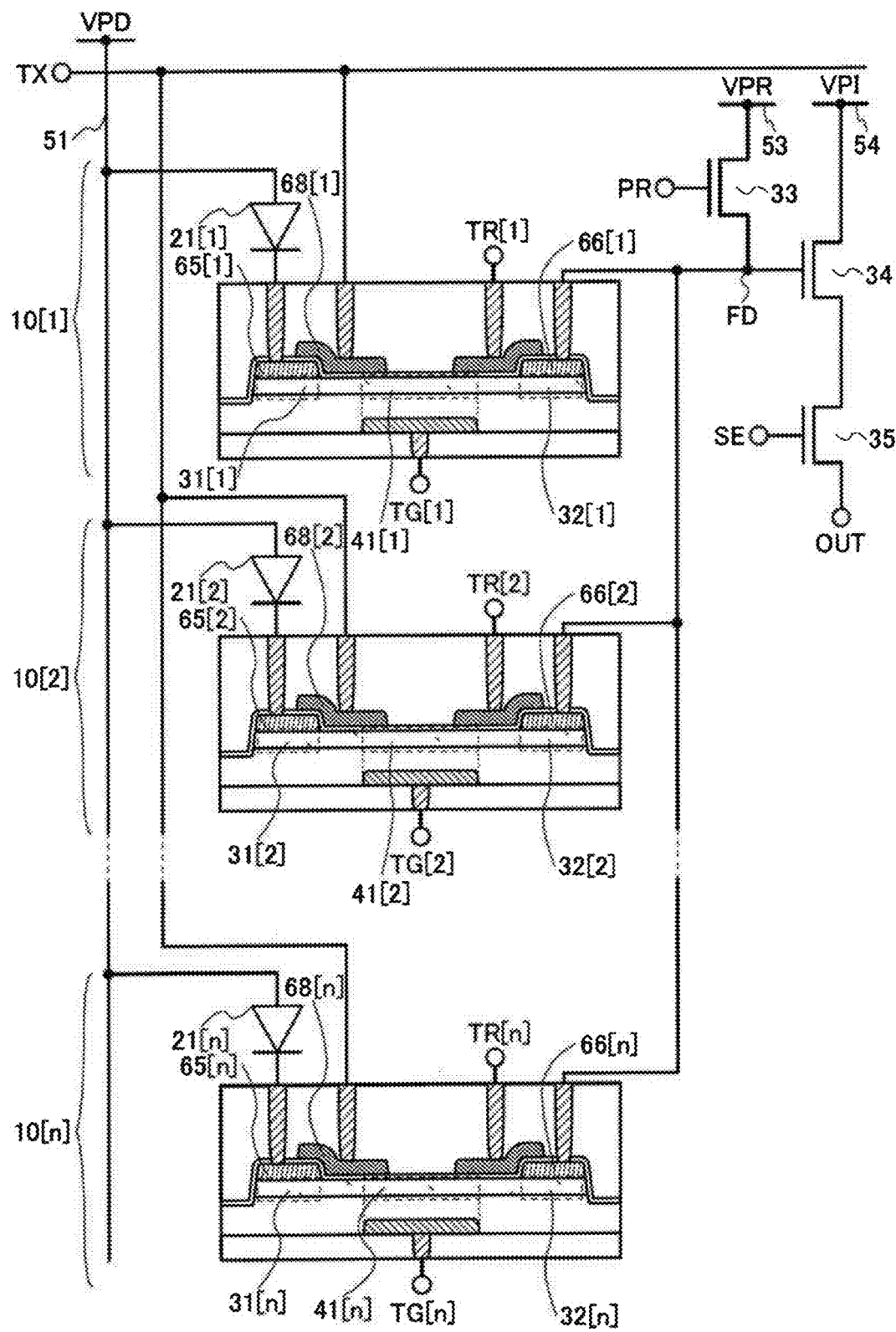
FIG. 8 shows cross-sectional views and a circuit diagram for illustrating a pixel.

FIG. 8 illustrates an example of a configuration in which one transistor 33, one transistor 34, and one transistor 35 are shared between n pixels 10 having the structure in FIG. 1 (n is an integer of 2 or more). This configuration can reduce the number of transistors per pixel and reduce the occupied area per pixel. As a result, the imaging device of one embodiment of the present invention can have higher resolution and be downsized.

When components with the same reference numerals need to be distinguished from each other in this specification, symbols for identification, such as [a], are added to the reference numerals. For example, n pixels 10 are denoted by pixels 10[1] to 10[n] to make a distinction.

For example, n can be 2, 3, 4, or 8.

Figure 9:
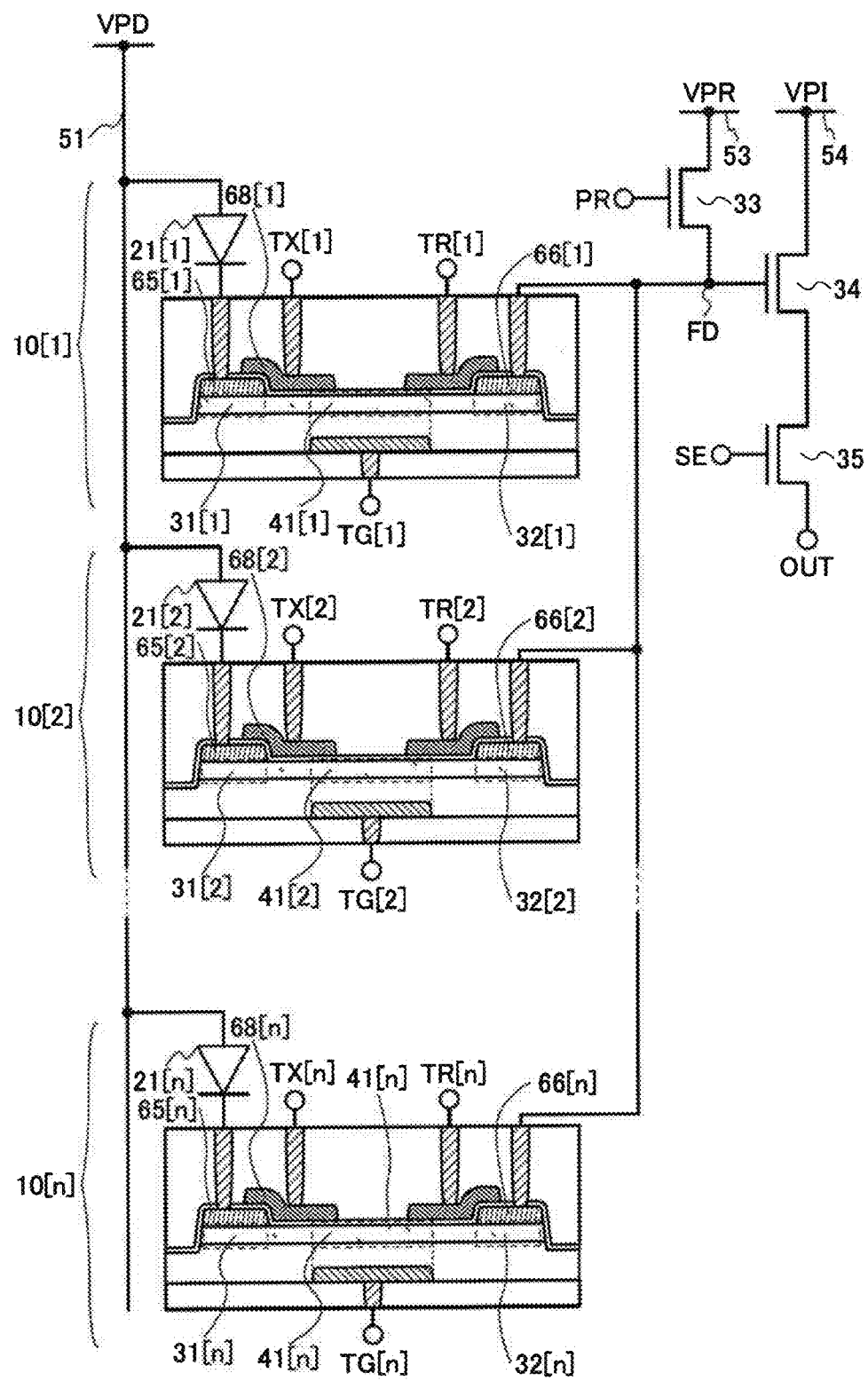
FIG. 9 shows cross-sectional views and a circuit diagram for illustrating a pixel.

Although the other electrodes of photoelectric conversion elements 21[1] to 21[n] are electrically connected to one wiring 51 in FIG. 8, they may be electrically connected to different wirings 51. Although the same signal TX is supplied to conductors 68[1] to 68[n] in FIG. 8, signals TX[1] to TX[n] may be supplied to the conductors 68[1] to 68[n] as illustrated in FIG. 9.

Figure 10:
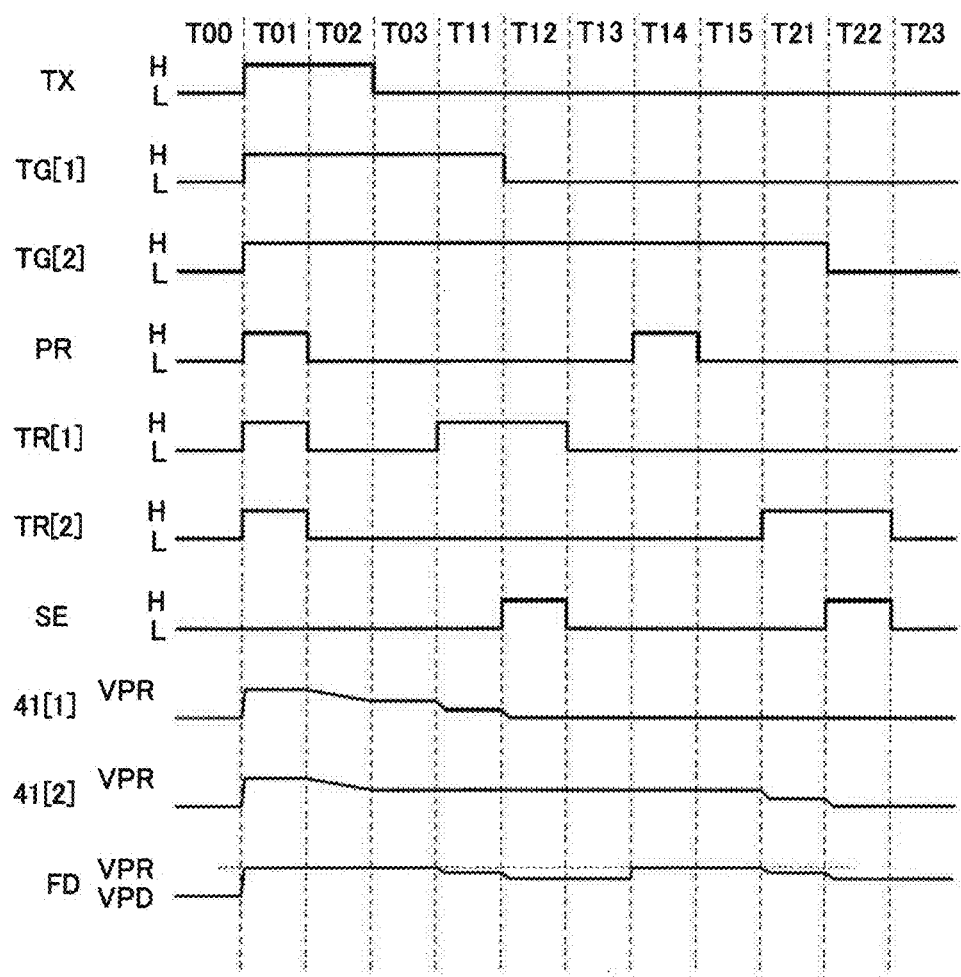
FIG. 10 is a timing chart showing operation of pixels.

Next, the operation of the pixel 10 having the configuration in FIG. 8 with a global shutter method will be described. FIG. 10 is a timing chart showing the operation of the pixel 10[1] and the pixel 10[2] when n=2, that is, when the transistors 33, 34, and 35 are shared by the pixel 10[1] and the pixel 10[2].

To operate the pixels in accordance with the timing chart in FIG. 10, the potential VPR and the potential VPI are set high (H), and the potential VPD is set low (L) as in the case where the pixels operates according to the timing chart in FIG. 3A.

FIG. 10 shows the operation of obtaining imaging data and the operation of reading imaging data. TX, TG[1], TG[2], PR, TR[1], TR[2], SE, 41[1], 41[2], and FD represent the potentials of the signal TX, the signal TG[1], the signal TG[2], the signal PR, the signal TR[1], the signal TR[2], the signal SE, the region 41[1], the region 41[2], and the node FD.

Here, the following assumptions are made. Electrical continuity is established between the region 31[1] and the region 41[1] and between the region 31[2] and the region 41[2] when the potential of the signal TX is set high; whereas electrical continuity between the region 31[1] and the region 41[1] and between the region 31[2] and the region 41[2] is broken when the potential of the signal TX is set low. Electrical continuity is established between the region 32[1] and the region 41[1] when the potential of the signal TR[1] is set high; whereas electrical continuity between the region 32[1] and the region 41[1] is broken when the potential of the signal TR[1] is set low. Electrical continuity is established between the region 32[2] and the region 41[2] when the potential of the signal TR[2] is set high; whereas electrical continuity between the region 32[2] and the region 41[2] is broken when the potential of the signal TR[2] is set low. A transistor is turned on when a high-potential signal is supplied to a gate of the transistor, and is turned off when a low-potential signal is supplied to the gate.

In a period T00, all the potentials of the signal TX, the signal TG[1], the signal TG[2], the signal PR, the signal TR[1], the signal TR[2], the signal SE, and the node FD are set low; however, they are not limited to being low and can be a given potential.

In a period T01, the potentials of the region 41[1], the region 41[2], and the node FD are reset. By setting the potentials of the signal TX, the signal TG[1], the signal TG[2], the signal PR, the signal TR[1], and the signal TR[2] high, the potentials of the region 41[1], the region 41[2], and the node FD become high (VPR).

In a period T02, light exposure is performed and imaging data is obtained. By setting the potentials of the signal PR, the signal TR[1], and the signal TR[2] low, charge corresponding to the illuminance of light incident on the pixel 10[1] is transferred from the photoelectric conversion element 21[1] to the region 41[1] through the region 31[1], and charge corresponding to the illuminance of light incident on the pixel 10[2] is transferred from the photoelectric conversion element 21[2] to the region 41[2] through the region 31[2]. Meanwhile, since the potentials of the signal TR[1] and the signal TR[2] are low, the charge transferred to the region 41[1] is not transferred to the region 32[1] and the charge transferred to the region 41[2] is not transferred to the region 32[2]. Consequently, the potential of the region 41[1] decreases in accordance with the illuminance of light incident on the pixel 10[1], and the potential of the region 41[2] decreases in accordance with the illuminance of light incident on the pixel 10[2]; however, the potential of the node FD does not change.

In a period T03, the imaging data are held. By setting the potential of the signal TX low, the charges transferred to the region 41[1] and the region 41[2] are held.

In a period T11, the imaging data held in the region 41[1] is transferred. By setting the potential of the signal TR[1] high, the charge held in the region 41[1] is transferred to the region 32[1], and the potentials of the region 41[1] and the node FD decrease.

In a period T12, the imaging data transferred in the period T11 is read out. By setting the potential of the signal SE high, the signal OUT with a potential corresponding to the imaging data is output. Moreover, by setting the potential of the signal TG[1] low, the efficiency of charge transfer from the region 41[1] to the region 32[1] can be increased.

Note that the potentials of the region 41[1] and the node FD in the period T12 are lower than those in the period T11.

After the period T11, switching of the potential of the signal TG[1] to a low potential and switching of the potential of the signal SE to a high potential are performed at the same time here; however, these potentials may be switched at different timings. For example, the potential of the signal SE may be switched to a high potential after the potential of the signal TG[1] is switched to a low potential.

After the imaging data is read out, the potentials of the signal TR[1] and the signal SE are set low. Accordingly, the operation of reading the imaging data ends in a period T13.

In a period T14, the potential of the node FD is reset. By setting the potential of the signal PR high, the potential of the node FD becomes high (VPR).

After the potential of the node FD is reset, the potential of the signal PR is set low. Accordingly, the reset operation ends in a period T15.

In a period T21, the imaging data held in the region 41[2] is transferred. By setting the potential of the signal TR[2] high, the charge held in the region 41[2] is transferred to the region 32[2], and the potentials of the region 41[2] and the node FD decrease.

In a period T22, the imaging data transferred in the period T21 is read out. By setting the potential of the signal SE high, the signal OUT with a potential corresponding to the imaging data is output. Moreover, by setting the potential of the signal TG[2] low, the efficiency of charge transfer from the region 41[2] to the region 32[2] can be increased.

Note that the potentials of the region 41[2] and the node FD in the period T22 are lower than those in the period T21.

After the period T21, switching of the potential of the signal TG[2] to a low potential and switching of the potential of the signal SE to a high potential are performed at the same time here; however, these potentials may be switched at different timings. For example, the potential of the signal SE may be switched to a high potential after the potential of the signal TG[2] is switched to a low potential. In addition, for CDS, the reset potential may be read out in the period T14, that is, the signal SE may be set high in the period T14. Moreover, the reset potential may be read out in the period T03.

After the imaging data is read out, the potentials of the signal TR[2] and the signal SE are set low. Accordingly, the operation of reading the imaging data ends in a period T23.

Note that the operations from the period T01 to the period T03 are concurrently performed in all the pixels 10 included in the imaging device of one embodiment of the present invention. Meanwhile, the operation in the period T11 or later is performed in the pixels 10 sequentially row by row.

Figure 11A:
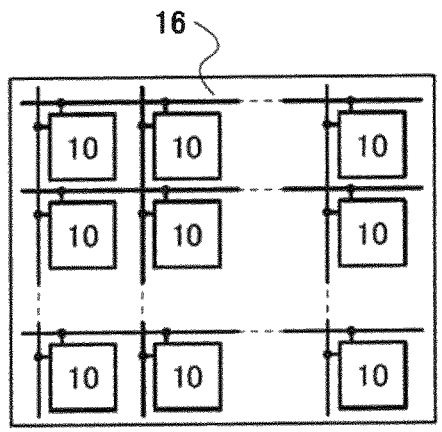
FIGS. 11A to 11C are block diagrams each illustrating an imaging device.
Figure 11B:
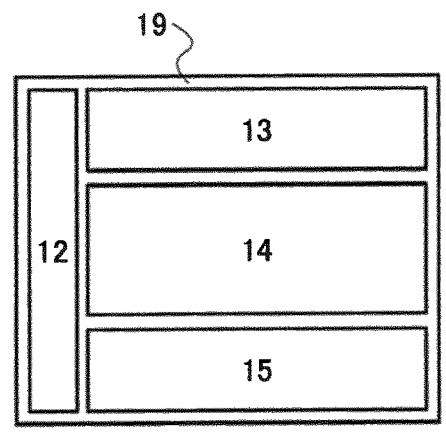
Figure 11C:
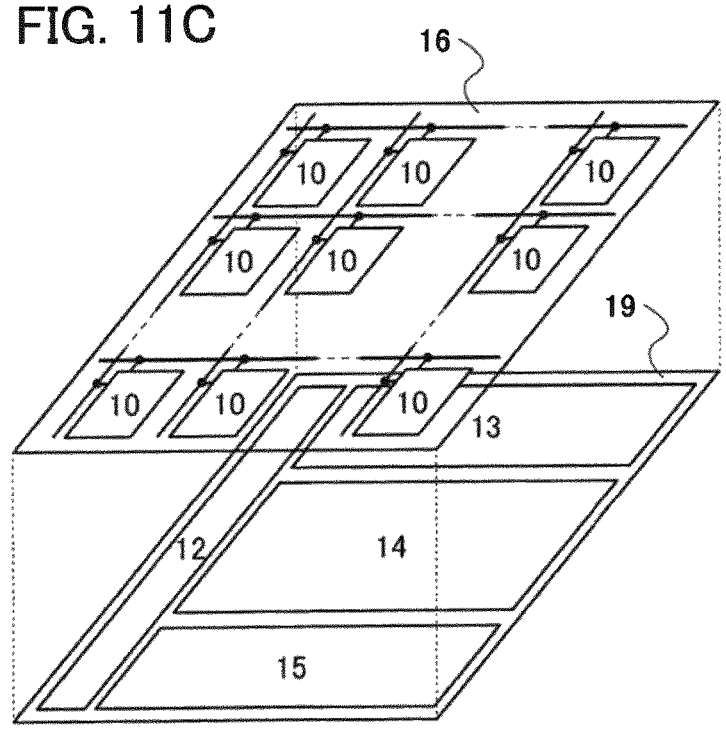

FIG. 11A is a block diagram of the pixel array 16 illustrated in FIG. 6A. FIG. 11B is a block diagram of circuits that can be formed over a substrate 19. Over the substrate 19, the row driver circuit 12, the CDS circuit 13, the A/D converter circuit 14, and the column driver circuit 15 illustrated in FIG. 6A can be formed, for example. One embodiment of the present invention can employ a stacked structure of the pixel array 16 and the substrate 19 as illustrated in FIG. 11C. Such a structure can reduce the area of the imaging device. Note that the layout of the circuits in FIG. 11B is an example, and another layout may be used.

The row driver circuit 12, the CDS circuit 13, the A/D converter circuit 14, and the column driver circuit 15 are preferably formed using Si transistors to achieve high-speed operation and be configured with CMOS circuits. For example, the substrate 19 can be a silicon substrate, and the above circuits can be formed on the silicon substrate. The pixels 10 in the pixel array 16 are preferably formed using an oxide semiconductor as described above. Note that some of transistors that constitute the row driver circuit 12, the CDS circuit 13, the A/D converter circuit 14, and the column driver circuit 15 may be formed on a surface where the pixel array 16 is formed. That is, some of the transistors that constitute the above circuits may be OS transistors. Furthermore, some of the transistors in the pixels 10 may be provided on the substrate 19; that is, some of them may be Si transistors.

Figure 12:
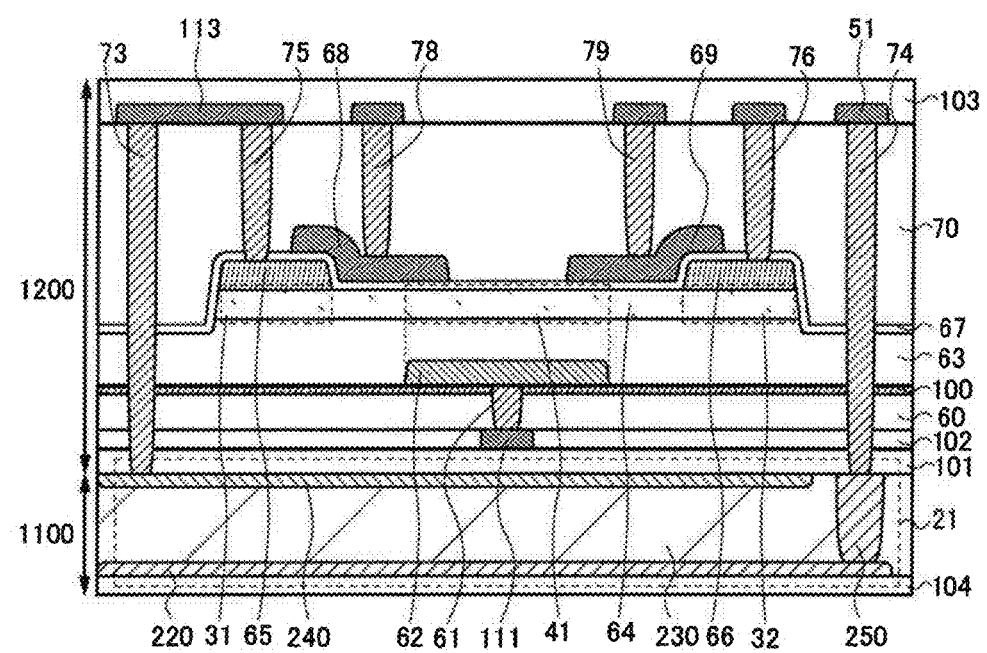
FIG. 12 is a cross-sectional view illustrating an imaging device.

FIG. 12 is a diagram obtained by combining the cross-sectional view in FIG. 1 and a cross-sectional view of the photoelectric conversion element 21. As illustrated in FIG. 12, an insulator 101, an insulator 102, an insulator 103, an insulator 104, and the like are provided in the imaging device of one embodiment of the present invention. Each of the insulators 101 to 104 has a function of a protective film and/or an interlayer insulating film. Note that each of the aforementioned insulators 60, 63, and 70 also has a function of a protective film and/or an interlayer insulating film. For the insulators 101 to 104, a material applicable to the insulators 60, 63, and 70 can be used, for example. Top surfaces of the insulators 101 to 104 and the like may be subjected to planarization treatment by a CMP method or the like, as necessary.

In some cases, some of the wirings, conductors, insulators, and the like illustrated in drawings are not provided, or a wiring, a conductor, an insulator, or the like that is not illustrated in drawings is included in each layer.

As illustrated in FIG. 12, the pixel 10 can include a layer 1100 and a layer 1200. The layer 1100 can include the photoelectric conversion element 21. A photodiode with two terminals can be used for the photoelectric conversion element 21, for example. The photodiode can be a PN photodiode using a single crystal silicon substrate, a PIN photodiode using an amorphous silicon thin film, a microcrystalline silicon thin film, or a polycrystalline silicon thin film, or a photodiode using selenium, a selenium compound, or an organic compound, for example.

In FIG. 12, the photoelectric conversion element 21 included in the layer 1100 is a PN photodiode using a single crystal silicon substrate. The photoelectric conversion element 21 can include a $p^+$ region 220, a $p^-$ region 230, an n-type region 240, and a $p^+$ region 250.

The layer 1200 can include the components included in the pixel 10 other than the photoelectric conversion element 21. The layer 1200 can include an OS transistor such as the transistor 33 (not shown), for example, in addition to the components shown in the cross-sectional view of FIG. 1. In such a manner, the photoelectric conversion element 21 and the pixel 10 can overlap each other; thus, the area where the photoelectric conversion element 21 receives light can be widened.

An insulator 100 is provided between a region including an oxide semiconductor and a region including a Si device (e.g., Si transistor or Si photodiode).

An insulator provided near a Si device preferably contains hydrogen to terminate dangling bonds of silicon. Meanwhile, hydrogen in an insulator provided near an oxide semiconductor such as the semiconductor 64 causes generation of carriers in the oxide semiconductor. Thus, the hydrogen might reduce the reliability of the pixel 10. For this reason, the insulator 100 that has a function of preventing diffusion of hydrogen is preferably provided between one layer including the Si device and another layer that includes the oxide semiconductor and is stacked over the one layer. Diffusion of hydrogen can be prevented by the insulator 100; thus, the reliability of both the Si device and the device containing the oxide semiconductor (e.g., the components included in the pixel 10) can be improved.

The insulator 100 can be formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ), for example.

One electrode (the n-type region 240) of the photoelectric conversion element 21 is electrically connected to the conductor 65 through the conductor 73, a wiring 113, and the conductor 75, for example. The other electrode (the $p^+$ region 220 and the $p^+$ region 250) of the photoelectric conversion element 21 is electrically connected to the wiring 51 through a conductor 74, for example. The conductor 62 is electrically connected to a wiring 111 through the conductor 61, for example.

Figure 13:
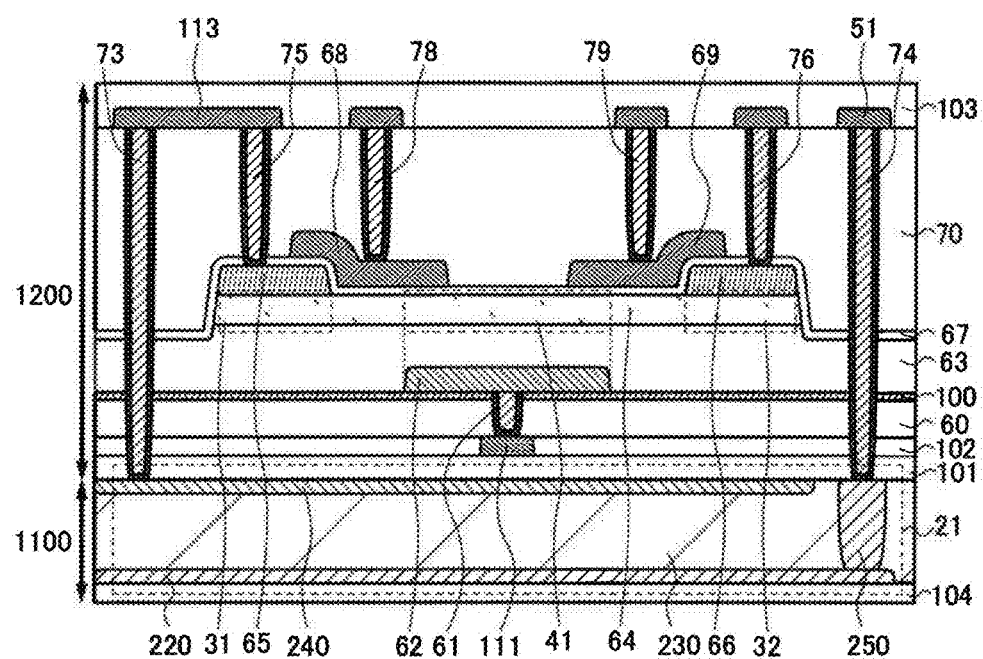
FIG. 13 is a cross-sectional view illustrating an imaging device.

Here, the conductors 61, 73, and 74 penetrate the insulator 100, and thus preferably have a function of preventing diffusion of hydrogen. The conductors 75, 76, 78, and 79 may also have a function of preventing diffusion of hydrogen. FIG. 13 is a diagram obtained by combining the cross-sectional view in FIG. 1 and a cross-sectional view of the photoelectric conversion element 21 when each of the conductors 61, 73 to 76, 78, and 79 has a two-layer structure. Each of the conductors 61, 73 to 76, 78, and 79 has the following structure: a conductor with a barrier property against hydrogen is provided on the outer side (the side in contact with a sidewall of an opening formed in the insulator 70 and the like), and a conductor with low resistance is provided on the inner side. For instance, tantalum nitride or the like can be used for the outer conductor, and tungsten or the like can be used for the inner conductor.

Figure 14:
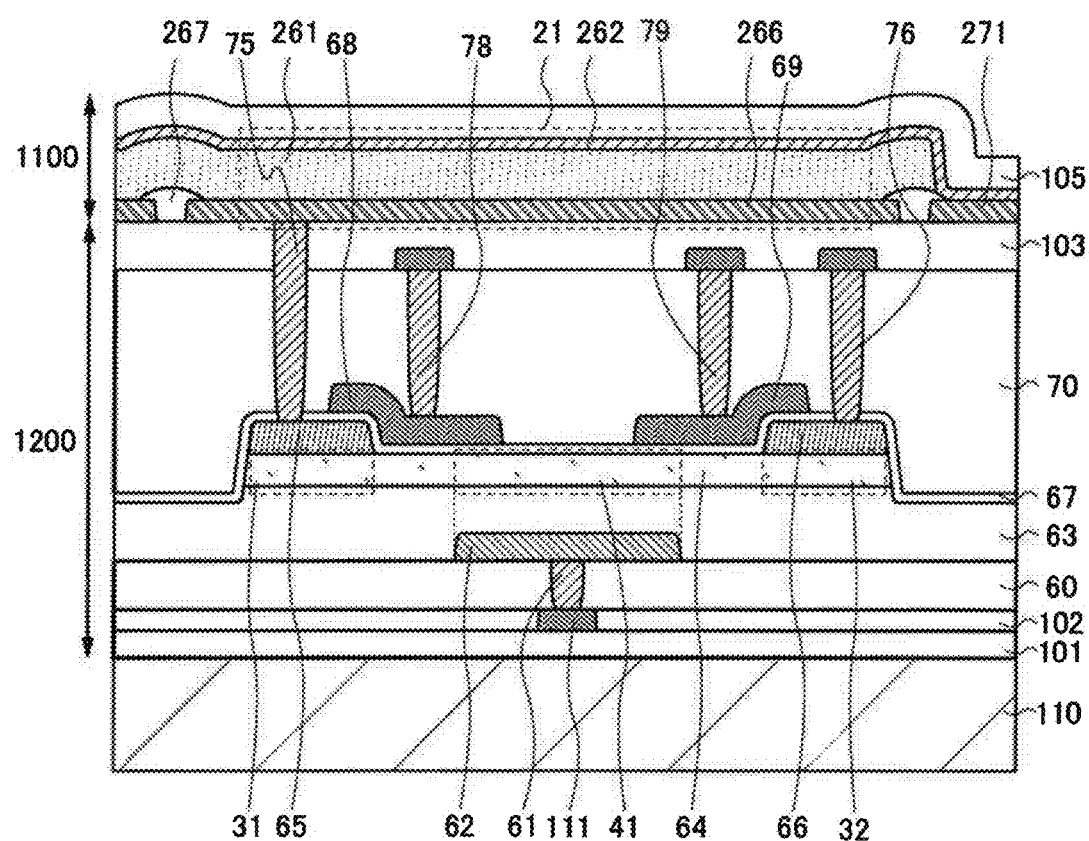
FIG. 14 is a cross-sectional view illustrating an imaging device.

The pixel 10 can employ a stacked structure illustrated in FIG. 14. In the pixel 10 in FIG. 14, the layer 1200 and the layer 1100 are provided over a substrate 110. The photoelectric conversion element 21 is provided over the layer 1200, which facilitates electrical connection between the conductor 65 and one electrode of the photoelectric conversion element 21. Note that the insulator 101 may be omitted.

As the substrate 110, a glass substrate, a quartz substrate, a semiconductor substrate, a ceramic substrate, a metal substrate with an insulated surface, or the like can be used. Other examples are a silicon substrate provided with a transistor and/or a photodiode; and a silicon substrate over which an insulator, a wiring, a conductor functioning as a contact plug, and the like are provided together with a transistor and/or a photodiode. When a p-channel transistor is formed on a silicon substrate, a silicon substrate with $n^-$-type conductivity is preferably used. Alternatively, an SOI substrate including an $n^-$-type or i-type silicon layer may be used. Moreover, when a p-channel transistor is formed on a silicon substrate, a surface of the silicon substrate where the transistor is formed preferably has a (110) plane orientation, in which case the mobility can be increased.

FIG. 14 illustrates the photoelectric conversion element 21 using a selenium-based material for a photoelectric conversion layer 261. The photoelectric conversion element 21 containing a selenium-based material has high external quantum efficiency with respect to visible light. Furthermore, a selenium-based material has a high light-absorption coefficient, making the photoelectric conversion layer 261 thin easily. The photoelectric conversion element 21 containing a selenium-based material can be a highly sensitive sensor in which the amount of amplification of electrons is large because of avalanche multiplication. In other words, the use of a selenium-based material for the photoelectric conversion layer 261 allows a sufficient amount of photocurrent to be obtained even when the pixel area is reduced. Thus, the photoelectric conversion element 21 containing a selenium-based material is also suitable for imaging in a low-illuminance environment.

As a selenium-based material, amorphous selenium or crystalline selenium can be used. Crystalline selenium can be obtained, for example, by depositing amorphous selenium and then performing heat treatment. When the crystal grain size of crystalline selenium is smaller than a pixel pitch, variations in characteristics between pixels can be reduced. Moreover, crystalline selenium has higher spectral sensitivity and light-absorption coefficient for visible light than those of amorphous selenium.

Figure 15A:
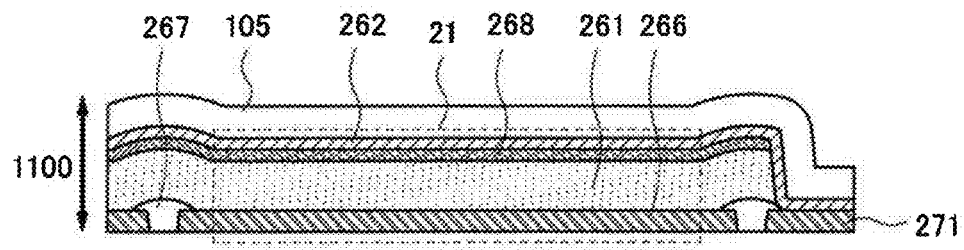
FIGS. 15A to 15E are cross-sectional views each illustrating an imaging device.
Figure 15B:
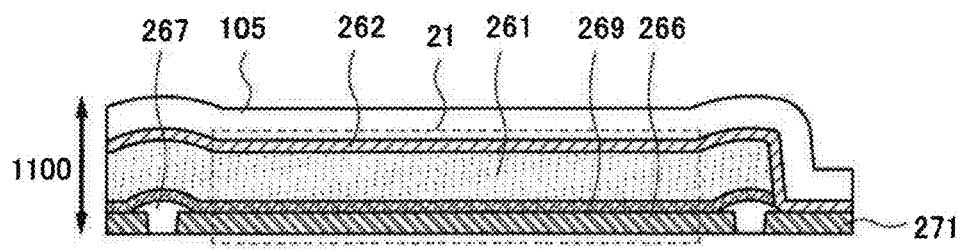
Figure 15C:
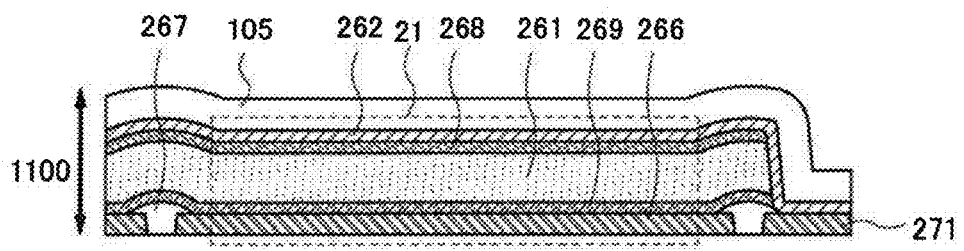

Although the photoelectric conversion layer 261 is a single layer in FIG. 14, a layer of gallium oxide, cerium oxide, In—Ga—Zn oxide, or the like may be provided as a hole-injection blocking layer 268 on a light-receiving surface side as illustrated in FIG. 15A. Alternatively, as illustrated in FIG. 15B, a layer of nickel oxide, antimony sulfide, or the like may be provided as an electron-injection blocking layer 269 on an electrode 266 side. Further alternatively, the hole-injection blocking layer 268 and the electron-injection blocking layer 269 may be provided as illustrated in FIG. 15C.

The photoelectric conversion layer 261 may be a layer containing a compound of copper, indium, and selenium (CIS); or a layer containing a compound of copper, indium, gallium, and selenium (CIGS). The use of CIS or CIGS makes it possible to form a photoelectric conversion element that utilizes avalanche multiplication as in the case of using a single layer of selenium.

In the photoelectric conversion element 21 using a selenium-based material, for example, the photoelectric conversion layer 261 can be provided between a light-transmitting conductor 262 and the electrode 266 formed using a metal material or the like. Furthermore, CIS and CIGS are p-type semiconductors, and an n-type semiconductor such as cadmium sulfide or zinc sulfide may be provided in contact with the p-type semiconductor in order to form a junction.

Figure 15D:
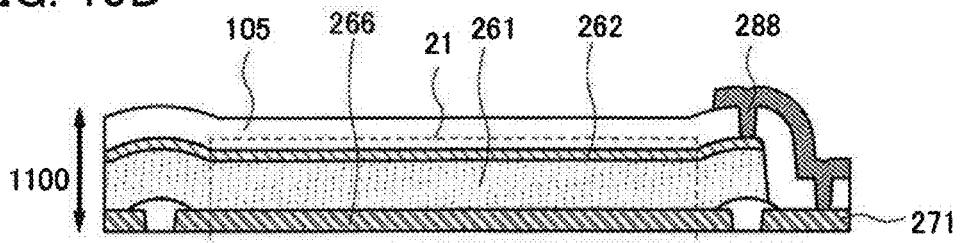
Figure 15E:
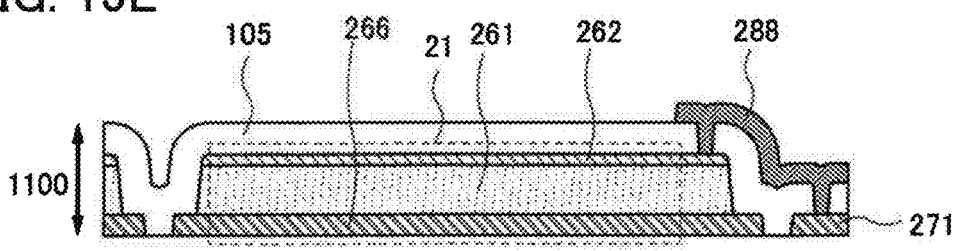
Figure 16A:
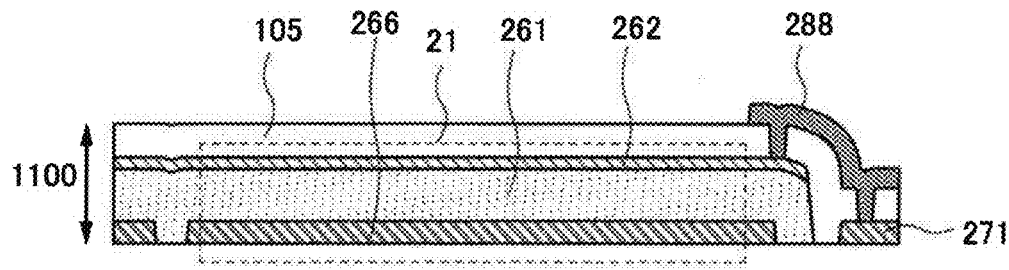
FIGS. 16A to 16D are cross-sectional views each illustrating an imaging device.
Figure 16B:
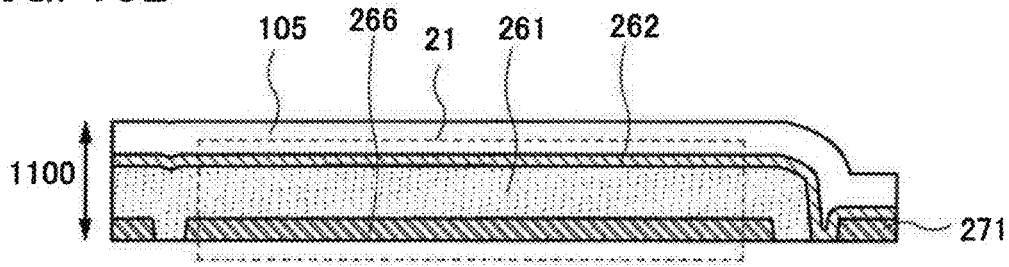

Although the light-transmitting conductor 262 is directly in contact with a wiring 271 in FIG. 14, they may be in contact with each other through a wiring 288 as illustrated in FIG. 15D. Although the photoelectric conversion layer 261 and the light-transmitting conductor 262 are not divided between pixel circuits in FIG. 14, they may be divided between circuits as illustrated in FIG. 15E. In a region between pixels where the electrode 266 is not provided, a partition wall 267 formed of an insulator is preferably provided, thereby preventing generation of a crack in the photoelectric conversion layer 261 and the light-transmitting conductor 262. However, the partition wall 267 is not necessarily provided as illustrated in FIGS. 16A and 16B.

Figure 16C:
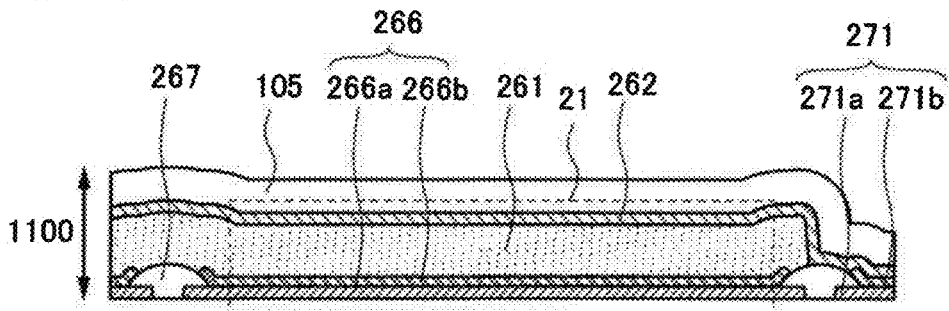

The electrode 266, the wiring 271, and the like may be a multilayer. For example, as illustrated in FIG. 16C, the electrode 266 can include two conductors 266a and 266b and the wiring 271 can include two conductors 271a and 271b. In the structure in FIG. 16C, it is preferred that, for example, the conductors 266a and 271a be made of a low-resistance metal or the like, and the conductors 266b and 271b be made of a metal or the like that exhibits an excellent contact property with the photoelectric conversion layer 261. Such a structure improves the electrical properties of the photoelectric conversion element 21. Note that some kinds of metal may cause electrochemical corrosion by being in contact with the light-transmitting conductor 262; even when such a metal is used for the conductor 271a, electrochemical corrosion can be prevented by the conductor 271b.

The conductors 266b and 271b can be formed using molybdenum or tungsten, for example. The conductors 266a and 271a can be formed using, for example, aluminum, titanium, or a stack of titanium, aluminum, and titanium that are stacked in this order.

Figure 16D:
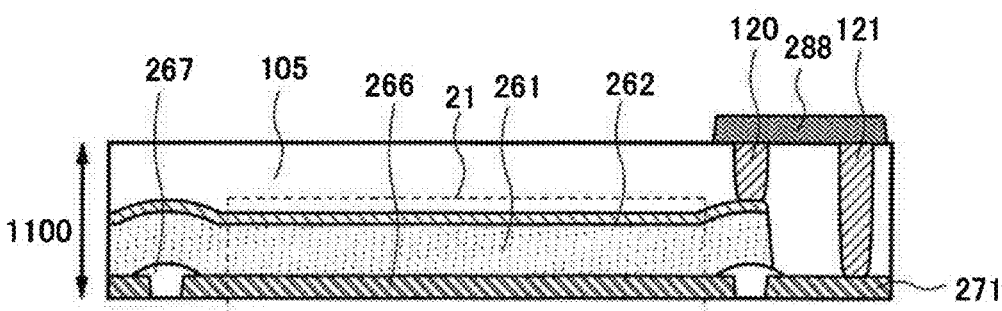

As illustrated in FIG. 16D, the light-transmitting conductor 262 may be connected to the wiring 271 through the conductor 120, the conductor 121, and the wiring 288.

The partition wall 267 can be formed using an inorganic insulator, an insulating organic resin, or the like. The partition wall 267 may be colored black or the like in order to shield the transistors and the like from light and/or to determine the area of a light-receiving portion in each pixel.

Figure 17:
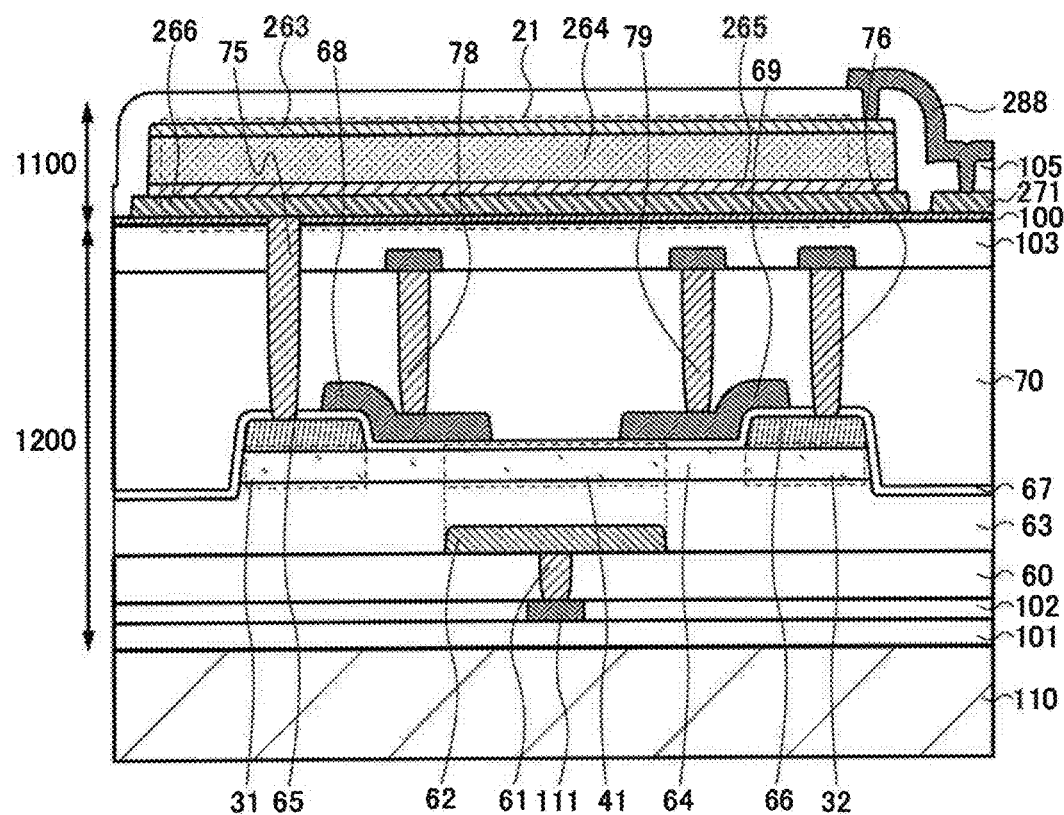
FIG. 17 is a cross-sectional view illustrating an imaging device.

Alternatively, the pixel 10 can employ a stacked structure illustrated in FIG. 17. The pixel 10 in FIG. 17 is different from the pixel 10 in FIG. 14 only in the structure of the layer 1100; the other structures are the same.

In FIG. 17, the photoelectric conversion element 21 included in the layer 1100 is a PIN photodiode using amorphous silicon, microcrystalline silicon, or the like for a photoelectric conversion layer. The photoelectric conversion element 21 can include an n-type semiconductor 265, an i-type semiconductor 264, a p-type semiconductor 263, the electrode 266, the wiring 271, and the wiring 288.

The i-type semiconductor 264 is preferably formed using amorphous silicon. The p-type semiconductor 263 and the n-type semiconductor 265 can each be formed using amorphous silicon, microcrystalline silicon, or the like that includes a dopant imparting the corresponding conductivity type. A photodiode in which a photoelectric conversion layer is formed using amorphous silicon has high sensitivity in a visible light wavelength region, and thus can easily sense weak visible light.

Figure 18A:
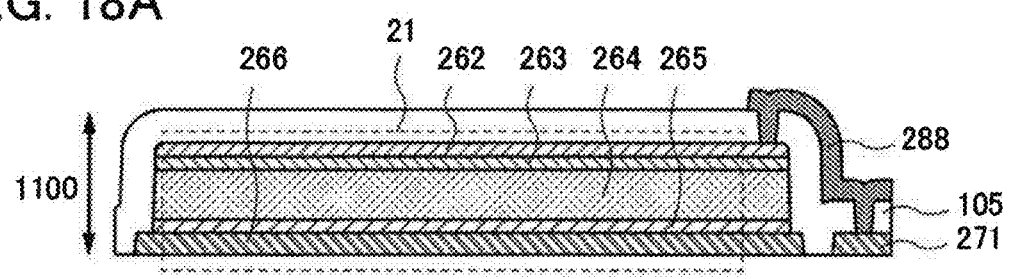
FIGS. 18A to 18C are cross-sectional views each illustrating an imaging device.
Figure 18B:
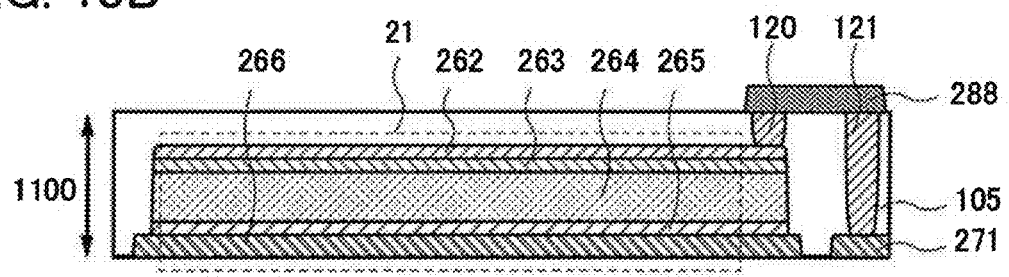
Figure 18C:
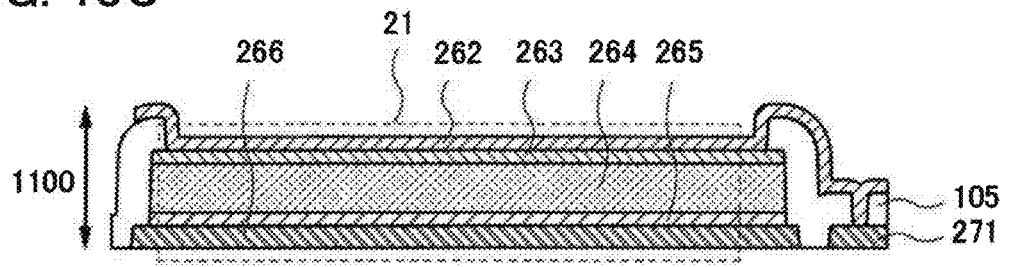

FIGS. 18A to 18C show other examples of the structure of the photoelectric conversion element 21 having a structure of a PIN thin film photodiode and the connection between the photoelectric conversion element 21 and the wirings. Note that the structure of the photoelectric conversion element 21 and the connection between the photoelectric conversion element 21 and the wirings are not limited thereto, and other structures may be employed.

In FIG. 18A, the photoelectric conversion element 21 includes the light-transmitting conductor 262 in contact with the p-type semiconductor 263. The light-transmitting conductor 262 serves as an electrode and can increase the output current of the photoelectric conversion element 21.

The light-transmitting conductor 262 can be formed using, for example, indium tin oxide, indium tin oxide containing silicon, indium oxide containing zinc, zinc oxide, zinc oxide containing gallium, zinc oxide containing aluminum, tin oxide, tin oxide containing fluorine, tin oxide containing antimony, graphene, or graphene oxide. The light-transmitting conductor 262 is not limited to a single layer and may be a stack of different films.

In FIG. 18B, the light-transmitting conductor 262 and the wiring 271 are connected to each other through the conductor 120, the conductor 121, and the wiring 288. Note that the p-type semiconductor 263 of the photoelectric conversion element 21 and the wiring 271 can be connected to each other through the conductor 120, the conductor 121, and the wiring 288. In the structure of FIG. 18B, the light-transmitting conductor 262 is not necessarily provided.

In FIG. 18C, an opening that exposes the p-type semiconductor 263 is provided in an insulator 105 covering the photoelectric conversion element 21, and the light-transmitting conductor 262 covering the opening is electrically connected to the wiring 271.

The photoelectric conversion element 21 containing the selenium-based material, amorphous silicon, or the like can be manufactured through general semiconductor manufacturing processes such as a deposition process, a lithography process, and an etching process. Thus, the photoelectric conversion element 21 can be manufactured with a high yield at low cost.

Figure 19:
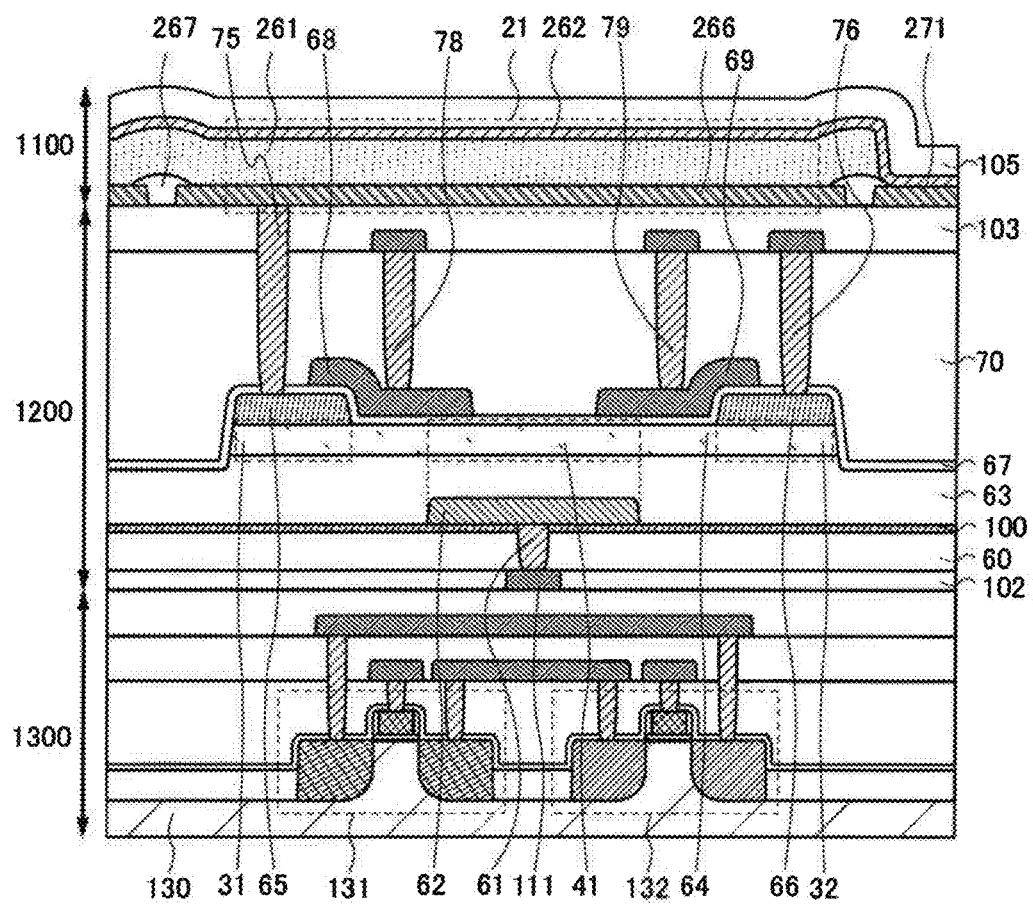
FIG. 19 is a cross-sectional view illustrating an imaging device.

The imaging device of one embodiment of the present invention can employ a stacked structure illustrated in FIG. 19. In FIG. 19, the layer 1200 and the layer 1100 are provided over a layer 1300. In the layer 1300, the row driver circuit 12, the CDS circuit 13, the A/D converter circuit 14, and the column driver circuit 15 illustrated in FIG. 6A can be provided, for example.

FIG. 19 illustrates an example of a structure in which the layer 1300 includes a silicon substrate 130 and the silicon substrate 130 is provided with a transistor 131 and a transistor 132. That is, the transistors 131 and 132 are Si transistors. In FIG. 19, a CMOS switch constituted by an n-channel transistor 131 and a p-channel transistor 132 is shown as an example of a circuit formed on the silicon substrate 130.

Figure 20A:
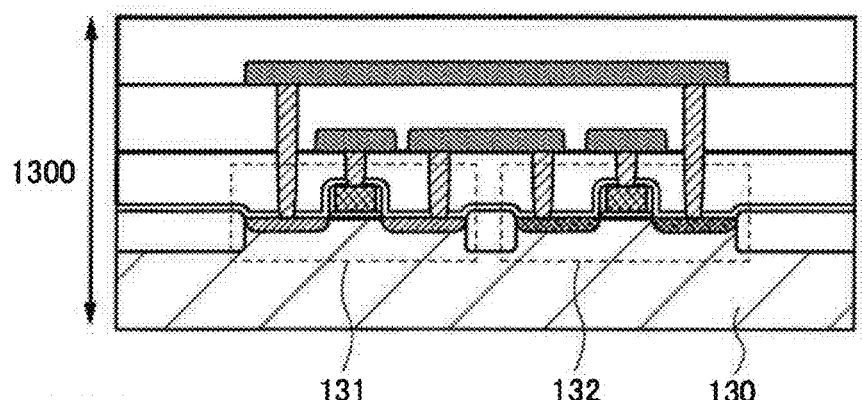
FIGS. 20A and 20B are cross-sectional views each illustrating an imaging device.
Figure 20B:
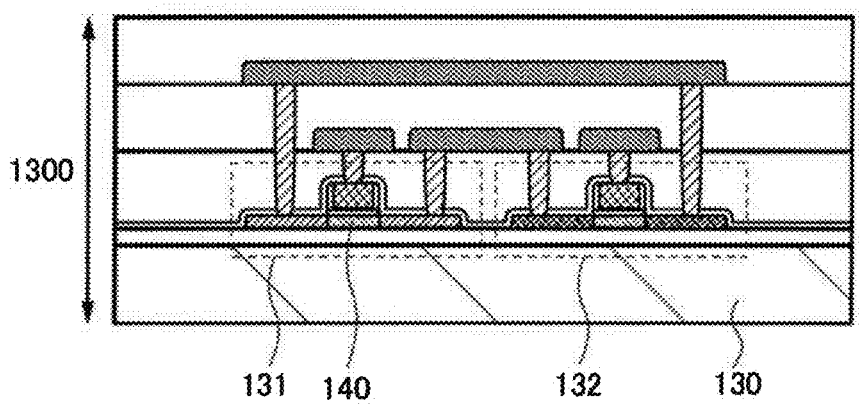

Although FIG. 19 illustrates an example of FIN-type transistors 131 and 132 provided on the silicon substrate 130, the transistors 131 and 132 may be planar transistors as illustrated in FIG. 20A. Alternatively, transistors each including an active layer 140 of a silicon thin film may be used as illustrated in FIG. 20B. The active layer 140 can be polycrystalline silicon or single crystal silicon of a silicon-on-insulator (SOI) structure.

FIG. 19 illustrates the structure obtained by adding the layer 1300 to the structure shown in FIG. 14. It is also possible to add the layer 1300 to the structure shown in FIG. 17, for example.

Figure 21:
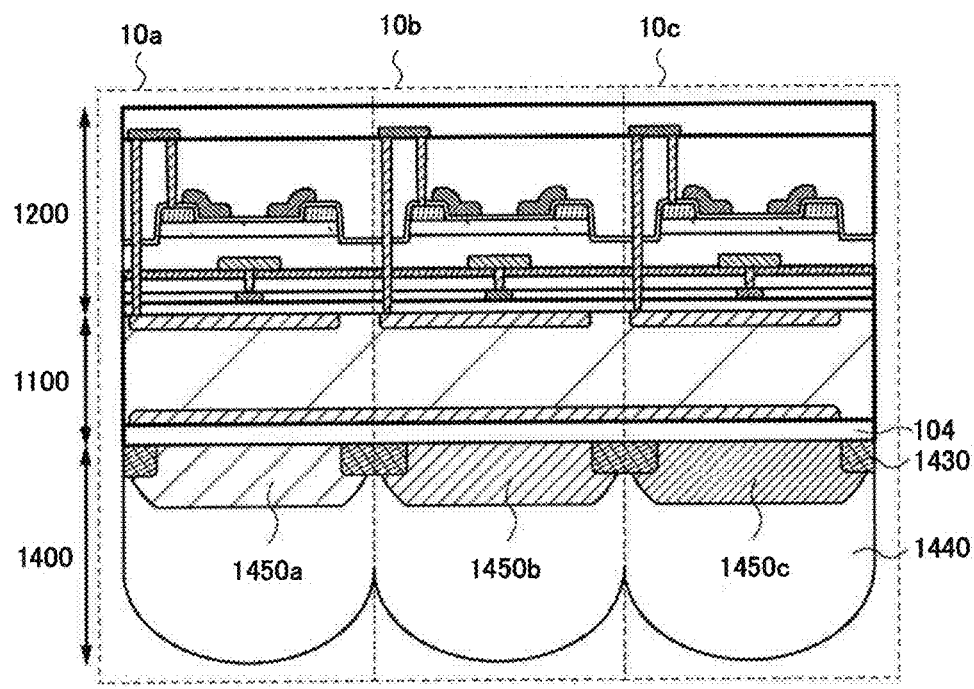
FIG. 21 is a cross-sectional view illustrating an imaging device.

FIG. 21 is a cross-sectional view of a structure obtained by adding a layer 1400 to the structure shown in FIG. 12, and illustrates three pixels (pixels 10a, 10b, and 10c). Note that the pixels 10a to 10c can have the same structure as the pixel 10.

In the layer 1400, a light-blocking layer 1430, optical conversion layers 1450a, 1450b, and 1450c, a microlens array 1440, and the like can be provided.

The insulator 104 is formed in a region in contact with the layer 1100. As the insulator 104, a silicon oxide film with a high visible-light transmitting property can be used, for example. In addition, a silicon nitride film may be stacked as a passivation film. A dielectric film of hafnium oxide or the like may be stacked as an anti-reflection film.

The light-blocking layer 1430 can be provided to be in contact with the insulator 104. The light-blocking layer 1430 is provided at a boundary between adjacent pixels and has a function of blocking stray light that enters from oblique directions. The light-blocking layer 1430 can be formed of a metal layer of aluminum, tungsten, or the like, or a stack including the metal layer and a dielectric film functioning as an anti-reflection film.

The optical conversion layers 1450a to 1450c can be provided to be in contact with the insulator 104 and the light-blocking layer 1430. Color images are obtained, for example, when color filters of red (R), green (G), blue (B), yellow (Y), cyan (C), magenta (M), and/or the like are assigned to the optical conversion layers 1450a to 1450c.

Note that when a filter that blocks light with a wavelength shorter than or equal to that of visible light is used as the optical conversion layer, an infrared imaging device is obtained. When a filter that blocks light with a wavelength shorter than or equal to that of near infrared light is used as the optical conversion layer, a far-infrared imaging device is obtained. When a filter that blocks light with a wavelength longer than or equal to that of visible light is used as the optical conversion layer, an ultraviolet imaging device is obtained.

When a scintillator is used as the optical conversion layer, it is possible to obtain an imaging device that takes an image visualizing the intensity of radiation and is used for an X-ray imaging device or the like. Radiations such as X-rays that pass through an object to enter a scintillator are converted into light (fluorescence) such as visible light or ultraviolet light owing to photoluminescence. Then, the photoelectric conversion element 21 detects the light to obtain image data. Moreover, the imaging device having the above structure may be used in a radiation detector or the like.

A scintillator contains a substance that, when irradiated with radiation such as X-rays or gamma rays, absorbs energy of the radiation to emit visible light or ultraviolet light. For example, it is possible to use a resin or ceramics in which any of $Gd_2O_2S$:Tb, $Gd_2O_2S$:Pr, $Gd_2O_2S$:Eu, BaFCl:Eu, NaI, CsI, $CaF_2$, $BaF_2$, $CeF_3$, LiF, LiI, and ZnO is dispersed.

The microlens array 1440 can be provided on the optical conversion layers 1450a to 1450c. Light that passes through lenses of the microlens array 1440 passes the optical conversion layers 1450a to 1450c that are placed directly on the microlens array 1440, and is applied to the photoelectric conversion element 21.

In Embodiment 1, one embodiment of the present invention has been described. Other embodiments of the present invention are described in Embodiments 2 to 7. Note that one embodiment of the present invention is not limited to these embodiments. In other words, various embodiments of the invention are described in this embodiment and Embodiments 2 to 7, and one embodiment of the present invention is not limited to a particular embodiment. Although an example in which one embodiment of the present invention is applied to an imaging device is described, one embodiment of the present invention is not limited thereto. Depending on circumstances or conditions, one embodiment of the present invention is not necessarily applied to an imaging device. One embodiment of the present invention may be applied to a semiconductor device with another function, for example.

This embodiment can be implemented in appropriate combination with any of the structures described in the other embodiments.

Embodiment 2

In this embodiment, an OS transistor that can be used in one embodiment of the present invention will be described with reference to drawings. In the drawings in this embodiment, some components are enlarged, reduced in size, or omitted for easy understanding.

Figure 22A:
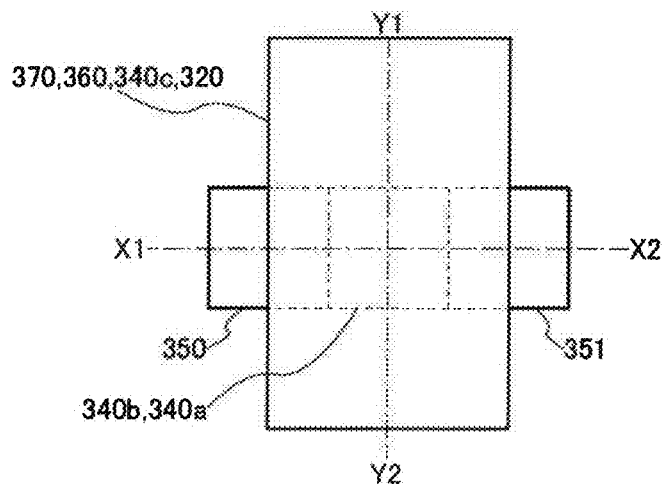
FIGS. 22A to 22C are a top view and cross-sectional views illustrating a transistor.
Figure 22B:
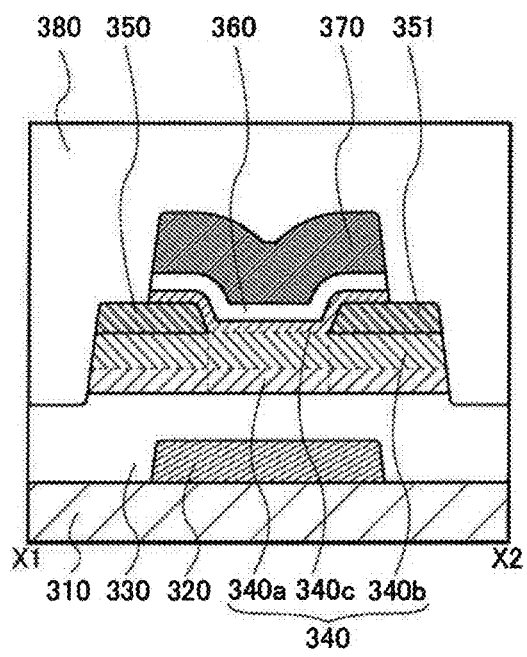
Figure 22C:
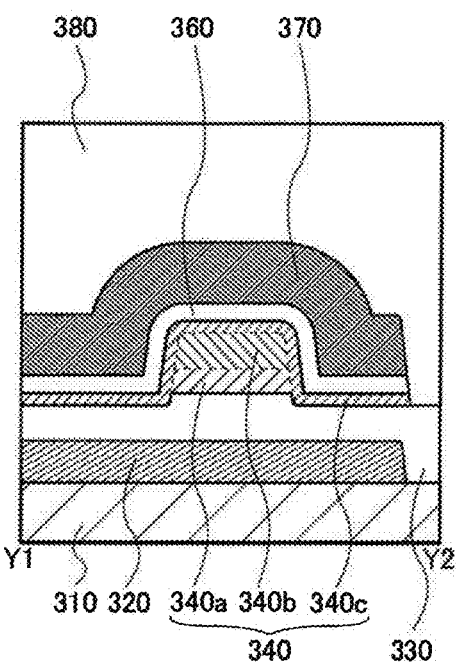

FIGS. 22A to 22C are a top view and cross-sectional views of a transistor 301 of one embodiment of the present invention. FIG. 22A is the top view. FIG. 22B shows a cross section along the dashed-dotted line X1-X2 in FIG. 22A. FIG. 22C shows a cross section along the dashed-dotted line Y1-Y2 in FIG. 22A.

In the drawings explained in this embodiment, the direction of the dashed-dotted line X1-X2 is referred to as channel length direction, and the direction of the dashed-dotted line Y1-Y2 is referred to as channel width direction.

The transistor 301 includes a conductor 320 in contact with the substrate 310, an insulator 330 in contact with the substrate 310 and the conductor 320, an oxide semiconductor 340 in contact with the insulator 330, conductors 350 and 351 in contact with the oxide semiconductor 340, an insulator 360 in contact with the oxide semiconductor 340, and a conductor 370 in contact with the insulator 360.

Over the transistor 301, an insulator 380 in contact with the insulator 330, the oxide semiconductor 340, the conductor 350, the conductor 351, the insulator 360, and the conductor 370 may be provided as necessary.

The oxide semiconductor 340 can have a three-layer structure of oxide semiconductors 340a, 340b, and 340c, for example.

The conductor 350 functions as one of a source electrode and a drain electrode. The conductor 351 functions as the other of the source electrode and the drain electrode. The insulator 360 functions as a gate insulator. The conductor 370 functions as a gate electrode.

Using the conductor 320 as a second gate electrode (backgate) enables the increase in on-state current and control of the threshold voltage. Note that the conductor 320 can also serve as a light-blocking layer.

In order to increase the on-state current, for example, the conductors 370 and 320 are made to have the same potential, and the transistor is driven as a double-gate transistor. Furthermore, in order to control the threshold voltage, a fixed potential that is different from the potential of the conductor 370 is supplied to the conductor 320.

In the oxide semiconductor 340, a region in contact with the conductor 350 function as one of a source region and a drain region, and a region in contact with the conductor 351 function as the other of the source region and the drain region.

Since the oxide semiconductor 340 is in contact with the conductors 350 and 351, an oxygen vacancy is generated in the oxide semiconductor 340, and the regions become n-type low-resistance regions owing to interaction between the oxygen vacancy and hydrogen that remains in the oxide semiconductor 340 or diffuses into the oxide semiconductor 340 from the outside.

The conductors 350 and 351 are in contact with a top surface of the oxide semiconductor 340 and are not in contact with side surfaces of the oxide semiconductor 340. This structure facilitates compensation for oxygen vacancies in the oxide semiconductor 340 with oxygen included in the insulator 330.

Figure 23A:
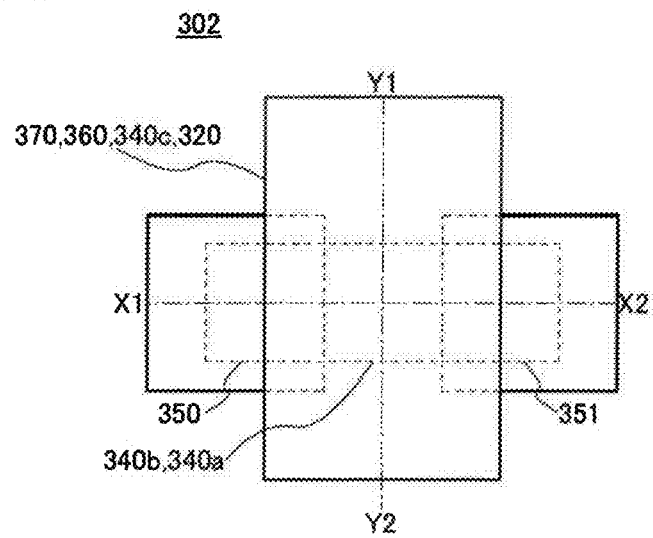
FIGS. 23A to 23C are a top view and cross-sectional views illustrating a transistor.
Figure 23B:
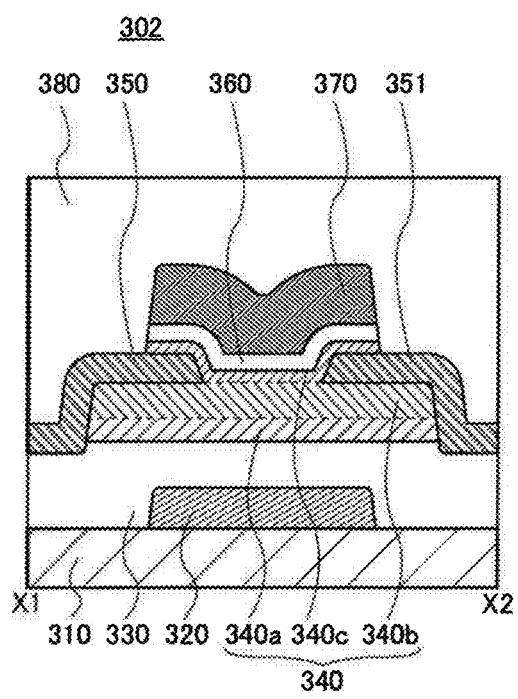
Figure 23C:
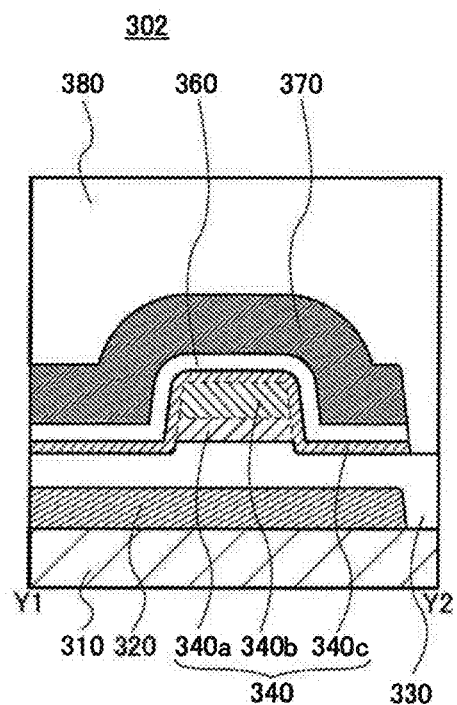

The transistor in one embodiment of the present invention may have a structure illustrated in FIGS. 23A to 23C. FIG. 23A is a top view of a transistor 302. FIG. 23B shows a cross section along the dashed-dotted line X1-X2 in FIG. 23A. FIG. 23C shows a cross section along the dashed-dotted line Y1-Y2 in FIG. 23A.

The transistor 302 has the same structure as the transistor 301 except that the conductors 350 and 351 are in contact with the insulator 330, and that the conductors 350 and 351 are in contact with a side surface of the oxide semiconductor 340.

Figure 24A:
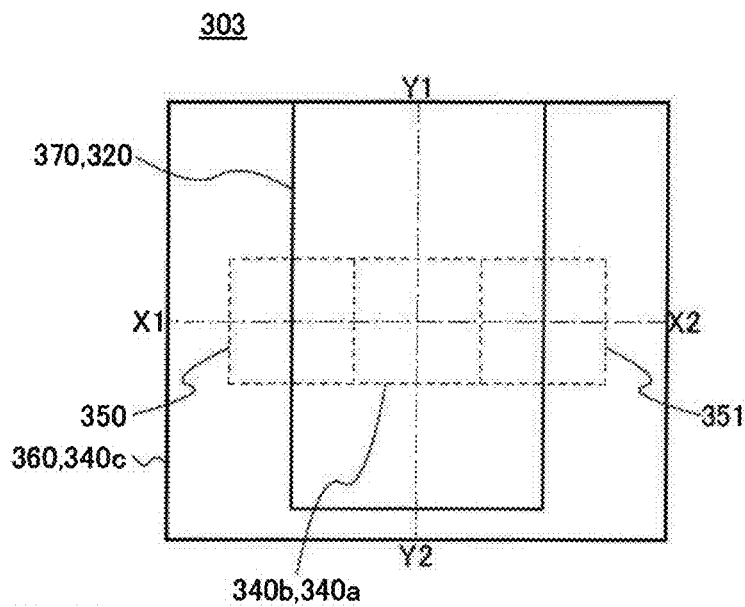
FIGS. 24A to 24C are a top view and cross-sectional views illustrating a transistor.
Figures 24B, 24C:
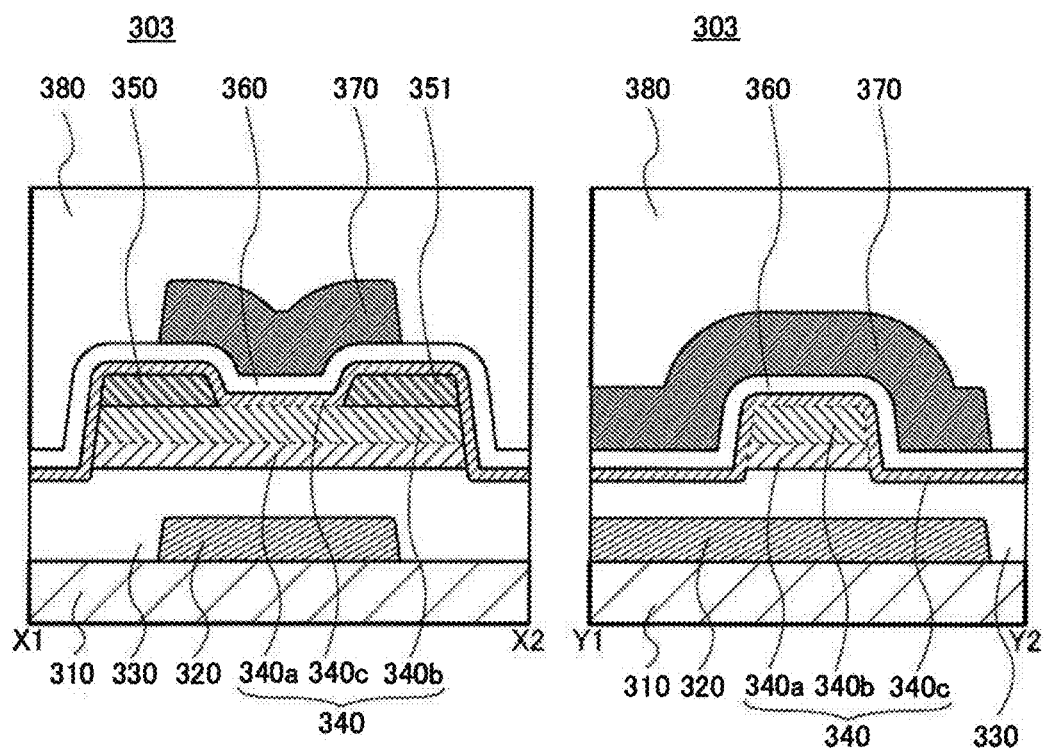

The transistor in one embodiment of the present invention may have a structure illustrated in FIGS. 24A to 24C. FIG. 24A is a top view of a transistor 303. FIG. 24B shows a cross section along the dashed-dotted line X1-X2 in FIG. 24A. FIG. 24C shows a cross section along the dashed-dotted line Y1-Y2 in FIG. 24A.

The transistor 303 has the same structure as the transistor 301 except that the oxide semiconductor 340a, the oxide semiconductor 340b, the conductor 350, and the conductor 351 are covered with the oxide semiconductor 340c and the insulator 360.

When the oxide semiconductor 340c covers the oxide semiconductors 340a and 340b, the effect of compensating for oxygen to the oxide semiconductors 340a and 340b and the insulator 330 can be enhanced. Moreover, oxidation of the conductors 350 and 351 by the insulator 380 can be suppressed with the oxide semiconductor 340c placed therebetween.

Figure 25A:
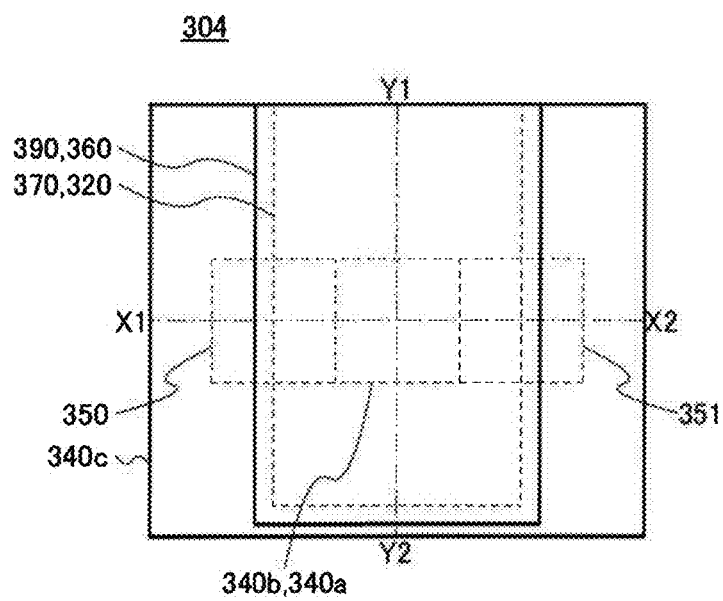
FIGS. 25A to 25C are a top view and cross-sectional views illustrating a transistor.
Figure 25B:
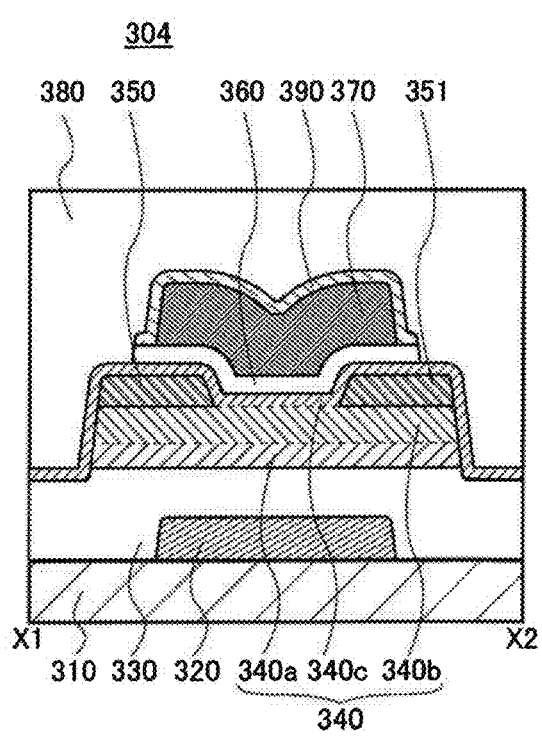
Figure 25C:
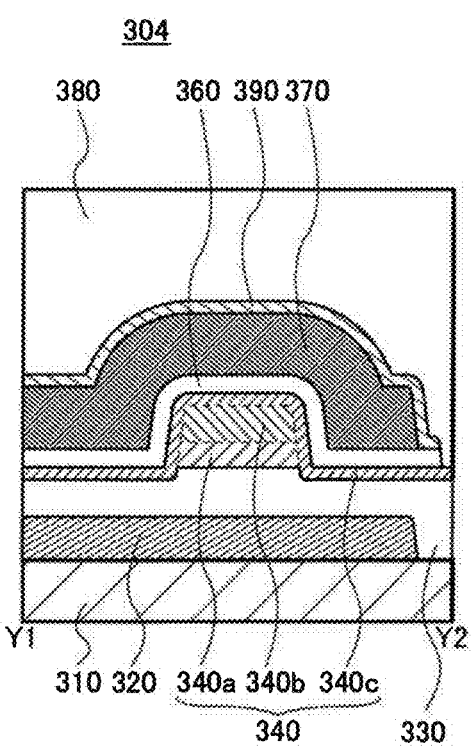

The transistor in one embodiment of the present invention may have a structure illustrated in FIGS. 25A to 25C. FIG. 25A is a top view of a transistor 304. FIG. 25B shows a cross section along the dashed-dotted line X1-X2 in FIG. 25A. FIG. 25C shows a cross section along the dashed-dotted line Y1-Y2 in FIG. 25A.

The transistor 304 has the same structure as the transistor 301 except that the oxide semiconductor 340a, the oxide semiconductor 340b, the conductor 350, and the conductor 351 are covered with the oxide semiconductor 340c, and that the conductor 370 is covered with an insulator 390.

The insulator 390 can be formed using a material with a blocking property against oxygen, for example, metal oxide such as aluminum oxide. Oxidation of the conductor 370 by the insulator 380 can be suppressed with the insulator 390 placed therebetween.

The transistors 301 to 304 have a top-gate structure including a region where the conductor 370 overlaps the conductors 350 and 351. To reduce parasitic capacitance, the width of the region in the channel length direction is preferably greater than or equal to 3 nm and less than 300 nm. Since an offset region is not formed in the oxide semiconductor 340 in this structure, a transistor with a high on-state current can be easily formed.

Figure 26A:
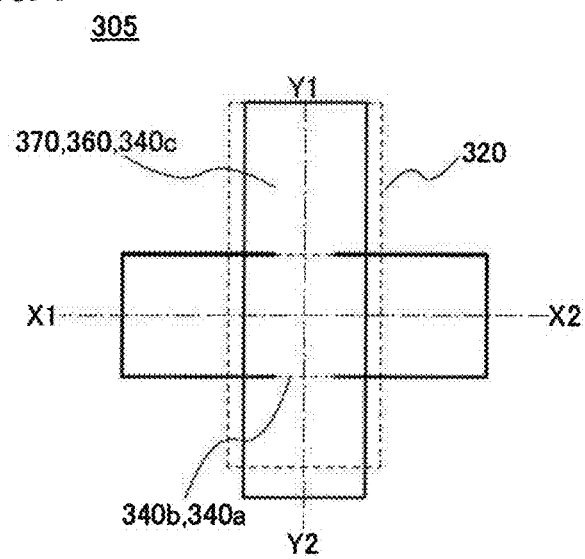
FIGS. 26A to 26C are a top view and cross-sectional views illustrating a transistor.
Figure 26B:
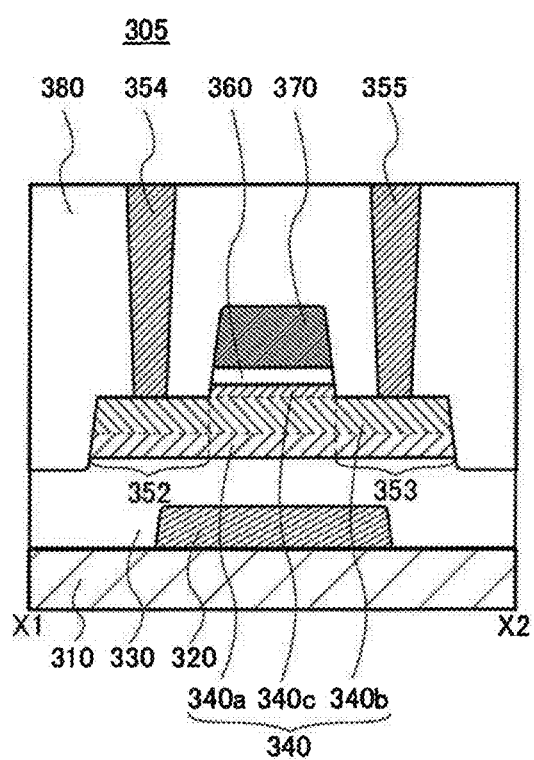
Figure 26C:
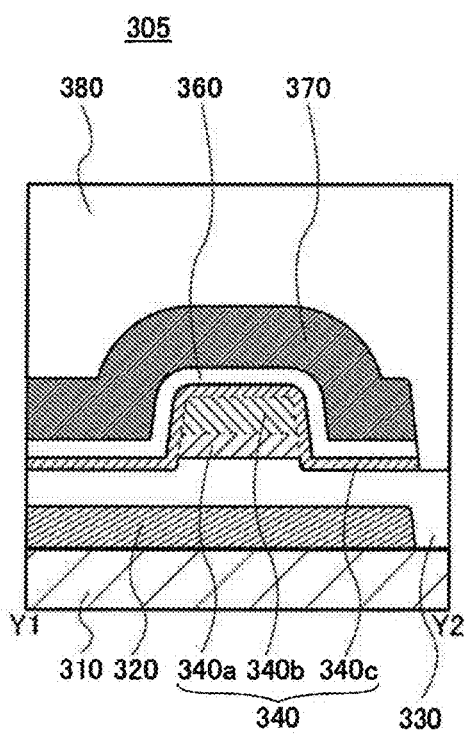

The transistor in one embodiment of the present invention may have a structure illustrated in FIGS. 26A to 26C. FIG. 26A is a top view of a transistor 305. FIG. 26B shows a cross section along the dashed-dotted line X1-X2 in FIG. 26A. FIG. 26C shows a cross section along the dashed-dotted line Y1-Y2 in FIG. 26A.

The transistor 305 includes the conductor 320 in contact with the substrate 310, the insulator 330 in contact with the substrate 310 and the conductor 320, the oxide semiconductor 340 in contact with the insulator 330, the insulator 360 in contact with the oxide semiconductor 340, and the conductor 370 in contact with the insulator 360.

In the insulator 380 serving as an interlayer insulating film, a conductor 354 in contact with a region 352 of the oxide semiconductor 340 and a conductor 355 in contact with a region 353 of the oxide semiconductor 340 are provided. The conductor 354 functions as one of part of the source electrode and part of the drain electrode. The conductor 355 functions as the other of part of the source electrode and part of the drain electrode.

An impurity for forming an oxygen vacancy to increase conductivity is preferably added to the regions 352 and 353 in the transistor 305. As an impurity for forming an oxygen vacancy in an oxide semiconductor, one or more of the following can be used, for example: phosphorus, arsenic, antimony, boron, aluminum, silicon, nitrogen, helium, neon, argon, krypton, xenon, indium, fluorine, chlorine, titanium, zinc, and carbon. As a method for adding the impurity, plasma treatment, ion implantation, ion doping, plasma immersion ion implantation, or the like can be used.

When the above element is added as an impurity element to the oxide semiconductor, a bond between a metal element and oxygen in the oxide semiconductor is cut, so that an oxygen vacancy is formed. Interaction between an oxygen vacancy in the oxide semiconductor and hydrogen that remains in the oxide semiconductor or is added to the oxide semiconductor later can increase the conductivity of the oxide semiconductor.

When hydrogen is added to an oxide semiconductor in which an oxygen vacancy is formed by addition of an impurity element, hydrogen enters an oxygen vacant site and forms a donor level in the vicinity of the conduction band. Consequently, an oxide conductor can be formed. Here, an oxide conductor refers to an oxide semiconductor that has become a conductor.

The transistor 305 has a self-aligned structure that does not include a region where the conductor 370 serving as the gate electrode overlaps the source electrode and the drain electrode. A transistor with a self-aligned structure, which has extremely low parasitic capacitance between a gate electrode and source and drain electrodes, is suitable for applications that require high-speed operation.

Figure 27A:
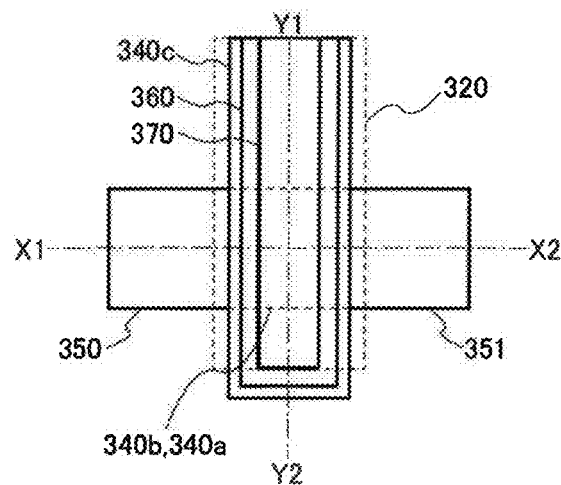
FIGS. 27A to 27C are a top view and cross-sectional views illustrating a transistor.
Figure 27B:
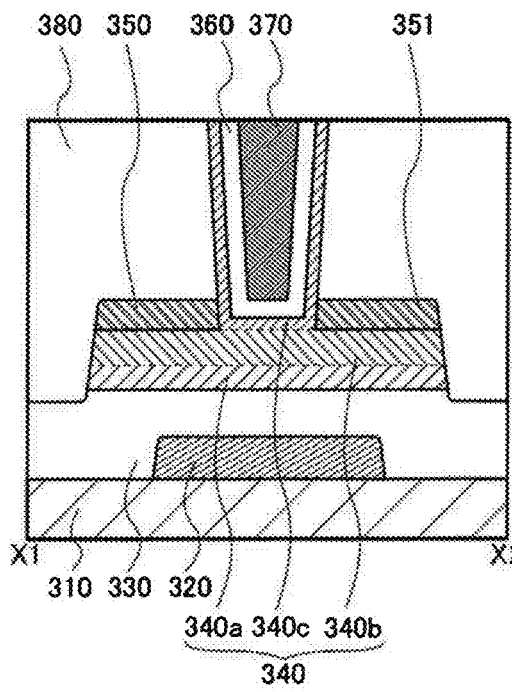
Figure 27C:
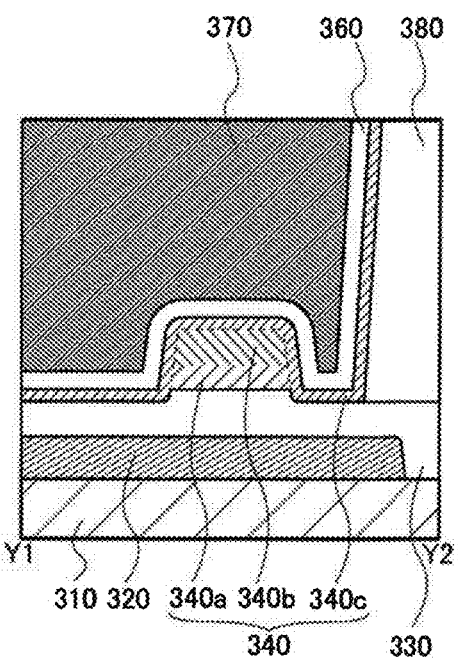

The transistor in one embodiment of the present invention may have a structure illustrated in FIGS. 27A to 27C. FIG. 27A is a top view of a transistor 306. FIG. 27B shows a cross section along the dashed-dotted line X1-X2 in FIG. 27A. FIG. 27C shows a cross section along the dashed-dotted line Y1-Y2 in FIG. 27A.

The transistor 306 includes the substrate 310, the conductor 320 in contact with the substrate 310, the insulator 330 in contact with the substrate 310 and the conductor 320, the oxide semiconductor 340 (the oxide semiconductors 340a, 340b, and 340c) in contact with the insulator 330, the conductor 350 and the conductor 351 that are in contact with the oxide semiconductor 340 and are apart from each other, the insulator 360 in contact with the oxide semiconductor 340c, and the conductor 370 in contact with the insulator 360.

Note that the oxide semiconductor 340c, the insulator 360, and the conductor 370 are provided in an opening that is provided in the insulator 380 over the transistor 306 and reaches the oxide semiconductor 340b.

Figure 28A:
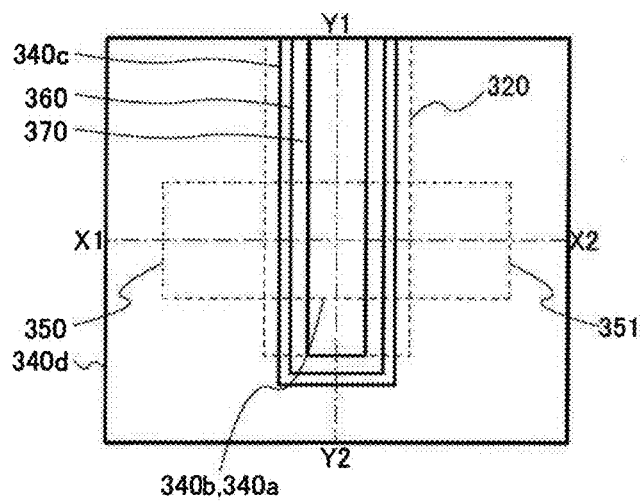
FIGS. 28A to 28C are a top view and cross-sectional views illustrating a transistor.
Figure 28B:
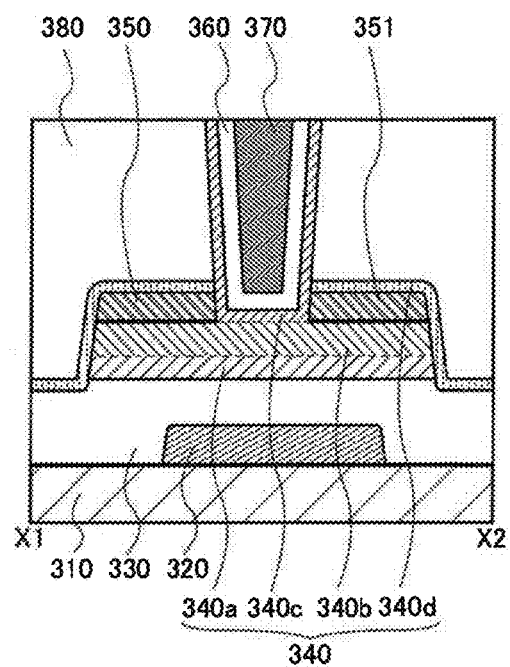
Figure 28C:
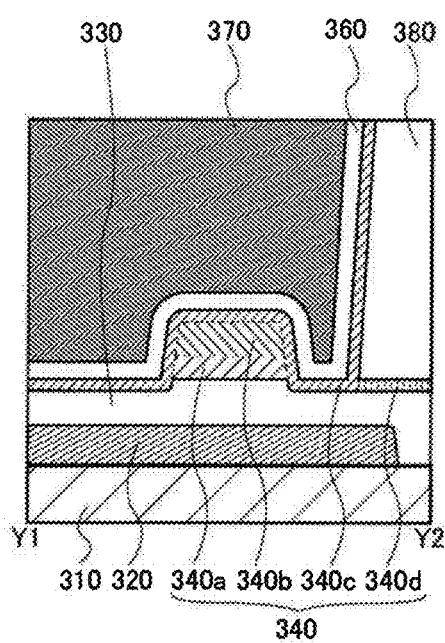

The transistor in one embodiment of the present invention may have a structure illustrated in FIGS. 28A to 28C. FIG. 28A is a top view of a transistor 307. FIG. 28B shows a cross section along the dashed-dotted line X1-X2 in FIG. 28A. FIG. 28C shows a cross section along the dashed-dotted line Y1-Y2 in FIG. 28A.

The transistor 307 has the same structure as the transistor 306 except that the oxide semiconductor 340a, the oxide semiconductor 340b, the conductor 350, and the conductor 351 are covered with an oxide semiconductor 340d. The oxide semiconductor 340d can be formed using the same material as the oxide semiconductor 340c.

When the oxide semiconductor 340d covers the oxide semiconductors 340a and 340b, the effect of compensating for oxygen to the oxide semiconductors 340a and 340b and the insulator 330 can be enhanced. Moreover, oxidation of the conductors 350 and 351 by the insulator 380 can be suppressed with the oxide semiconductor 340d placed therebetween.

The transistors 306 and 307 have a smaller region in which the conductor serving as the gate electrode overlaps the conductor serving as the source or the drain than the other transistors described above; thus, parasitic capacitance in the transistors 306 and 307 can be reduced. Consequently, the transistors 306 and 307 are suitable for components of a circuit that requires high-speed operation.

Figure 29A:
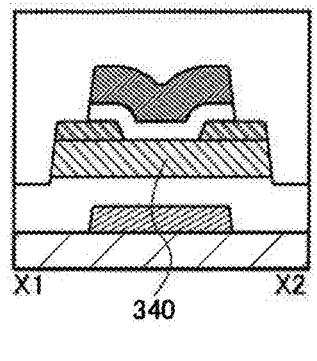
FIGS. 29A to 29H are cross-sectional views and top views each illustrating a transistor.
Figure 29B:
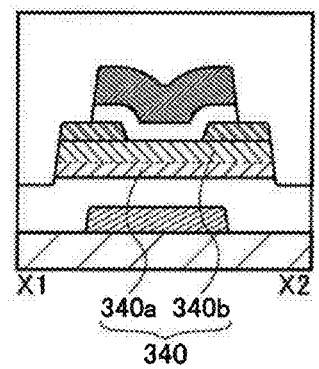

In the transistor of one embodiment of the present invention, the oxide semiconductor 340 may be a single layer as illustrated in FIG. 29A, or may be formed of two layers as illustrated in FIG. 29B.

Figure 29C:
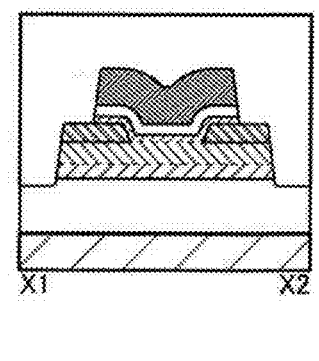

The transistor of one embodiment of the present invention may be configured not to include the conductor 320 as illustrated in FIG. 29C.

Figure 29D:
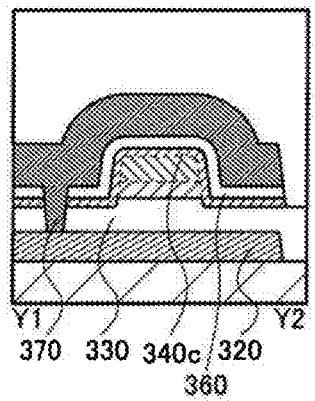

To electrically connect the conductor 370 to the conductor 320 in the transistor of one embodiment of the present invention, for example, an opening is formed in the insulator 330, the oxide semiconductor 340c, and the insulator 360 to reach the conductor 320, and the conductor 370 is formed to cover the opening as illustrated in FIG. 29D.

Figure 29E:
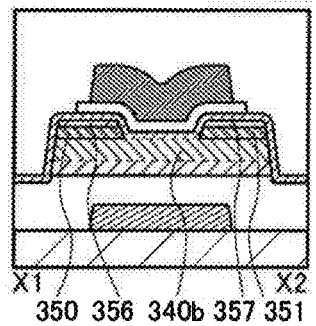

The transistor of one embodiment of the present invention may be provided with an insulator 356 and an insulator 357 that are in contact with the conductor 350 and the conductor 351, respectively, as illustrated in FIG. 29E. The insulators 356 and 357 can prevent oxidation of the conductors 350 and 351.

The insulators 356 and 357 can be formed using a material with a blocking property against oxygen, for example, metal oxide such as aluminum oxide.

Figure 29F:
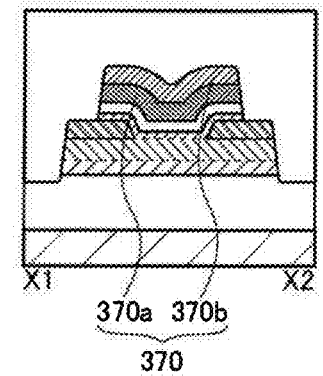

In the transistor of one embodiment of the present invention, the conductor 370 may be a stack including a conductor 370a and a conductor 370b, as illustrated in FIG. 29F.

Figure 29G:
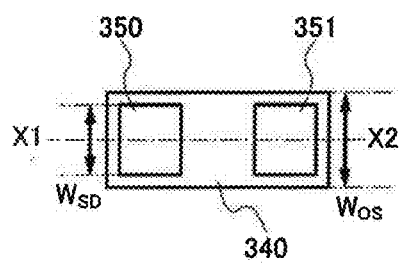
Figure 29H:
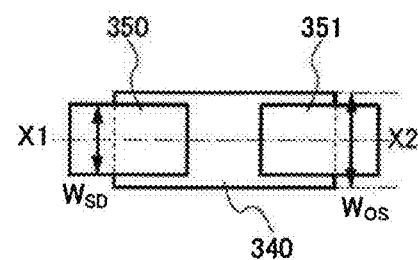

In the transistor of one embodiment of the present invention, in which the conductors 350 and 351 are provided over the oxide semiconductor 340, the width ($W_{SD}$) of the conductors 350 and 351 may be smaller than the width ($W_{OS}$) of the oxide semiconductor 340 as shown in top views of FIGS. 29G and 29H (that only show the oxide semiconductor 340 and the conductors 350 and 351). When $W_{OS} \geq W_{SD}$ is satisfied ($W_{SD}$ is smaller than or equal to $W_{OS}$), a gate electric field is easily applied to the entire channel formation region, so that electrical characteristics of the transistor can be improved.

FIGS. 29A to 29H illustrate variation examples of the transistor 301; these examples can also be applied to the other transistors described in this embodiment.

In the transistor with any of the above structures in one embodiment of the present invention, the conductor 370 (and the conductor 320) serving as the gate electrode electrically surrounds the oxide semiconductor 340 in the channel width direction with the insulator therebetween. Such a structure can increase the on-state current and is referred to as a surrounded channel (s-channel) structure.

In the transistor including the oxide semiconductors 340a and 340b and the transistor including the oxide semiconductors 340a to 340c, selecting appropriate materials for the two or three layers forming the oxide semiconductor 340 allows current to flow in the oxide semiconductor 340b. Since current flows through the oxide semiconductor 340b, the current is hardly influenced by interface scattering, leading to high on-state current.

A semiconductor device including the transistor with any of the above structures can have favorable electrical characteristics.

The structure described in this embodiment can be used in appropriate combination with the structure described in any of the other embodiments.

Embodiment 3

In this embodiment, components of the transistors shown in Embodiment 2 will be described in detail.

As the substrate 310, a glass substrate, a quartz substrate, a semiconductor substrate, a ceramic substrate, a metal substrate with an insulated surface, or the like can be used. Other examples are a silicon substrate provided with a transistor and/or a photodiode; and a silicon substrate over which an insulator, a wiring, a conductor functioning as a contact plug, and the like are provided together with a transistor and/or a photodiode. When a p-channel transistor is formed on a silicon substrate, a silicon substrate with n⁻-type conductivity is preferably used. Alternatively, an SOI substrate including an n⁻-type or i-type silicon layer may be used. Moreover, when a p-channel transistor is formed on a silicon substrate, a surface of the silicon substrate where the transistor is formed preferably has a (110) plane orientation, in which case the mobility can be increased.

As the conductor 320 functioning as a backgate electrode, a conductor such as Al, Ti, Cr, Co, Ni, Cu, Y, Zr, Mo, Ru, Ag, Mn, Nd, Sc, Ta, or W can be used, for example. It is also possible to use an alloy or a conductive nitride of any of the above materials, or a stack including a plurality of materials selected from these materials, alloys of these materials, and conductive nitrides of these materials.

The insulator 330 can have a function of supplying oxygen to the oxide semiconductor 340 as well as a function of preventing diffusion of impurities from a component of the substrate 310. For this reason, the insulator 330 preferably contains oxygen and more preferably has an oxygen content higher than that in the stoichiometric composition. For example, the insulator 330 is a film in which the amount of released oxygen when converted into oxygen atoms is preferably greater than or equal to $3.0 \times 30^{19}$ atoms/cm$^3$ in TDS analysis; in the TDS analysis, heat treatment is performed such that the film surface temperature ranges from 300° C. to 700° C., preferably from 300° C. to 500° C. When the substrate 310 is provided with another device, the insulator 330 also functions as an interlayer insulating film. In that case, the insulator 330 is preferably subjected to planarization treatment such as CMP treatment so as to have a flat surface.

For example, the insulator 330 can be an oxide insulator containing aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulator containing silicon nitride, silicon nitride oxide, aluminum nitride, aluminum nitride oxide, or the like; or a mixed material of any of these. The insulator 330 may be a stack of any of the above materials.

The oxide semiconductor 340 can have a three-layer structure in which the oxide semiconductors 340a, 340b, and 340c are stacked in this order from the insulator 330 side.

Note that when the oxide semiconductor 340 is a single layer, a layer corresponding to the oxide semiconductor 340b described in this embodiment is used.

In the case of employing a two-layer structure, the oxide semiconductor 340 can be a stack in which a layer corresponding to the oxide semiconductor 340a and a layer corresponding to the oxide semiconductor 340b are stacked in this order from the insulator 330 side. In this structure, the positions of the oxide semiconductors 340a and 340b can be interchanged.

For the oxide semiconductor 340b, an oxide semiconductor whose electron affinity (energy difference between the vacuum level and the conduction band minimum) is higher than those of the oxide semiconductors 340a and 340c is used, for example.

In such a structure, when a voltage is applied to the conductor 370, a channel is formed in the oxide semiconductor 340b whose conduction band minimum is the lowest in the oxide semiconductor 340. Therefore, the oxide semiconductor 340b can be regarded as having a region serving as a semiconductor, while the oxide semiconductor 340a and the oxide semiconductor 340c can be regarded as having a region serving as an insulator or a semi-insulator.

An oxide semiconductor that can be used as each of the oxide semiconductors 340a, 340b, and 340c preferably contains at least one of In and Zn, or both In and Zn. In order to reduce variations in electrical characteristics of the transistor including the oxide semiconductor, the oxide semiconductor preferably contains a stabilizer such as Al, Ga, Y, or Sn in addition to In and/or Zn.

For the oxide semiconductors 340a and 340c, In—Ga—Zn oxide with an atomic ratio of In to Ga and Zn (In:Ga:Zn) of 1:3:2, 1:3:3, 1:3:4, 1:3:6, 1:4:5, 1:6:4, or 1:9:6 or close to these ratios can be used, for example. For the oxide semiconductor 340b, In—Ga—Zn oxide with an atomic ratio of In:Ga:Zn of 1:1:1, 2:1:3, 5:5:6, 3:1:2, 3:1:4, 5:1:6, 4:2:3, or 4:2:4.1 or close to these ratios can be used, for example.

The oxide semiconductors 340a, 340b, and 340c may include crystal parts. For example, when crystals with c-axis alignment are used, the transistor can have stable electrical characteristics. Moreover, crystals with c-axis alignment are resistant to bending; thus, using such crystals can improve the reliability of a semiconductor device using a flexible substrate.

The conductor 350 functioning as one of a source electrode and a drain electrode and the conductor 351 functioning as the other of the source electrode and the drain electrode can be formed with a single layer or a stacked layer using a material selected from Al, Cr, Cu, Ta, Ti, Mo, W, Ni, Mn, Nd, and Sc and alloys or conductive nitrides of any of these metal materials, for example. Using tantalum nitride, which is a conductive nitride, can prevent oxidation of the conductors 350 and 351. It is also possible to use a stack of any of the above materials and Cu or an alloy such as Cu—Mn, which has low resistance.

The above materials are capable of extracting oxygen from an oxide semiconductor. Thus, in a region of the oxide semiconductor that is in contact with any of the above materials, oxygen is released from the oxide semiconductor and an oxygen vacancy is formed. Hydrogen slightly contained in the oxide semiconductor and the oxygen vacancy are bonded to each other, so that the region is markedly changed to an n-type region. Accordingly, the n-type region can serve as a source or a drain of the transistor.

The insulator 360 functioning as a gate insulator can be an insulator containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulator 360 may be a stack including any of the above materials.

As the insulators 330 and 360 in contact with the oxide semiconductor 340, an insulator that releases less nitrogen oxide is preferably used. When the oxide semiconductor is in contact with an insulator that releases a large amount of nitrogen oxide, the density of states caused by nitrogen oxide becomes high in some cases.

By using the above oxide insulating film as the insulators 330 and 360, a shift in the threshold voltage of the transistor can be reduced, which leads to reduced fluctuations in the electrical characteristics of the transistor.

As the conductor 370 functioning as a gate electrode, a conductor such as Al, Ti, Cr, Co, Ni, Cu, Y, Zr, Mo, Ru, Ag, Mn, Nd, Sc, Ta, or W can be used, for example. An alloy or a conductive nitride of any of these materials can also be used. A stack containing a plurality of materials selected from the above materials, alloys of these materials, and conductive nitrides of these materials can also be used. As a typical example, tungsten, a stack of tungsten and titanium nitride, or a stack of tungsten and tantalum nitride can be used. Alternatively, Cu or an alloy such as Cu—Mn, which has low resistance, or a stack of any of the above materials and Cu or an alloy such as Cu—Mn may be used. For example, titanium nitride can be used as the conductor 370a and tungsten can be used as the conductor 370b to form the conductor 370.

As the conductor 370, an oxide conductor such as In—Ga—Zn oxide, zinc oxide, indium oxide, tin oxide, indium tin oxide, or the like may be used. When the oxide conductor is provided in contact with the insulator 360, oxygen can be supplied from the oxide conductor to the oxide semiconductor 340.

The insulator 380 can be an insulator containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulator 380 may be a stack of any of the above materials.

Here, like the insulator 330, the insulator 380 preferably contains oxygen more than that in the stoichiometric composition. Oxygen released from the insulator 380 can be diffused into the channel formation region in the oxide semiconductor 340 through the insulator 360, so that oxygen vacancies formed in the channel formation region can be filled with oxygen. In this manner, stable electrical characteristics of the transistor can be achieved.

A film having an effect of blocking impurities is preferably provided over the transistor or the insulator 380. The blocking film can be a silicon nitride film, an aluminum nitride film, an aluminum oxide film, or the like.

A nitride insulating film has a function of blocking moisture and the like and can improve the reliability of the transistor. An aluminum oxide film has a high blocking effect of preventing penetration of both oxygen and impurities such as hydrogen and moisture. Accordingly, during and after the manufacturing process of the transistor, the aluminum oxide film can suitably function as a protective film that has effects of preventing entry of impurities such as hydrogen and moisture into the oxide semiconductor 340, preventing release of oxygen from the oxide semiconductor, and preventing unnecessary release of oxygen from the insulator 330.

High integration of a semiconductor device requires transistor miniaturization. However, miniaturization of a transistor tends to cause deterioration of electrical characteristics of the transistor. For example, a decrease in channel width causes a reduction in on-state current.

In the transistor of one embodiment of the present invention, the oxide semiconductor 340c can cover the oxide semiconductor 340b in which the channel is formed. In this structure, the channel formation layer is not in contact with the gate insulator; thus, scattering of carriers formed at the interface between the channel formation layer and the gate insulator can be reduced, and the on-state current of the transistor can be increased.

In the transistor of one embodiment of the present invention, as described above, the gate electrode (the conductor 370) is formed to electrically surround the oxide semiconductor 340 in the channel width direction. Accordingly, a gate electric field is applied to the oxide semiconductor 340 in a direction perpendicular to its side surface in addition to a direction perpendicular to its top surface. In other words, a gate electric field is applied to the entire channel formation layer and effective channel width is increased, leading to a further increase in the on-state current.

Although the variety of films such as the conductors, the semiconductors, and the insulators described in this embodiment can be formed typically by a sputtering method or a plasma-enhanced CVD method, such films may be formed by another method such as a thermal CVD method. Examples of a thermal CVD method include a metal organic chemical vapor deposition (MOCVD) method and an atomic layer deposition (ALD) method.

Since plasma is not used for deposition, a thermal CVD method has an advantage that no defect due to plasma damage is generated.

Deposition by a thermal CVD method may be performed in such a manner that a source gas and an oxidizer are supplied to a chamber at a time, the pressure in the chamber is set to an atmospheric pressure or a reduced pressure, and reaction is caused in the vicinity of the substrate or over the substrate.

Deposition by an ALD method is performed in such a manner that the pressure in a chamber is set to an atmospheric pressure or a reduced pressure, source gases for reaction are introduced into the chamber and reacted, and then the sequence of gas introduction is repeated. An inert gas (e.g., argon or nitrogen) may be introduced as a carrier gas together with the source gases. For example, two or more kinds of source gases may be sequentially supplied to the chamber. In that case, after reaction of a first source gas, an inert gas is introduced, and then a second source gas is introduced so that the source gases are not mixed. Alternatively, the first source gas may be exhausted by vacuum evacuation instead of introduction of an inert gas, and then the second source gas may be introduced. The first source gas is adsorbed on the surface of the substrate and reacted to form a first layer, and then, the second source gas introduced is adsorbed on the first layer and reacted. As a result, a second layer is stacked over the first layer, so that a thin film is formed. The sequence of the gas introduction is controlled and repeated more than once until a desired thickness is obtained, whereby a thin film with excellent step coverage can be formed. The thickness of the thin film can be adjusted by the number of repetitions of the sequence of gas introduction; therefore, ALD makes it possible to accurately adjust a film thickness and thus is suitable for manufacturing a minute field-effect transistor (FET).

A facing-target-type sputtering apparatus can be used to deposit an oxide semiconductor. Deposition using a facing-target-type sputtering apparatus can be referred to as vapor deposition sputtering (VDSP).

When an oxide semiconductor is deposited using a facing-target-type sputtering apparatus, plasma damage to the oxide semiconductor at the time of deposition can be reduced. Thus, oxygen vacancies in the film can be reduced. In addition, the use of the facing-target-type sputtering apparatus enables low-pressure deposition. Accordingly, the concentration of impurities (e.g., hydrogen, a rare gas such as argon, and water) in a deposited oxide semiconductor can be lowered.

The structure described in this embodiment can be used in appropriate combination with the structure described in any of the other embodiments.

Embodiment 4

In this embodiment, the material of an oxide semiconductor that can be used for one embodiment of the present invention will be described.

[Oxide Semiconductor]

An oxide semiconductor according to the present invention will be described below.

An oxide semiconductor preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where an oxide semiconductor contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

First, preferred ranges of the atomic ratio of indium, the element M, and zinc contained in an oxide semiconductor according to the present invention are described with reference to FIGS. 30A to 30C. Note that the proportion of oxygen atoms is not shown in FIGS. 30A to 30C. The terms of the atomic ratio of indium, the element M, and zinc contained in the oxide semiconductor are denoted by [In], [M], and [Zn], respectively.

Figure 30A:
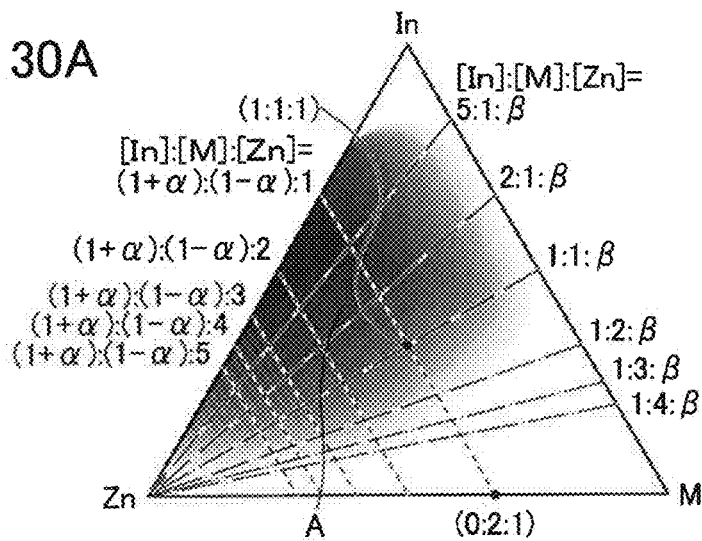
FIGS. 30A to 30C each show the range of an atomic ratio of an oxide semiconductor according to the present invention.
Figure 30B:
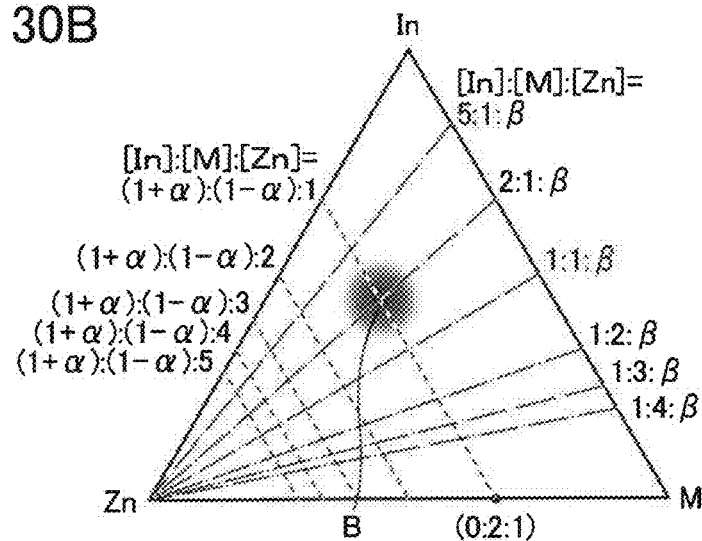
Figure 30C:
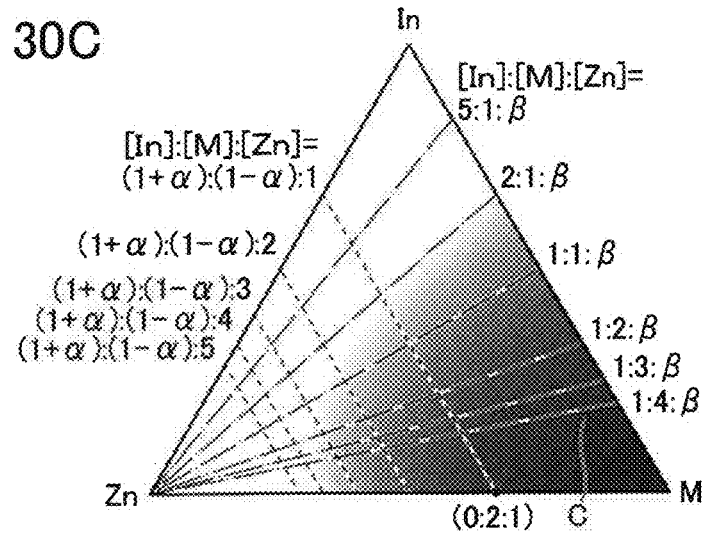

In FIGS. 30A to 30C, broken lines indicate a line where the atomic ratio [In]:[M]:[Zn] is $(1+\alpha):(1-\alpha):1$ (where $-1 \leq \alpha \leq 1$), a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $1:1:\beta$ (where $\beta \geq 0$), a line where the atomic ratio [In]:[M]:[Zn] is $1:2:\beta$, a line where the atomic ratio [In]:[M]:[Zn] is $1:3:\beta$, a line where the atomic ratio [In]:[M]:[Zn] is $1:4:\beta$, a line where the atomic ratio [In]:[M]:[Zn] is $2:1:\beta$, and a line where the atomic ratio [In]:[M]:[Zn] is $5:1:\beta$.

FIGS. 30A and 30B show examples of the preferred ranges of the atomic ratio of indium, the element M, and zinc contained in an oxide semiconductor of one embodiment of the present invention.

Figure 31:
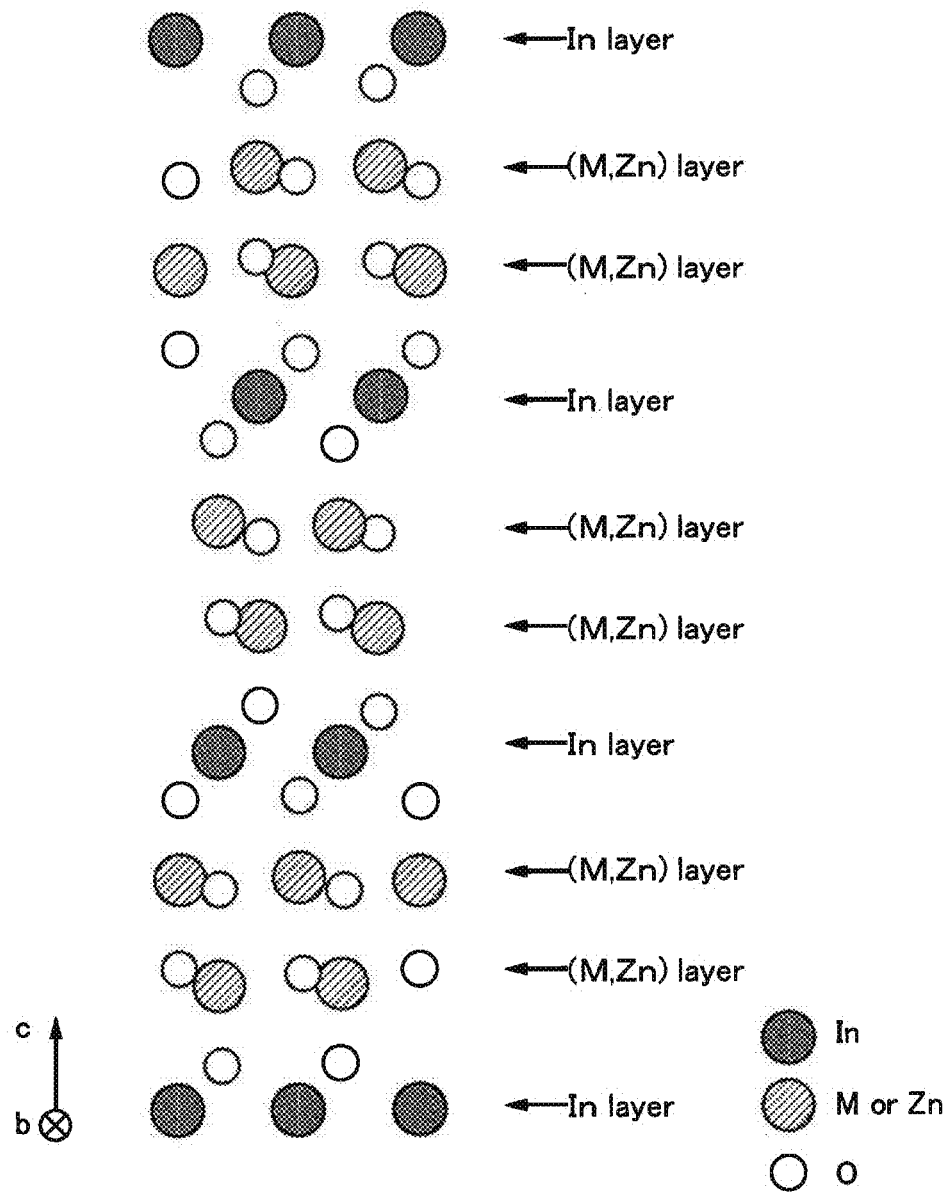
FIG. 31 shows an InMZnO$_4$ crystal.

FIG. 31 illustrates an example of the crystal structure of InMZnO$_4$ with an atomic ratio [In]:[M]:[Zn] of 1:1:1. The crystal structure shown in FIG. 31 is InMZnO$_4$ observed from a direction parallel to the b-axis. Note that a metal element in a layer that contains the element M, Zn, and oxygen (hereinafter this layer is referred to as "(M,Zn) layer") in FIG. 31 represents the element M or zinc. In that case, the proportion of the element M is the same as the proportion of zinc. The element M and zinc can be replaced with each other, and their arrangement is random.

Note that InMZnO$_4$ has a layered crystal structure (also referred to as layered structure) and includes two (M,Zn) layers that contain the element M, zinc, and oxygen with respect to one layer that contains indium and oxygen (hereinafter referred to as In layer), as illustrated in FIG. 31.

Indium and the element M can be replaced with each other. Accordingly, when the element M in the (M,Zn) layer is replaced by indium, the layer can also be referred to as (In,M,Zn) layer. In that case, a layered structure that includes two (In,M,Zn) layers with respect to one In layer is obtained.

An oxide semiconductor with an atomic ratio [In]:[M]:[Zn] of 1:1:2 has a layered structure that includes three (M,Zn) layers with respect to one In layer. In other words, if [Zn] is larger than [In] and [M], the proportion of the (M,Zn) layer to the In layer becomes higher when the oxide semiconductor is crystallized.

Note that in the case where the number of (M,Zn) layers with respect to one In layer is not an integer in the oxide semiconductor, the oxide semiconductor might have plural kinds of layered structures where the number of (M,Zn) layers with respect to one In layer is an integer. For example, in the case of [In]:[M]:[Zn]=1:1:1.5, the oxide semiconductor may have a mix of a layered structure including one In layer for every two (M,Zn) layers and a layered structure including one In layer for every three (M,Zn) layers.

For example, when the oxide semiconductor is deposited with a sputtering apparatus, a film having an atomic ratio deviated from the atomic ratio of a target is formed. In particular, [Zn] in the film might be smaller than [Zn] in the target depending on the substrate temperature in deposition.

A plurality of phases (e.g., two phases or three phases) exist in the oxide semiconductor in some cases. For example, with an atomic ratio [In]:[M]:[Zn] close to 0:2:1, two phases of a spinel crystal structure and a layered crystal structure are likely to exist. Moreover, with an atomic ratio [In]:[M]:[Zn] close to 1:0:0, two phases of a bixbyite crystal structure and a layered crystal structure are likely to exist. In the case where a plurality of phases exist in the oxide semiconductor, a grain boundary might be formed between different crystal structures.

In addition, the oxide semiconductor with a higher content of indium can have high carrier mobility (electron mobility). This is because in an oxide semiconductor containing indium, the element M, and zinc, the s orbital of heavy metal mainly contributes to carrier transfer, and a higher indium content in the oxide semiconductor enlarges a region where the s orbitals of indium atoms overlap; therefore, an oxide semiconductor with a high indium content has higher carrier mobility than an oxide semiconductor with a low indium content.

In contrast, when the indium content and the zinc content in an oxide semiconductor become lower, the carrier mobility becomes lower. Thus, with an atomic ratio [In]:[M]:[Zn] of 0:1:0 or around 0:1:0 (e.g., a region C in FIG. 30C), insulation performance becomes better.

Accordingly, an oxide semiconductor in one embodiment of the present invention preferably has an atomic ratio represented by a region A in FIG. 30A. With this atomic ratio, a layered structure with high carrier mobility and a few grain boundaries is easily obtained.

A region B in FIG. 30B represents an atomic ratio [In]:[M]:[Zn] of 4:2:3 to 4:2:4.1 and the vicinity thereof. The vicinity includes an atomic ratio [In]:[M]:[Zn] of 5:3:4. An oxide semiconductor with an atomic ratio represented by the region B is an excellent oxide semiconductor that has particularly high crystallinity and high carrier mobility.

Note that a condition where an oxide semiconductor has a layered structure is not uniquely determined by an atomic ratio. The atomic ratio affects difficulty in forming a layered structure. Even with the same atomic ratio, whether a layered structure is formed or not depends on a formation condition. Therefore, the illustrated regions each represent an atomic ratio with which an oxide semiconductor has a layered structure, and boundaries of the regions A to C are not clear.

Next, the case where the oxide semiconductor is used for a transistor is described.

When the oxide semiconductor is used for a transistor, carrier scattering or the like at a grain boundary can be reduced; thus, the transistor can have high field-effect mobility. Moreover, the transistor can have high reliability.

An oxide semiconductor with a low carrier density is preferably used for a transistor. For example, an oxide semiconductor whose carrier density is lower than $8 \times 10^{11}/$ cm$^3$, preferably lower than 1×10$^{11}$/cm$^3$, further preferably lower than 1×10$^{10}$/cm$^3$, and greater than or equal to 1×10$^{-9}$/cm$^3$ is used.

A highly purified intrinsic or substantially highly purified intrinsic oxide semiconductor has few carrier generation sources and thus can have a low carrier density. A highly purified intrinsic or substantially highly purified intrinsic oxide semiconductor has a low density of defect states and accordingly has a low density of trap states in some cases.

Charge trapped by the trap states in the oxide semiconductor takes a long time to be released and may behave like fixed charge. Thus, a transistor whose channel region is formed in an oxide semiconductor with a high density of trap states has unstable electrical characteristics in some cases.

In view of the above, to obtain stable electrical characteristics of a transistor, it is effective to reduce the concentration of impurities in the oxide semiconductor. To reduce the concentration of impurities in the oxide semiconductor, the concentration of impurities in a film that is adjacent to the oxide semiconductor is preferably reduced. Examples of impurities include hydrogen, nitrogen, alkali metal, alkaline earth metal, iron, nickel, and silicon.

Here, the influence of impurities in the oxide semiconductor is described.

When silicon or carbon, which is a Group 14 element, is contained in the oxide semiconductor, defect states are formed in the oxide semiconductor. Thus, the concentration of silicon or carbon in the oxide semiconductor and around an interface with the oxide semiconductor (measured by secondary ion mass spectrometry (SIMS)) is set lower than or equal to 2×10$^{18}$ atoms/cm$^3$, preferably lower than or equal to 2×10$^{17}$ atoms/cm$^3$.

When the oxide semiconductor contains alkali metal or alkaline earth metal, defect states are formed and carriers are generated in some cases. Thus, a transistor using an oxide semiconductor that contains alkali metal or alkaline earth metal is likely to have normally-on characteristics. Accordingly, it is preferable to reduce the concentration of alkali metal or alkaline earth metal in the oxide semiconductor. Specifically, the concentration of alkali metal or alkaline earth metal in the oxide semiconductor, measured by SIMS, is set lower than or equal to 1×10$^{18}$ atoms/cm$^3$, preferably lower than or equal to 2×10$^{16}$ atoms/cm$^3$.

When the oxide semiconductor contains nitrogen, the oxide semiconductor easily becomes n-type by generation of electrons serving as carriers and an increase of carrier density. Thus, a transistor in which an oxide semiconductor containing nitrogen is used as a semiconductor is likely to have normally-on characteristics. For this reason, nitrogen in the oxide semiconductor is preferably reduced as much as possible. For example, the nitrogen concentration in the oxide semiconductor, measured by SIMS, is set lower than 5×10$^{19}$ atoms/cm$^3$, preferably lower than or equal to 5×10$^{18}$ atoms/cm$^3$, further preferably lower than or equal to 1×10$^{18}$ atoms/cm$^3$, still further preferably lower than or equal to 5×10$^{17}$ atoms/cm$^3$.

Hydrogen contained in an oxide semiconductor reacts with oxygen bonded to a metal atom to be water, and thus causes an oxygen vacancy in some cases. Due to entry of hydrogen into the oxygen vacancy, an electron serving as a carrier is sometimes generated. Furthermore, in some cases, bonding of part of hydrogen to oxygen bonded to a metal atom causes generation of an electron serving as a carrier. Thus, a transistor using an oxide semiconductor that contains hydrogen is likely to have normally-on characteristics. Accordingly, it is preferred that hydrogen in the oxide semiconductor be reduced as much as possible. Specifically, the hydrogen concentration in the oxide semiconductor, measured by SIMS, is set lower than 1×10$^{20}$ atoms/cm$^3$, preferably lower than 1×10$^{19}$ atoms/cm$^3$, further preferably lower than 5×10$^{18}$ atoms/cm$^3$, still further preferably lower than 1×10$^{18}$ atoms/cm$^3$.

When an oxide semiconductor with sufficiently reduced impurity concentration is used for a channel formation region in a transistor, the transistor can have stable electrical characteristics.

Figure 32A:
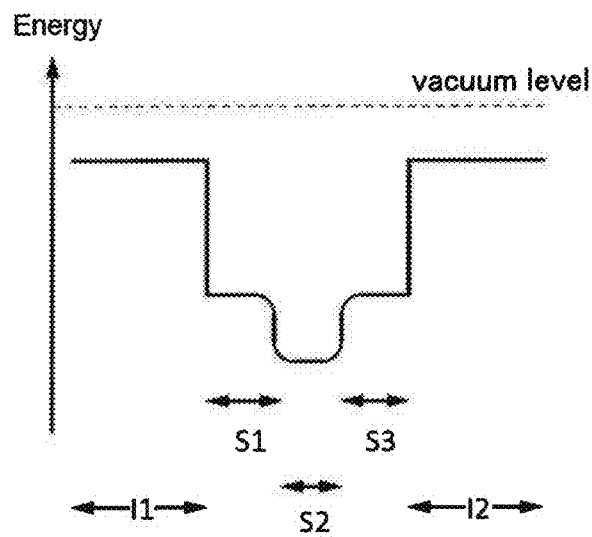
FIGS. 32A and 32B are each a band diagram of a layered structure of oxide semiconductors.
Figure 32B:
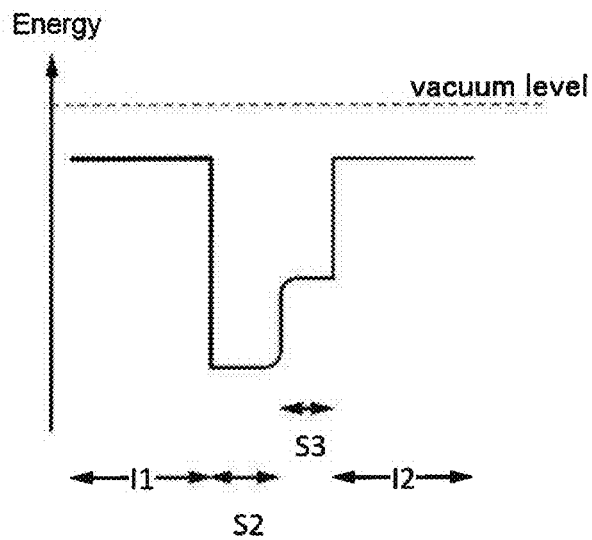

Next, the case where the oxide semiconductor has a two-layer structure or a three-layer structure is described. With reference to FIGS. 32A and 32B, the description is made on a band diagram of a layered structure of an oxide semiconductor S1, an oxide semiconductor S2, and an oxide semiconductor S3 and insulators in contact with the layered structure; and a band diagram of a layered structure of the oxide semiconductor S2 and the oxide semiconductor S3 and insulators in contact with the layered structure.

FIG. 32A is an example of a band diagram of a layered structure including an insulator I1, the oxide semiconductor S1, the oxide semiconductor S2, the oxide semiconductor S3, and an insulator I2 in the thickness direction. FIG. 32B is an example of a band diagram of a layered structure including the insulator I1, the oxide semiconductor S2, the oxide semiconductor S3, and the insulator I2 in the thickness direction. Note that for easy understanding, the band diagrams show the conduction band minimum (Ec) of each of the insulator I1, the oxide semiconductor S1, the oxide semiconductor S2, the oxide semiconductor S3, and the insulator I2.

The conduction band minimum of each of the oxide semiconductors S1 and S3 is closer to the vacuum level than that of the oxide semiconductor S2. Typically, a difference in the conduction band minimum between the oxide semiconductor S2 and each of the oxide semiconductors S1 and S3 is preferably greater than or equal to 0.15 eV or greater than or equal to 0.5 eV, and less than or equal to 2 eV or less than or equal to 1 eV. That is, it is preferred that the electron affinity of the oxide semiconductor S2 be higher than the electron affinity of each of the oxide semiconductors S1 and S3, and that the difference in the electron affinity between the oxide semiconductor S2 and each of the oxide semiconductors S1 and S3 be greater than or equal to 0.15 eV or greater than or equal to 0.5 eV, and less than or equal to 2 eV or less than or equal to 1 eV.

As illustrated in FIGS. 32A and 32B, the conduction band minimum of each of the oxide semiconductors S1 to S3 is gradually varied. In other words, the conduction band minimum is continuously varied or continuous junction is formed. To obtain such a band diagram, the density of defect states in a mixed layer formed at an interface between the oxide semiconductors S1 and S2 or an interface between the oxide semiconductors S2 and S3 is preferably made low.

Specifically, when the oxide semiconductors S1 and S2 or the oxide semiconductors S2 and S3 contain the same element (as a main component) in addition to oxygen, a mixed layer with a low density of defect states can be formed. For example, when the oxide semiconductor S2 is In—Ga—Zn oxide, it is preferable to use In—Ga—Zn oxide, Ga—Zn oxide, gallium oxide, or the like as the oxide semiconductors S1 and S3.

At this time, the oxide semiconductor S2 serves as a main carrier path. Since the density of defect states at the interface between the oxide semiconductors S1 and S2 and the interface between the oxide semiconductors S2 and S3 can be made low, the influence of interface scattering on carrier conduction is small, and a high on-state current can be obtained.

When an electron is trapped in a trap state, the trapped electron behaves like fixed charge; thus, the threshold voltage of the transistor is shifted in a positive direction. The oxide semiconductors S1 and S3 can make the trap state apart from the oxide semiconductor S2. This structure can prevent the positive shift of the threshold voltage of the transistor.

A material whose conductivity is sufficiently lower than that of the oxide semiconductor S2 is used for the oxide semiconductors S1 and S3. Accordingly, the oxide semiconductor S2, the interface between the oxide semiconductors S1 and S2, and the interface between the oxide semiconductors S2 and S3 mainly function as a channel region. For example, an oxide semiconductor with high insulation performance and the atomic ratio represented by the region C in FIG. 30C can be used as the oxide semiconductors S1 and S3. Note that the region C in FIG. 30C represents the atomic ratio [In]:[M]:[Zn] of 0:1:0 or around 0:1:0.

When an oxide semiconductor with the atomic ratio represented by the region A is used as the oxide semiconductor S2, each of the oxide semiconductors S1 and S3 is preferably an oxide semiconductor with [M]/[In] of 1 or greater, preferably 2 or greater. Moreover, the oxide semiconductor S3 is preferably an oxide semiconductor having [M]/([Zn]+[In]) of 1 or greater to obtain sufficiently high insulation performance.

The structure described in this embodiment can be used in appropriate combination with the structure described in any of the other embodiments.

Embodiment 5

The structure of an oxide semiconductor that can be used for one embodiment of the present invention will be described below.

In this specification, the term "parallel" indicates that the angle formed between two straight lines ranges from −10° to 10°, and accordingly also includes the case where the angle ranges from −5° to 5°. The term "perpendicular" indicates that the angle formed between two straight lines ranges from 80° to 100°, and accordingly also includes the case where the angle ranges from 85° to 95°.

In this specification, trigonal and rhombohedral crystal systems are included in a hexagonal crystal system.

The structure of an oxide semiconductor will be described below.

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not to have fixed positions of atoms, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

First, a CAAC-OS will be described.

A CAAC-OS is an oxide semiconductor having a plurality of c-axis-aligned crystal parts (also referred to as pellets).

Figure 33A:
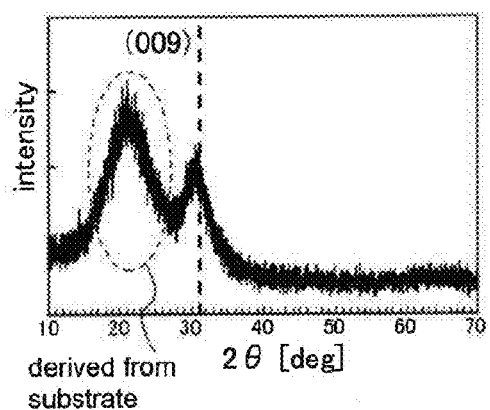
FIGS. 33A to 33E show structural analysis results of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an $InGaZnO_4$ crystal that is classified into the space group R-3m is analyzed by an out-of-plane method, a peak appears at a diffraction angle ($2\theta$) of around 31° as shown in FIG. 33A. This peak is derived from the (009) plane of the $InGaZnO_4$ crystal, which indicates that crystals in the CAAC-OS have c-axis alignment, and that the c-axes are aligned in a direction substantially perpendicular to a surface where the CAAC-OS film is formed (also referred to as formation surface) or the top surface of the CAAC-OS film. Note that a peak sometimes appears at a $2\theta$ of around 36° in addition to the peak at a $2\theta$ of around 31°. The peak at a $2\theta$ of around 36° is derived from a crystal structure classified into the space group Fd-3m. Therefore, it is preferred that the CAAC-OS do not show the peak at a $2\theta$ of around 36°.

Figure 33B:
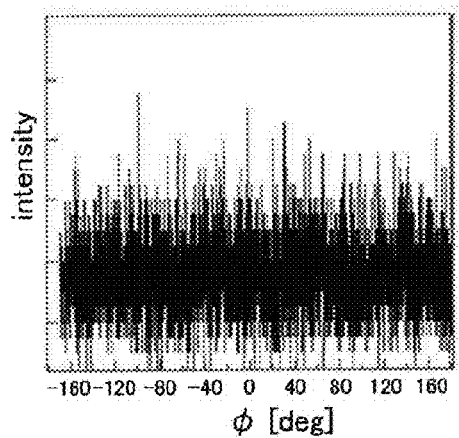
Figure 33C:
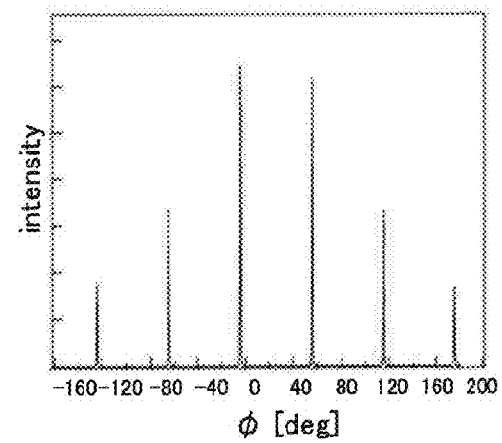

Furthermore, in structural analysis of the CAAC-OS by an in-plane method in which an X-ray is incident on the CAAC-OS in a direction parallel to the formation surface, a peak appears at a $2\theta$ of around 56°. This peak is derived from the (110) plane of the $InGaZnO_4$ crystal. When analysis ($\phi$ scan) is performed with a $2\theta$ fixed at around 56° and with the sample rotated using a normal vector of the sample surface as an axis ($\phi$ axis), no clear peak appears as shown in FIG. 33B. Meanwhile, when single crystal $InGaZnO_4$ is subjected to $\phi$ scan with a $2\theta$ fixed at around 56°, six peaks that are derived from crystal planes equivalent to the (110) plane are observed as shown in FIG. 33C. Accordingly, the structural analysis using XRD shows that the directions of a-axes and b-axes are irregularly oriented in the CAAC-OS.

Figure 33D:
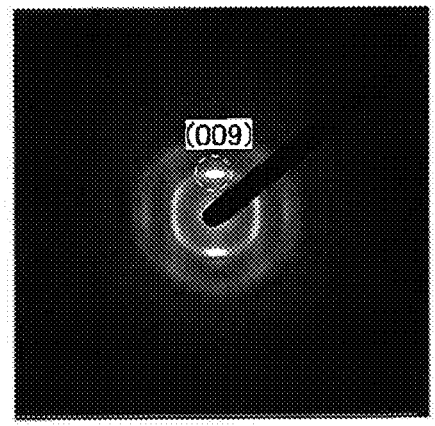
Figure 33E:
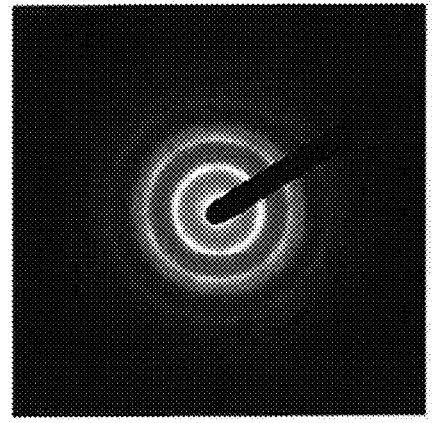

Next, a CAAC-OS analyzed by electron diffraction will be described. For example, when an electron beam with a probe diameter of 300 nm is incident on a CAAC-OS including an $InGaZnO_4$ crystal in a direction parallel to the formation surface of the CAAC-OS, a diffraction pattern including a spot derived from the (009) plane of the $InGaZnO_4$ crystal shown in FIG. 33D appears sometimes. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in the direction substantially perpendicular to the formation surface or the top surface of the CAAC-OS. Meanwhile, FIG. 33E shows a diffraction pattern obtained when an electron beam with a probe diameter of 300 nm is incident on the same sample in a direction perpendicular to the sample surface. As shown in FIG. 33E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 33E is considered to be derived from the (010) plane, the (100) plane, and the like of the InGaZnO$_4$ crystal. The second ring in FIG. 33E is considered to be derived from the (110) plane and the like.

In a combined analysis image (also referred to as high-resolution transmission electron microscope (TEM) image) of a bright-field image and a diffraction pattern of the CAAC-OS, which is obtained using a TEM, a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 34A:
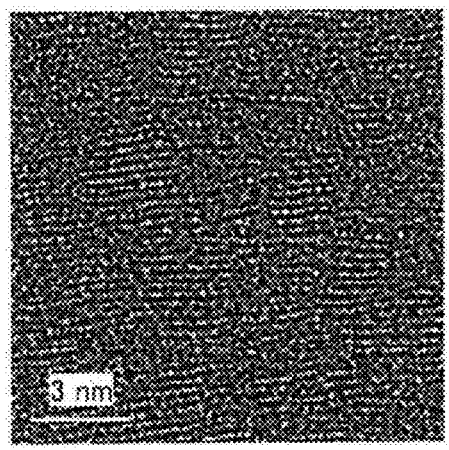
FIGS. 34A to 34E show a cross-sectional TEM image and plan-view TEM images of a CAAC-OS, and images obtained through analysis of the plan-view TEM images.

FIG. 34A shows a high-resolution cross-sectional TEM image of the CAAC-OS observed from a direction substantially parallel to the sample surface. The high-resolution TEM image is obtained with a spherical aberration corrector function. A high-resolution TEM image obtained with a spherical aberration corrector function is particularly referred to as a Cs-corrected high-resolution TEM image. A Cs-corrected high-resolution TEM image can be obtained with, for example, an atomic resolution analytical electron microscope JEM-ARM200F, manufactured by JEOL Ltd.

FIG. 34A shows pellets in which metal atoms are arranged in a layered manner. FIG. 34A proves that the size of a pellet is greater than or equal to 1 nm or greater than or equal to 3 nm. Therefore, the pellet can be referred to as a nanocrystal (nc). Furthermore, the CAAC-OS can also be referred to as an oxide semiconductor including c-axis-aligned nanocrystals (CANC). A pellet reflects unevenness of a formation surface or a top surface of the CAAC-OS and is parallel to the formation surface or the top surface of the CAAC-OS.

Figure 34B:
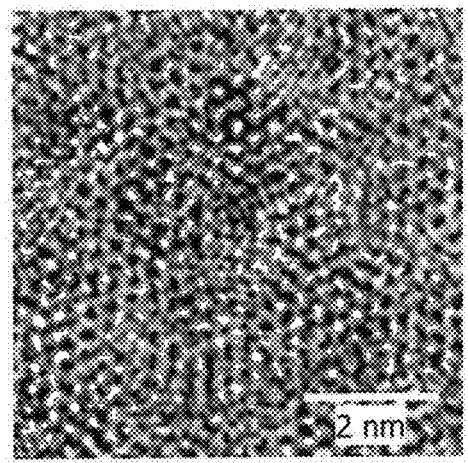
Figure 34C:
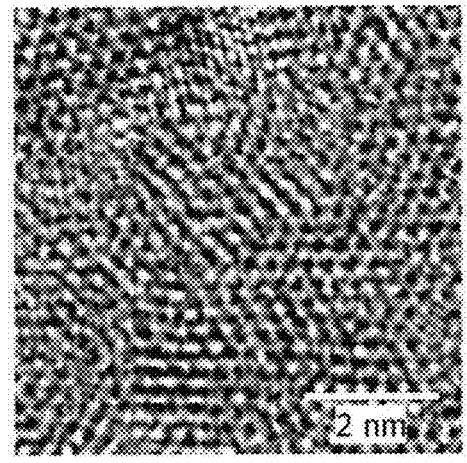
Figure 34D:
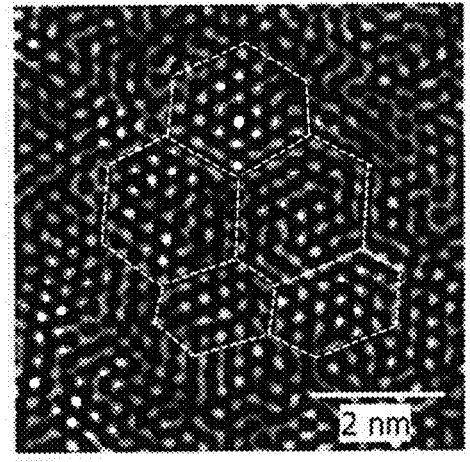
Figure 34E:
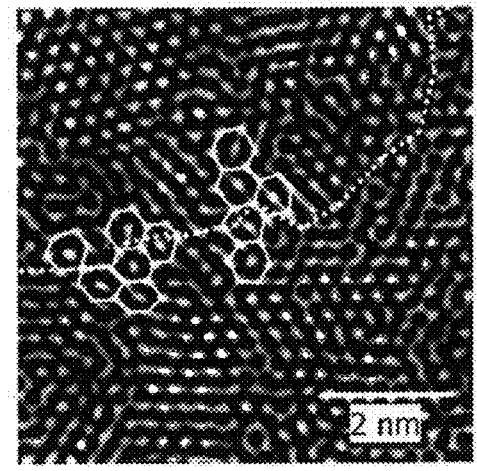

FIGS. 34B and 34C show Cs-corrected high-resolution plan-view TEM images of the CAAC-OS observed from a direction substantially perpendicular to the sample surface. FIGS. 34D and 34E are images obtained through image processing of FIGS. 34B and 34C. The method of image processing is as follows. First, the image in FIG. 34B is subjected to fast Fourier transform (FFT), so that an FFT image is obtained. Then, mask processing is performed such that a range of 2.8 nm$^{-1}$ to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. An FFT filtering image is a Cs-corrected high-resolution TEM image from which a periodic component is extracted, and shows a lattice arrangement.

In FIG. 34D, a portion in which the lattice arrangement is broken is shown by dashed lines. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 34E, a dotted line denotes a boundary between a region with a regular lattice arrangement and another region with a regular lattice arrangement. A clear grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, formation of a grain boundary is inhibited by distortion of a lattice arrangement. This is probably because the CAAC-OS can tolerate distortion owing to a low density of arrangement of oxygen atoms in the a-b plane direction, the interatomic bond distance changed by substitution of a metal element, and the like.

As described above, the CAAC-OS has c-axis alignment, its pellets (nanocrystals) are connected in the a-b plane direction, and its crystal structure has distortion. Accordingly, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has negligible amounts of impurities and defects (e.g., oxygen vacancies).

Note that impurities mean an element other than the main components of the oxide semiconductor, such as hydrogen, carbon, silicon, and a transition metal element. For example, an element (specifically, silicon or the like) having higher strength of bonding to oxygen than a metal element contained in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

Next, an nc-OS will be described.

Analysis of an nc-OS by XRD is described. When the structure of an nc-OS is analyzed by an out-of-plane method, a peak indicating orientation does not appear. That is, a crystal of an nc-OS does not have orientation.

Figure 35A:
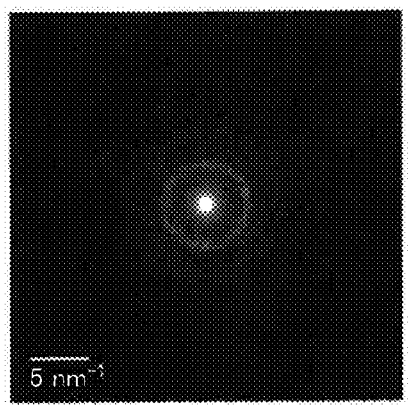
FIGS. 35A to 35D show electron diffraction patterns and a cross-sectional TEM image of an nc-OS.
Figure 35B:
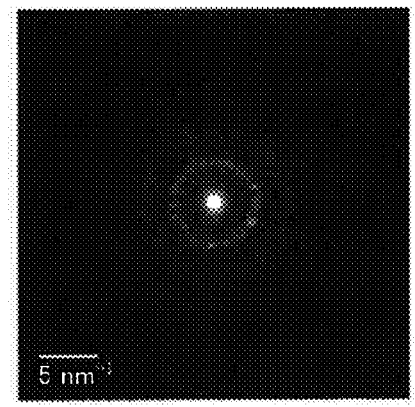

For example, when an electron beam with a probe diameter of 50 nm is incident on a 34-nm-thick region of a thinned nc-OS including an InGaZnO$_4$ crystal in the direction parallel to the formation surface, a ring-shaped diffraction pattern (nanobeam electron diffraction pattern) shown in FIG. 35A is observed. FIG. 35B shows a diffraction pattern (nanobeam electron diffraction pattern) obtained when an electron beam with a probe diameter of 1 nm is incident on the same sample. As shown in FIG. 35B, a plurality of spots are observed in a ring-like region. In other words, ordering in an nc-OS is not observed with an electron beam having a probe diameter of 50 nm but is observed with an electron beam having a probe diameter of 1 nm.

Figure 35C:
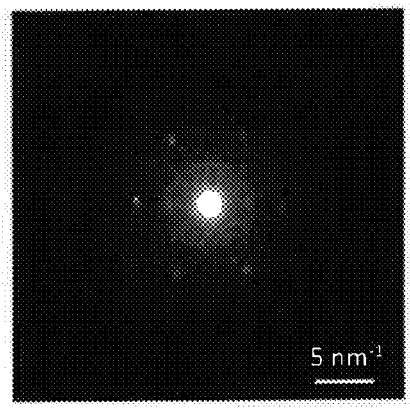

When an electron beam with a probe diameter of 1 nm is incident on a region with a thickness less than 10 nm, an electron diffraction pattern in which spots are arranged in an approximately regular hexagonal shape as shown in FIG. 35C is observed in some cases. This means that an nc-OS has a well-ordered region, i.e., a crystal, in the thickness range of less than 10 nm. Note that an electron diffraction pattern having regularity is not observed in some regions because crystals are aligned in various directions.

Figure 35D:
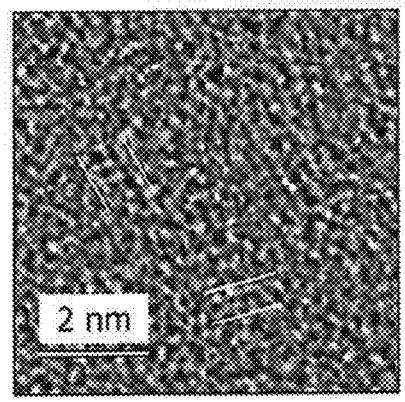

FIG. 35D shows a Cs-corrected high-resolution cross-sectional TEM image of an nc-OS observed from the direction substantially parallel to the formation surface. In the high-resolution TEM image, the nc-OS has a region in which a crystal part is observed, such as the part indicated by additional lines in FIG. 35D, and a region in which a clear crystal part is not observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor by some analysis methods.

Since there is no regularity of crystal orientation between the pellets (nanocrystals) as mentioned above, the nc-OS can also be referred to as an oxide semiconductor including random-aligned nanocrystals (RANC) or an oxide semiconductor including non-aligned nanocrystals (NANC).

The nc-OS is an oxide semiconductor that has higher regularity than an amorphous oxide semiconductor. Therefore, the nc-OS is likely to have a lower density of defect states than an a-like OS and an amorphous oxide semiconductor. Since there is no regularity of crystal orientation between different pellets in the nc-OS, the nc-OS has a higher density of defect states than the CAAC-OS.

An a-like OS has a structure between those of the nc-OS and an amorphous oxide semiconductor.

Figure 36A:
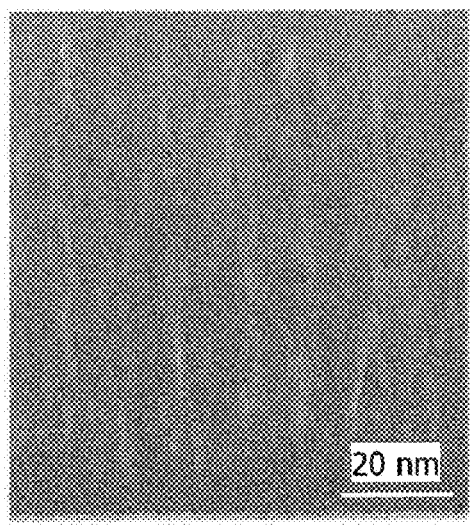
FIGS. 36A and 36B are cross-sectional TEM images of an a-like OS.
Figure 36B:
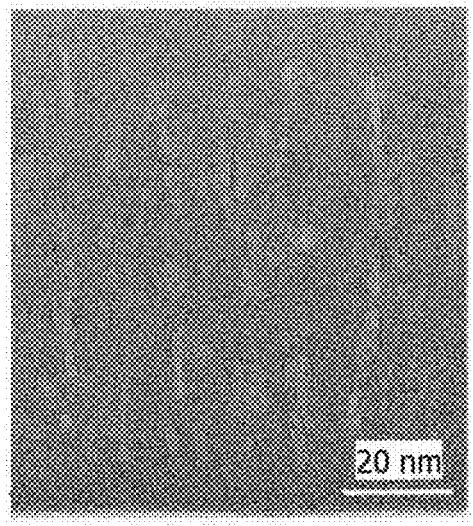

FIGS. 36A and 36B show high-resolution cross-sectional TEM images of the a-like OS. FIG. 36A is the high-resolution cross-sectional TEM image of the a-like OS at the start of electron irradiation. FIG. 36B is the high-resolution cross-sectional TEM image of the a-like OS after the electron ($e^-$) irradiation at $4.3 \times 10^8$ $e^-/nm^2$. FIGS. 36A and 36B show that stripe-like bright regions that extend vertically are observed in the a-like OS from the start of the electron irradiation. It can also be found that the shape of the bright region changes after the electron irradiation. Note that the bright region is presumably a void or a low-density region.

The a-like OS has an unstable structure because it includes a void. To verify that the a-like OS has an unstable structure as compared with a CAAC-OS and an nc-OS, a change in structure caused by electron irradiation will be described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In—O layers and six Ga—Zn—O layers are stacked in the c-axis direction. The spacing between the adjacent layers is equivalent to the lattice spacing on the (009) plane (also referred to as d value), and is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 37:
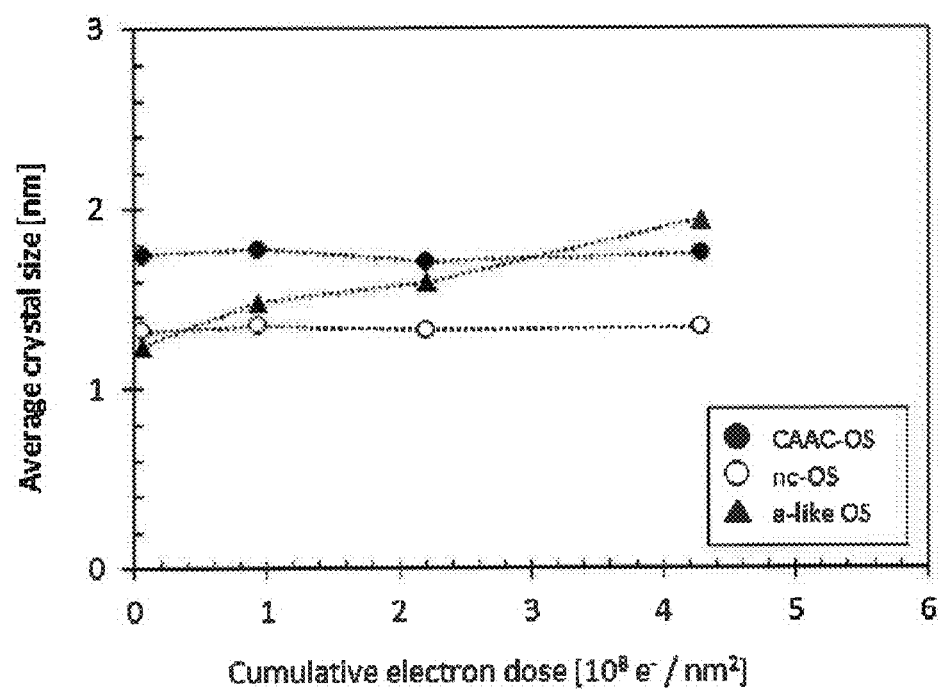
FIG. 37 shows a change of crystal parts of In—Ga—Zn oxide owing to electron irradiation.

FIG. 37 shows a change in the average size of crystal parts (at 22 points to 30 points) in each sample. Note that the crystal part size corresponds to the length of the lattice fringe. FIG. 37 indicates that the crystal part size in the a-like OS increases with an increase in the cumulative electron dose in obtaining TEM images, for example. As shown in FIG. 37, a crystal part of approximately 1.2 nm (also referred to as initial nucleus) at the start of TEM observation grows to a size of approximately 1.9 nm at a cumulative electron ($e^-$) dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. As shown in FIG. 37, the crystal part sizes in the nc-OS and the CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ $e^-/(nm^2 \cdot s)$; and the diameter of the irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. These results demonstrate that the a-like OS has an unstable structure compared to the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of a single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor whose density is lower than 78% of the density of the single crystal oxide semiconductor.

For example, in an oxide semiconductor having an atomic ratio of In:Ga:Zn=1:1:1, the density of single crystal $InGaZnO_4$ with a rhombohedral crystal structure is 6.357 $g/cm^3$. Accordingly, for the oxide semiconductor having an atomic ratio of In:Ga:Zn=1:1:1, for example, the density of the a-like OS is higher than or equal to 5.0 $g/cm^3$ and lower than 5.9 $g/cm^3$, and the density of each of the nc-OS and the CAAC-OS is higher than or equal to 5.9 $g/cm^3$ and lower than 6.3 $g/cm^3$.

Note that in the case where an oxide semiconductor having a certain composition does not exist in a single crystal structure, single crystal oxide semiconductors with different compositions are combined at an adequate ratio, which makes it possible to calculate a density equivalent to that of a single crystal oxide semiconductor with the desired composition. The density of a single crystal oxide semiconductor having the desired composition can be estimated using a weighted average according to the combination ratio of the single crystal oxide semiconductors with different compositions. Note that it is preferable to use as few kinds of single crystal oxide semiconductors as possible to estimate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

Next, the carrier density of an oxide semiconductor will be described below.

Examples of a factor affecting the carrier density of an oxide semiconductor include oxygen vacancy (Vo) and impurities in the oxide semiconductor.

As the amount of oxygen vacancy in the oxide semiconductor increases, the density of defect states increases when hydrogen is bonded to the oxygen vacancy (this state is also referred to as VoH). The density of defect states also increases with an increase in the amount of impurities in the oxide semiconductor. Hence, the carrier density of an oxide semiconductor can be controlled by controlling the density of defect states in the oxide semiconductor.

A transistor using the oxide semiconductor in a channel region will be described below.

The carrier density of the oxide semiconductor is preferably reduced in order to inhibit the negative shift of the threshold voltage of the transistor or reduce the off-state current of the transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. The carrier density of a highly purified intrinsic oxide semiconductor is lower than $8 \times 10^{15}$ cm$^{-3}$, preferably lower than $1 \times 10^{11}$ cm$^{-3}$, further preferably lower than $1 \times 10^{10}$ cm$^{-3}$ and is higher than or equal to $1 \times 10^{-9}$ cm$^{-3}$.

In contrast, the carrier density of the oxide semiconductor is preferably increased in order to improve the on-state current of the transistor or improve the field-effect mobility of the transistor. In order to increase the carrier density of the oxide semiconductor, the impurity concentration or the density of defect states in the oxide semiconductor is slightly increased, or the bandgap of the oxide semiconductor is narrowed. For example, an oxide semiconductor that has a slightly high impurity concentration or a slightly high density of defect states in the range where a favorable on/off ratio is obtained in the $I_d$–$V_g$ characteristics of the transistor can be regarded as substantially intrinsic. Furthermore, an oxide semiconductor that has a high electron affinity and thus has a narrow bandgap so as to increase the density of thermally excited electrons (carriers) can be regarded as substantially intrinsic. Note that a transistor using an oxide semiconductor with higher electron affinity has lower threshold voltage.

The oxide semiconductor with an increased carrier density has somewhat n-type conductivity; thus, it can be referred to as a "slightly-n" oxide semiconductor.

The carrier density of a substantially intrinsic oxide semiconductor is preferably higher than or equal to $1 \times 10^5$ cm$^{-3}$ and lower than $1 \times 10^{18}$ cm$^{-3}$, further preferably higher than or equal to $1 \times 10^7$ cm$^{-3}$ and lower than or equal to $1 \times 10^{17}$ cm$^{-3}$, still further preferably higher than or equal to $1 \times 10^9$ cm$^{-3}$ and lower than or equal to $5 \times 10^{16}$ cm$^{-3}$, yet further preferably higher than or equal to $1 \times 10^{10}$ cm$^{-3}$ and lower than or equal to $1 \times 10^{16}$ cm$^{-3}$, yet still preferably higher than or equal to $1 \times 10^{11}$ cm$^{-3}$ and lower than or equal to $1 \times 10^{15}$ cm$^{-3}$.

The structure described in this embodiment can be used in appropriate combination with the structure described in any of the other embodiments.

Embodiment 6

This embodiment will explain examples of a package and a camera module in each of which an image sensor chip is placed. For the image sensor chip, the structure of an imaging device of one embodiment of the present invention can be used.

FIG. 38A is an external perspective view showing the top surface side of a package in which an image sensor chip is placed. The package includes a package substrate 810 to which an image sensor chip 850 is fixed, a cover glass 820, and an adhesive 830 for bonding the package substrate 810 and the cover glass 820, and the like.

FIG. 38B is an external perspective view showing the bottom surface side of the package. On the bottom surface of the package, a ball grid array (BGA) including solder balls as bumps 840 is formed. Although the BGA is employed here, a land grid array (LGA), a pin grid array (PGA), or the like may be alternatively employed.

FIG. 38C is a perspective view of the package, in which the cover glass 820 and the adhesive 830 are partly illustrated. FIG. 38D is a cross-sectional view of the package. Electrode pads 860 are formed over the package substrate 810 and electrically connected to the bumps 840 via through-holes 880 and lands 885. The electrode pads 860 are electrically connected to electrodes of the image sensor chip 850 through wires 870.

Figure 39A:
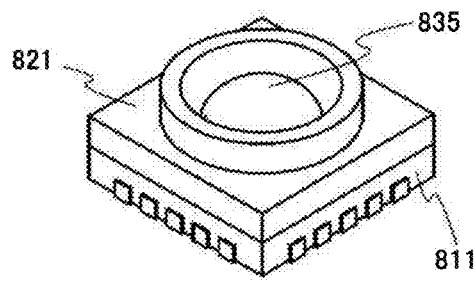
FIGS. 39A to 39D are perspective views and a cross-sectional view of a package in which an imaging device is placed.

FIG. 39A is an external perspective view showing the top surface side of a camera module in which an image sensor chip is mounted on a package with a built-in lens. The camera module includes a package substrate 811 to which an image sensor chip 851 is fixed, a lens cover 821, a lens 835, and the like. Furthermore, an IC chip 890 having functions of a driver circuit, a signal conversion circuit, and the like of the imaging device is provided between the package substrate 811 and the image sensor chip 851. Thus, a system in package (SiP) is formed.

Figure 39B:
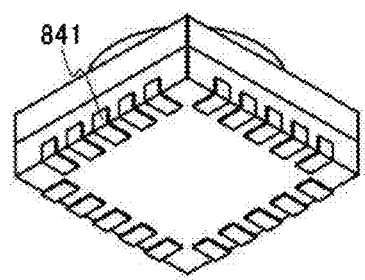

FIG. 39B is an external perspective view showing the bottom surface side of the camera module. On the bottom surface and four side surfaces of the package substrate 811, mounting lands 841 are provided; this structure can be called a quad flat no-lead (QFN) package. Although the QFN package is employed here, a quad flat package (QFP), the above BGA, or the like may be alternatively employed.

Figure 39C:
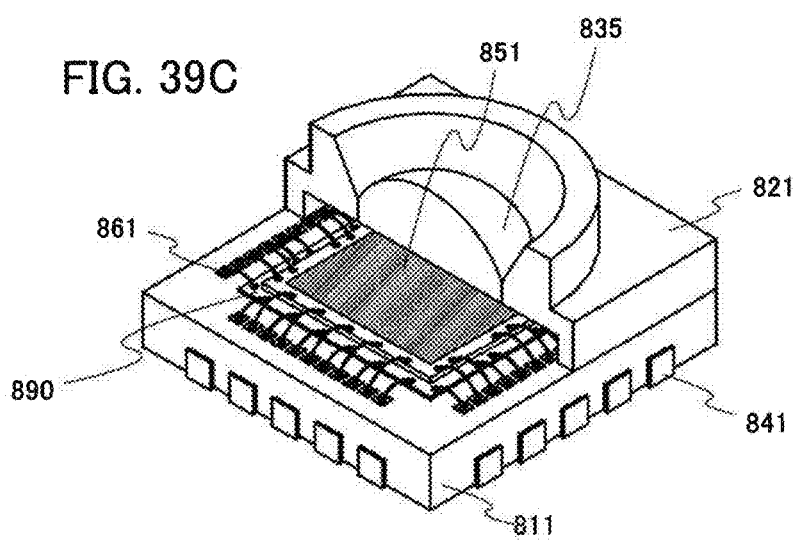
Figure 39D:
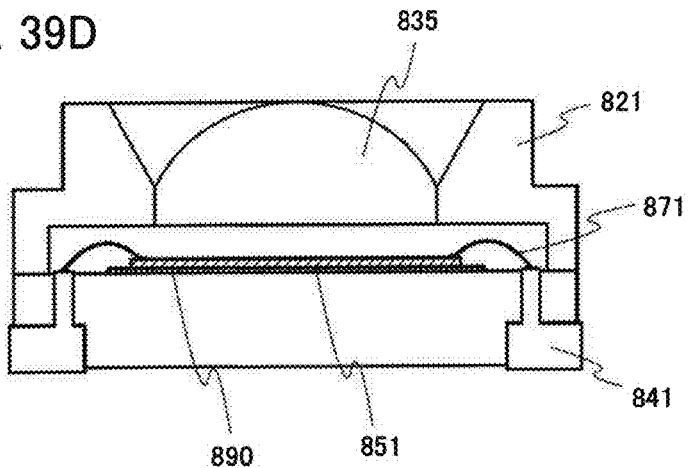

FIG. 39C is a perspective view of the camera module, in which the lens cover 821 and the lens 835 are partly illustrated. FIG. 39D is a cross-sectional view of the camera module. Some of the lands 841 are used as electrode pads 861. The electrode pads 861 are electrically connected to electrodes of the image sensor chip 851 and the IC chip 890 through wires 871.

The image sensor chip placed in the package having the above structure can be easily mounted on and incorporated into a variety of semiconductor devices and electronic devices.

The structure described in this embodiment can be used in appropriate combination with the structure described in any of the other embodiments.

Embodiment 7

Examples of an electronic device that can include the imaging device of one embodiment of the present invention include display devices, personal computers, image memory devices or image reproducing devices provided with storage media, mobile phones, game machines (including portable game machines), portable data terminals, e-book readers, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), and vending machines. FIGS. 40A to 40F illustrate specific examples of these electronic devices.

Figure 40A:
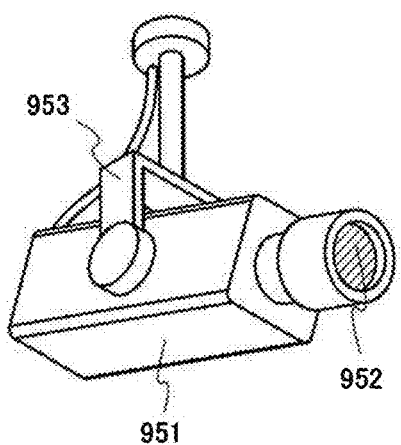
FIGS. 40A to 40F each illustrate an electronic device.

FIG. 40A illustrates a monitoring camera that includes a housing 951, a lens 952, a support 953, and the like. The imaging device of one embodiment of the present invention can be included as a component for obtaining an image in the monitoring camera. Note that a "monitoring" camera is a name in common use and does not limit the uses of the camera. A device that has a function of a monitoring camera can also be called a camera or a video camera, for example.

Figure 40B:
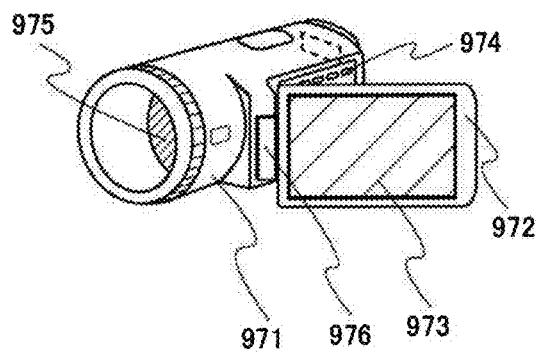

FIG. 40B illustrates a video camera that includes a first housing 971, a second housing 972, a display portion 973, operation keys 974, a lens 975, a joint 976, and the like. The first housing 971 is provided with the operation keys 974 and the lens 975, and the second housing 972 is provided with the display portion 973. The imaging device of one embodiment of the present invention can be included as a component for obtaining an image in the video camera.

Figure 40C:
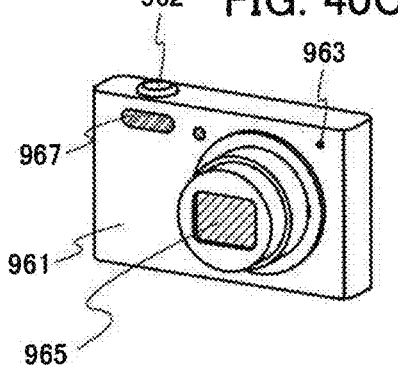

FIG. 40C illustrates a digital camera that includes a housing 961, a shutter button 962, a microphone 963, a light-emitting portion 967, a lens 965, and the like. The imaging device of one embodiment of the present invention can be included as a component for obtaining an image in the digital camera.

Figure 40D:
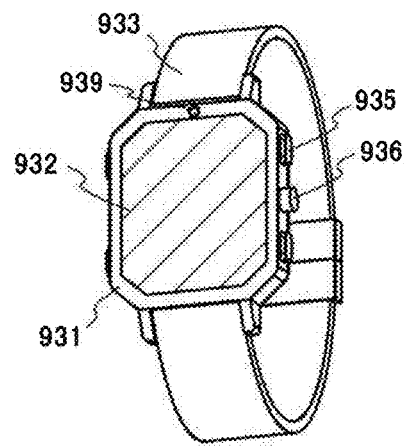

FIG. 40D illustrates a wrist-watch-type information terminal that includes a housing 931, a display portion 932, a wristband 933, operation buttons 935, a winder 936, a camera 939, and the like. The display portion 932 may be a touch panel. The imaging device of one embodiment of the present invention can be included as a component for obtaining an image in the information terminal.

Figure 40E:
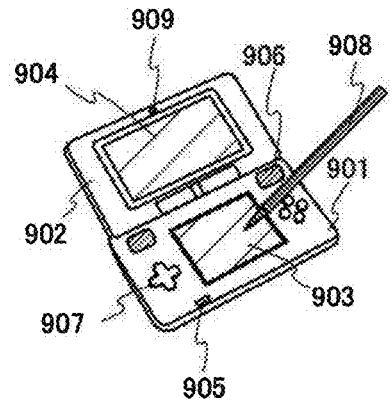

FIG. 40E illustrates a portable game machine that includes housings 901 and 902, display portions 903 and 904, a microphone 905, speakers 906, an operation key 907, a stylus 908, a camera 909, and the like. Although the portable game machine in FIG. 40E has the two display portions 903 and 904, the number of display portions included in a portable game machine is not limited to this. The imaging device of one embodiment of the present invention can be included as one component for obtaining an image in the portable game machine.

Figure 40F:
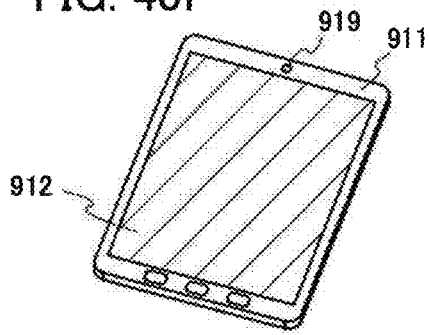

FIG. 40F illustrates a portable data terminal that includes a housing 911, a display portion 912, a camera 919, and the like. A touch panel function of the display portion 912 enables input and output of information. The imaging device of one embodiment of the present invention can be included as one component for obtaining an image in the portable data terminal.

Note that this embodiment can be combined with any of the other embodiments in this specification as appropriate.

This application is based on Japanese Patent Application serial no. 2016-044271 filed with Japan Patent Office on Mar. 8, 2016, the entire contents of which are hereby incorporated by reference.

What is claimed is:

1. A semiconductor device comprising:
a first transistor on a silicon substrate;
a first insulator over the first transistor;
a first conductor over the first insulator;
a second insulator over the first conductor;
an oxide semiconductor including a first region, a second region, and a third region over the second insulator, the second region being between the first region and the third region;
a second conductor and a third conductor over the oxide semiconductor, the second conductor overlapping with the first region and the third conductor overlapping with the third region;
a third insulator over the oxide semiconductor, the second conductor, and the third conductor;
a fourth conductor and a fifth conductor over the third insulator, the fourth conductor overlapping with at least a portion of the second conductor and the fifth conductor overlapping with at least a portion of the third conductor; and
a photoelectric conversion element,
wherein the second region is overlapped with the first conductor, and
wherein the second conductor is electrically connected to one electrode of the photoelectric conversion element.

2. A semiconductor device comprising:
a first transistor on a silicon substrate;
a second transistor on the silicon substrate;
a first insulator over the first transistor and the second transistor;
a first conductor over the first insulator;
a second insulator over the first conductor;
an oxide semiconductor including a first region, a second region, and a third region over the second insulator, the second region being between the first region and the third region;
a second conductor and a third conductor over the oxide semiconductor, the second conductor overlapping with the first region and the third conductor overlapping with the third region;
a third insulator over the oxide semiconductor, the second conductor, and the third conductor;
a fourth conductor and a fifth conductor over the third insulator, the fourth conductor overlapping with at least a portion of the second conductor and the fifth conductor overlapping with at least a portion of the third conductor; and
a photoelectric conversion element over the fourth conductor and the fifth conductor,
wherein the second region is overlapped with the first conductor, and
wherein the second conductor is electrically connected to one electrode of the photoelectric conversion element.

3. The semiconductor device according to claim 1, wherein the photoelectric conversion element is over the fourth conductor and the fifth conductor.

4. The semiconductor device according to claim 1, further comprising a sixth conductor and a seventh conductor,
wherein the first conductor is between the sixth conductor and the seventh conductor,
wherein the second insulator is over the sixth conductor and the seventh conductor,
wherein the sixth conductor is overlapped with the fourth conductor, and
wherein the seventh conductor is overlapped with the fifth conductor.

5. The semiconductor device according to claim 1, wherein the oxide semiconductor comprises indium, gallium, and zinc.

6. The semiconductor device according to claim 1, wherein the oxide semiconductor comprises a first oxide semiconductor, a second oxide semiconductor, and a third oxide semiconductor.

7. The semiconductor device according to claim 1, wherein a photodiode is used for the photoelectric conversion element.

8. The semiconductor device according to claim 7, wherein the photodiode comprises selenium.

9. A module comprising:
the semiconductor device according to claim 1; and
a lens.

10. The semiconductor device according to claim 2, further comprising a sixth conductor and a seventh conductor, wherein the first conductor is between the sixth conductor and the seventh conductor, wherein the second insulator is over the sixth conductor and the seventh conductor, wherein the sixth conductor is overlapped with the fourth conductor, and wherein the seventh conductor is overlapped with the fifth conductor.

11. The semiconductor device according to claim 2, wherein the oxide semiconductor comprises indium, gallium, and zinc.

12. The semiconductor device according to claim 2, wherein the oxide semiconductor comprises a first oxide semiconductor, a second oxide semiconductor, and a third oxide semiconductor.

13. The semiconductor device according to claim 2, wherein a photodiode is used for the photoelectric conversion element.

14. The semiconductor device according to claim 13, wherein the photodiode comprises selenium.

15. A module comprising:
the semiconductor device according to claim 2; and
a lens.

\* \* \* \* \*